United States Patent [19]
Harada et al.

[11] Patent Number: 5,350,709
[45] Date of Patent: Sep. 27, 1994

[54] METHOD OF DOPING A GROUP III-V COMPOUND SEMICONDUCTOR

[75] Inventors: Yasoo Harada; Shigeharu Matsushita; Satoshi Terada; Emi Fujii; Takashi Kurose; Takayoshi Higashino; Takashi Yamada; Akihito Nagamatsu; Daijirou Inoue; Kouji Matsumura, all of Moriguchi, Japan

[73] Assignee: Sanyo Electric Co., Ltd., Osaka, Japan

[21] Appl. No.: 75,232

[22] Filed: Jun. 10, 1993

[30] Foreign Application Priority Data

| Jun. 13, 1992 | [JP] | Japan | 4-179421 |
| Jun. 13, 1992 | [JP] | Japan | 4-179422 |
| Jun. 13, 1992 | [JP] | Japan | 4-179423 |
| Jun. 16, 1992 | [JP] | Japan | 4-183260 |
| Jun. 18, 1992 | [JP] | Japan | 4-186196 |
| Jun. 19, 1992 | [JP] | Japan | 4-186375 |
| Jun. 19, 1992 | [JP] | Japan | 4-186376 |
| Oct. 27, 1992 | [JP] | Japan | 4-312744 |
| Oct. 30, 1992 | [JP] | Japan | 4-316248 |
| Nov. 19, 1992 | [JP] | Japan | 4-310559 |
| Nov. 30, 1992 | [JP] | Japan | 4-345473 |
| Jan. 12, 1993 | [JP] | Japan | 5-3612 |
| Jan. 14, 1993 | [JP] | Japan | 5-5307 |
| Jan. 19, 1993 | [JP] | Japan | 5-6950 |
| Mar. 15, 1993 | [JP] | Japan | 5-54053 |

[51] Int. Cl.$^5$ .......................... H01L 21/225
[52] U.S. Cl. .......................... 437/161; 437/987; 148/DIG. 34
[58] Field of Search ............ 437/133, 160, 161, 987; 148/DIG. 34, DIG. 65

[56] References Cited

U.S. PATENT DOCUMENTS

| 4,824,798 | 4/1989 | Burnham et al. | 437/161 |
| 5,047,366 | 9/1991 | Murakami | 148/DIG. 34 |
| 5,126,281 | 6/1992 | Carey et al. | 437/161 |
| 5,188,978 | 2/1993 | de Souza et al. | 437/987 |

FOREIGN PATENT DOCUMENTS 444465 9/1991 European Pat. Off. .

OTHER PUBLICATIONS

Lee et al., "Diffusion Kinetics of Si in GaAs and Related Defect Chemistry". J. Appl. Phys. vol. 68, No. 8, 15 Oct. 1990, pp. 4008-4013.
Guido et al., "Disorder-Defined Buried-Heterostructure $Al_xGa_{1-x}As$–GaAs Quantum Well Lasers by Diffusion of Silicon and Oxygen From Al-Reduced $SiO_2$", (Appl. Phys. Letters, vol. 54, No. 13) Mar. 27, 1989.
Greiner et al.,"Diffusion of Silicon In Gallium Arsenide Using Rapid Thermal Processing: Experiment and Model", (Appl. Phys. Letters, vol. 44, No. 8) Apr. 15, 1984.
Kavanagh et al., "Silicon Diffusion At Polycrystalline-Si/GaAs Interfaces", (Appl. Phys. Letters, vol. 47, No. 11) Dec. 1, 1985.
Sadona et al., "N+ Doping of Gallium Arsenide by Rapid Thermal Oxidation of a Silicon Cap", (Appl. Phys. Letter 57, vol. 16, No. 16) Oct. 15, 1990.
Burkhardt et al., IBM Technical Disclosure Bulletin-"Diffusion Mask for GaAs", (vol. 14, No. 5) Oct. 5, 1971.

*Primary Examiner*—Tom Thomas
*Assistant Examiner*—Chandra Chaudhari
*Attorney, Agent, or Firm*—Darby & Darby

[57] ABSTRACT

A method of doping a Group III-V compound semiconductor with an impurity, wherein after an undoped film of SiOx and a film for preventing the diffusion of Group V atoms (e.g., an SiN film) are formed in this order on a crystal of Group III-V compound semiconductor, the sample is subjected to at least one heat treatment to cause silicon in the SiOx film to diffuse into the Group III-V compound semiconductor, thereby forming a doped layer. Using this doped layer forming method, field-effect transistors, diodes, resistive layers, two-dimensional electron gas or one-dimensional quantum wires, zero-dimensional quantum boxes, electron wave interference devices, etc. are fabricated.

21 Claims, 77 Drawing Sheets

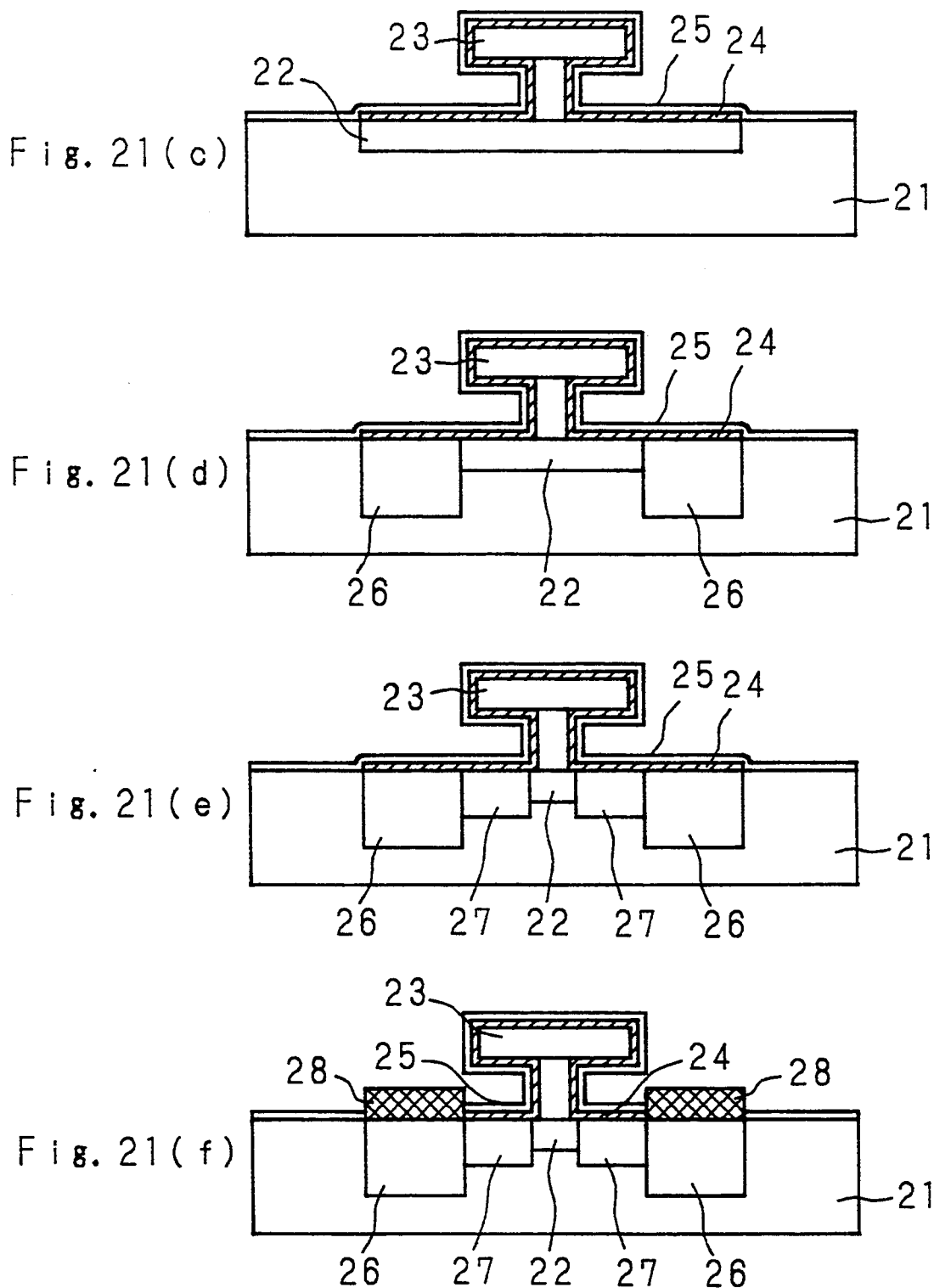

[UNIT: μm]

[UNIT : μm]

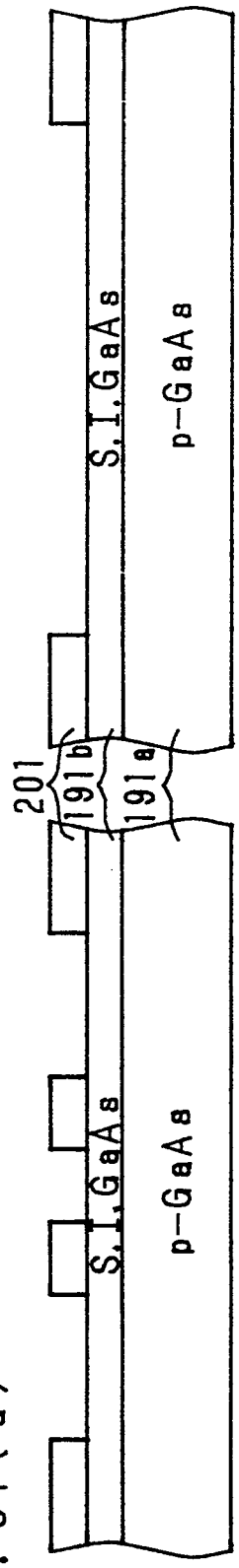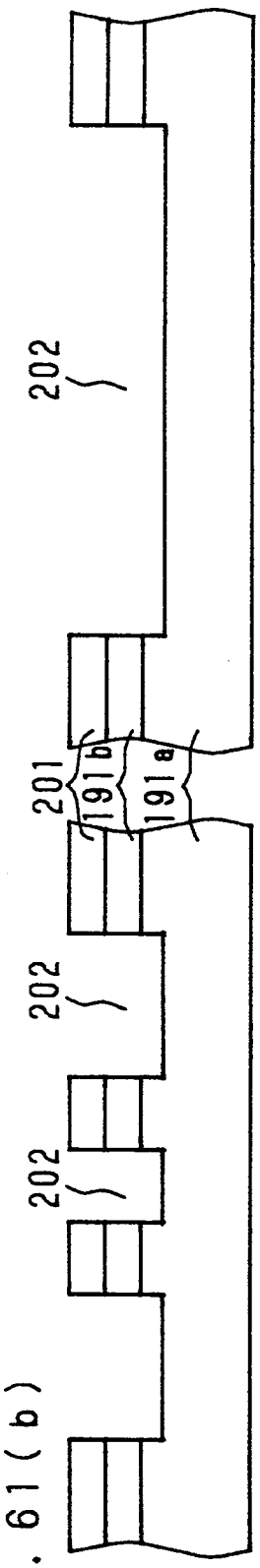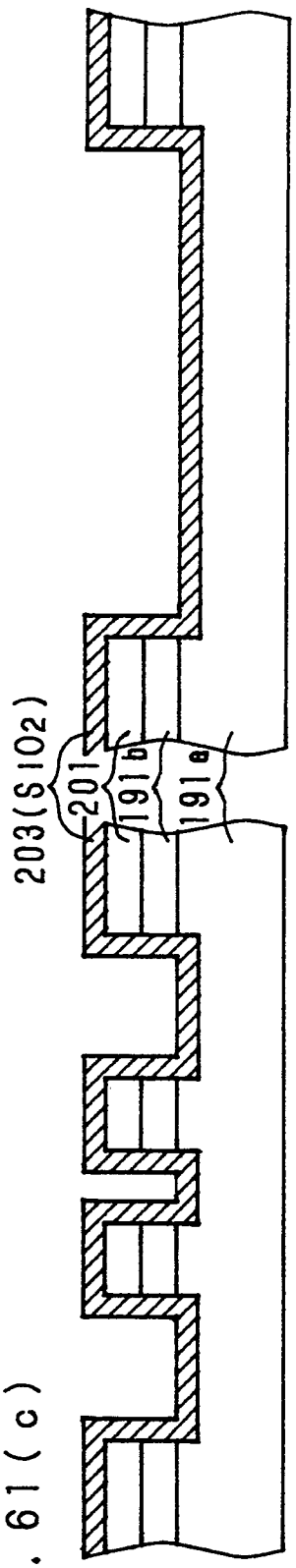

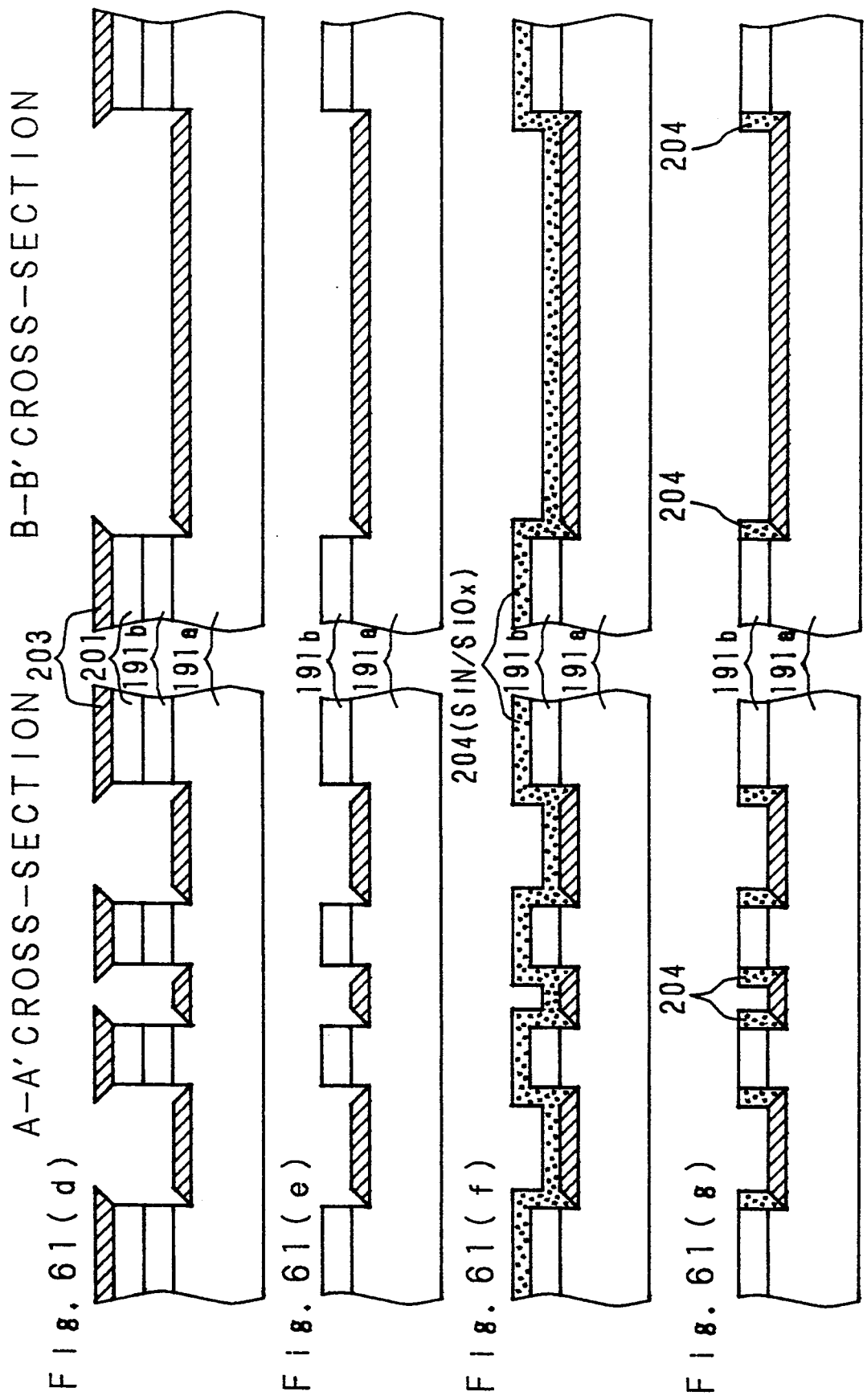

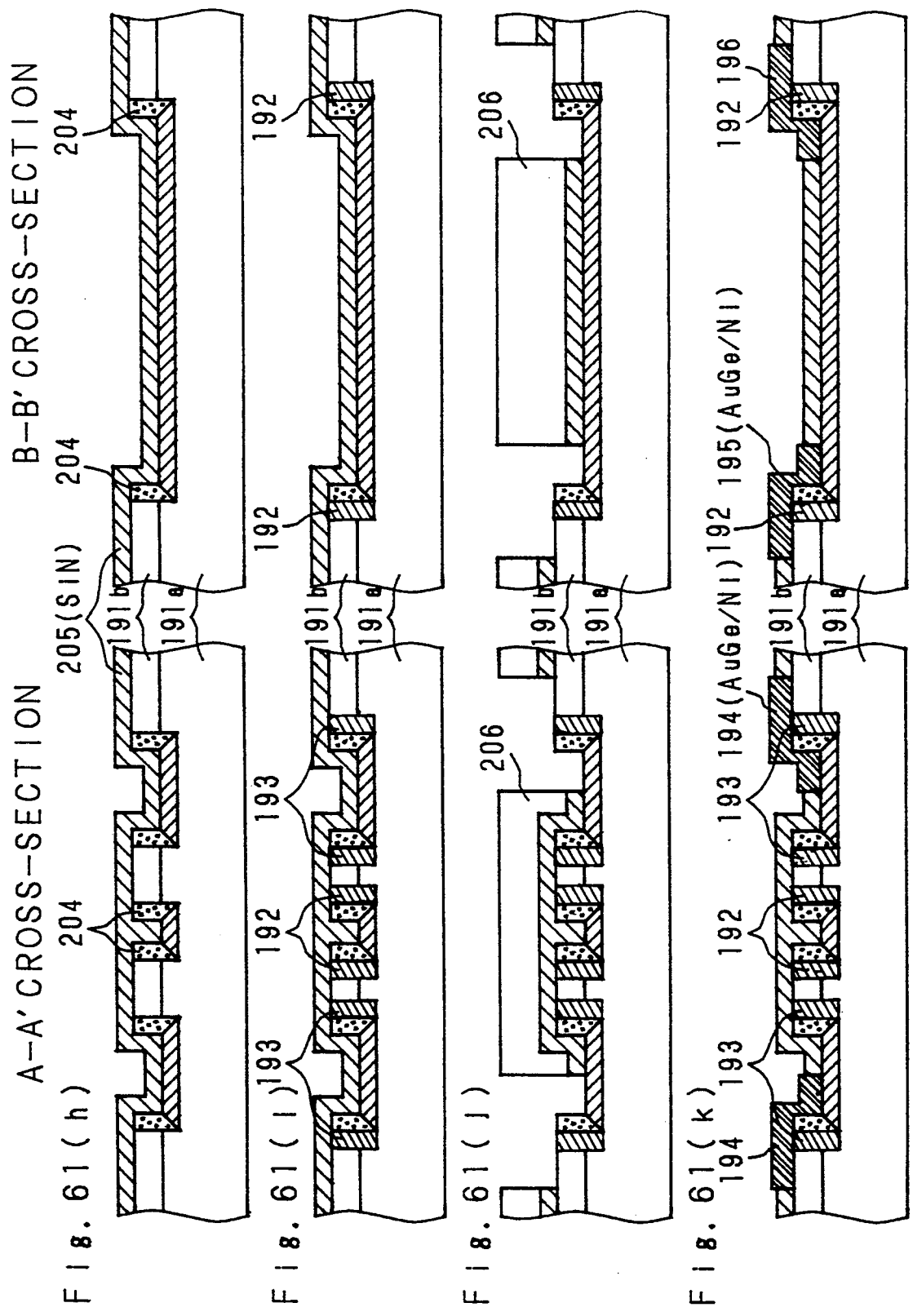

METHOD OF DOPING A GROUP III-V COMPOUND SEMICONDUCTOR

BACKGROUND OF THE INVENTION

1. Field of the Invention

The present invention relates to a method of doping by diffusing silicon into Group III-V compound semiconductors such as GaAs and AlGaAs, a semiconductor device having a doped layer formed by same doping method, and a method of fabricating same semiconductor device.

2. Description of Related Art

Diffusion and ion implantation, as well as crystal growth techniques, are well known methods of doping semiconductor substrates with impurities. In particular, for silicon. (Si) devices using Si substrates, diffusion and ion implantation have been established as important techniques for introducing dopants into Si substrates.

On the other hand, in the case of Group III-V compound semiconductors such as GaAs, Gap, InP, etc., impurity doping has involved the intrinsic problem that the stoichiometric composition of the substrate crystal tends to be upset when subjected to high processing temperatures, which has lead to the necessity of developing doping methods suitable for individual kinds of substrates. Up to date, however, only part of such methods have been established. For GaAs substrates, for example, ion implantation and a part of diffusion (Zn diffusion to form a p-type impurity layer) are the only established techniques for practical use. A diffusion method for forming an n-type inpurity layer has not yet been established for GaAs substrates primarily because the stoichiometric composition of the GaAs substrate crystal tends to be dislocated due to dissociation of As because of high diffusion temperatures (800° C. and higher) and the diffusion, therefore, cannot be performed in a well controlled manner.

SUMMARY OF THE INVENTION

It is an object of the invention to provide a novel doping method, which is entirely different from conventional methods, whereby, after forming a composite film consisting of an undoped SiOx film and a Group V atom diffusion stop film on a Group III-V compound semiconductor, silicon can be easily diffused into the Group III-V compound semiconductor just by performing heat treatment.

It is another object of the invention to provide a semiconductor device having a doped layer formed by the novel doping method, and a method of fabricating such a semiconductor device.

According to the doping method of the invention, an undoped SiOx film and a Group V atom diffusion stop film are formed in this order on a Group III-V compound semiconductor, followed by heat treatment to cause Si atoms in the SiOx film to diffuse into the underlying Group III-V compound semiconductor. The functions of the SiOx film and Group V atom diffusion stop film and the principle of doping, according to the invention, will be described below taking a GaAs substrate as an example of the Group III-V compound semiconductor and an SiN film as an example of the Group V atom diffusion stop film. FIG. 1 is a diagram showing the structure of a composite film, consisting of an SiOx film 2 and an SiN film 3 as the Group V atom diffusion stop film, formed on a substrate 1 of GaAs, the Group III-V compound semiconductor. FIG. 2 shows diagrams for explaining the principle of Si doping.

The undoped SiOx film 2 formed in contact with the GaAs substrate 1 has the ratio of its constituent elements controlled so that Si atoms in the SiOx film 2 can be diffused into the GaAs substrate 1. More specifically, in the SiOx film 2 used, the ratio of Si and O is not 1:2 as in the case of a thermally oxidized $SiO_2$ film grown on an Si film, but the proportion of Si is larger than the ratio (Si/O)>$\frac{1}{2}$, i.e. $X<2$, or refractive index greater than 1.46). Further, the SiOx film 2 is so made that Ga atoms, the Group III element in the GaAs substrate 1, easily diffuse into the SiOx film 2 as is well known at least for the GaAs substrate 1. This characteristic plays an important role in the doping method of the present invention.

Furthermore, in the doping method of the invention, the existence of the SiN film 3 has an significant meaning in that it has the effect of preventing external diffusion of As, the Group V element in the GaAs substrate 1.

The principle of doping will be now explained with reference to FIG. 2. When the GaAs substrate 1, with the SiOx film 2 and the SiN film 3 formed thereon as shown in FIG. 1, is subjected to heat treatment, Ga atoms, the Group III element in the GaAs substrate 1, diffuse into the SiOx film 2 as the temperature rises, the diffusion of Ga atoms creating Ga vacancies in the GaAs substrate 1 (FIG. 2(a)). Then, Si atoms, the Group IV element in the SiOx film 2, diffuse into the GaAs substrate 1 in such a manner as to fill the Ga vacancies (FIG. 2(b)), This process of exchange between the Ga atoms and Si atoms spreads in the depth direction of the GaAs substrate 1, thus accomplishing doping to a prescribed depth below the surface (FIG. 2(c)). The region into which the Si atoms have been diffused forms an n-type doped layer. Usually, the SiOx film 2 cannot completely prevent the external diffusion of the As a oms, the Group V element in the GaAs substrate 1 which has a high dissociative pressure. As a result, the As atoms, the Group V element in the GaAs substrate 1, are also diffused into the SiOx film 2, but the external diffusion of the As atoms is suppressed by the existence of the SiN film 3; that is, when the As atoms reach saturation in the SiOx film 2, further external diffusion of the As atoms does not occur, so that the creation of As vacancies is kept at a limited number. Therefore, in the GaAs substrate 1, creation of only Ga vacancies is allowed to progress, thus facilitating further diffusion of the Si atoms from the SiOx film 2 into the GaAs substrate 1.

The above and further objects and features of the invention will more fully be apparent from the following detailed description with accompanying drawings.

BRIEF DESCRIPTION OF THE DRAWINGS

FIG. 21(c) is a cross-sectional view showing a fabrication processing step for the FET of Embodiment 9.

FIG. 21(d) is a cross-sectional view showing a fabrication processing step for the FET of Embodiment 9.

FIG. 21(e) is a cross-sectional view showing a fabrication processing step for the FET of Embodiment 9.

FIG. 21(f) is a cross-sectional view showing a fabrication processing step for the FET of Embodiment 9.

FIG. 58(a) is a cross-sectional view showing a fabrication processing step for a semiconductor integrated circuit according to Example 2 of Embodiment 20.

FIG. 58(b) is a cross-sectional view showing a fabrication processing step for the semiconductor integrated circuit according to Example 2 of Embodiment 20.

FIG. 58(c) is a cross-sectional view showing a fabrication processing step for the semiconductor integrated circuit according to Example 2 of Embodiment 20.

FIG. 59 is a graph showing electron density profiles in doped layers formed in accordance with the fabrication process shown in FIG. 58.

FIG. 60(a) is a plan view showing the basic structure of an electron wave interference device according to Embodiment 21.

FIG. 60(b) is a cross-sectional view showing the basic structure of the electron wave interference device according to Embodiment 21.

FIG. 61(a) is a cross-sectional view showing a fabrication processing step for the electron wave interference device according to Embodiment 21.

FIG. 61(b) is a cross-sectional view showing a fabrication processing step for the electron wave interference device according to Embodiment 21.

FIG. 61(c) is a cross-sectional view showing a fabrication processing step for the electron wave interference device according to Embodiment 21.

FIG. 61(d) is a cross-sectional view showing a fabrication processing step for the electron wave interference device according to Embodiment 21.

FIG. 61(e) is a cross-sectional view showing a fabrication processing step for the he electron wave interference device according to Embodiment 21.

FIG. 61(f) is a cross-sectional view showing a fabrication processing step for the electron wave interference device according to Embodiment 21.

FIG. 61(g) is a cross-sectional view showing a fabrication processing step for the electron wave interference device according to Embodiment 21.

FIG. 61(h) is a cross-sectional view showing a fabrication processing step for the electron wave interference device according to Embodiment 21.

FIG. 61(i) is a cross-sectional view showing a fabrication processing step for the electron wave interference device according to Embodiment 21.

FIG. 61(j) is a cross-sectional view showing a fabrication processing step for the electron wave interference device according to Embodiment 21.

FIG. 61(k) is a cross-sectional view showing a fabrication processing step for the electron wave interference device according to Embodiment 21.

DESCRIPTION OF THE PREFERRED EMBODIMENTS

The preferred embodiments of the invention will flow be described below with reference to the accompanying drawings. The embodiments described in detail below are concerned with examples in which the doping method of the invention is carried out. In the doping method of the invention, the occurring condition of doping (the distribution of dopant electron density) varies with such parameters as the heat treatment temperature and the properties and thicknesses of the SiOx film and Group V atom diffusion stop film used. Each embodiment will be described focusing on the occurring condition of doping when these parameters are varied. In each of the embodiments described hereunder, an SiN film is used as the Group V atom diffusion stop film. The SiOx/SiN composite film is formed using a conventional plasma-enhanced chemical vapor deposition (P-CVD) process, and as the source gas, $SiH_4 + N_2O$ is used to form the SiOx film and $SiH_4 + NH_3$ to form the SiN film. Furthermore, in Embodiments 1 to 6, a GaAs substrate is used as the Group III-V compound semiconductor, while in Embodiment 7, an AlGaAs film is used as the Group III-V compound semiconductor.

EMBODIMENT 1

Embodiment 1 is concerned with an example showing the relationship between the occurring condition of doping and the properties of the SiOx film. First, a composite film, consisting of an SiOx film with varied properties and an SiN film with fixed properties, wets formed on a GaAs substrate. Thereafter, rapid thermal annealing (RTA) was performed at 880° C. for 5 seconds, to diffuse Si atoms from the SiOx film into the GaAs substrate.

The deposition conditions for the SiN film were as shown below, and the refractive index was 1.8.

SiN film: $SiH_4$ 15 sccm, $NH_3$ 200 sccm; Power 250 W; Film deposition temperature 300° C.; Film thickness 450 Å

For the SiOx film, the film thickness was maintained constant, but only the film properties were varied by varying the gas flow ratio (the flow ratio of $SiH_4$ and $N_2O$) for deposition. Other conditions for the deposition of the SiOx film were as follows:

SiOx film: Pressure 0.3 Torr; Power 150 W; Film deposition temperature 300° C.; Film deposition time 12 sec.

Figure 3:
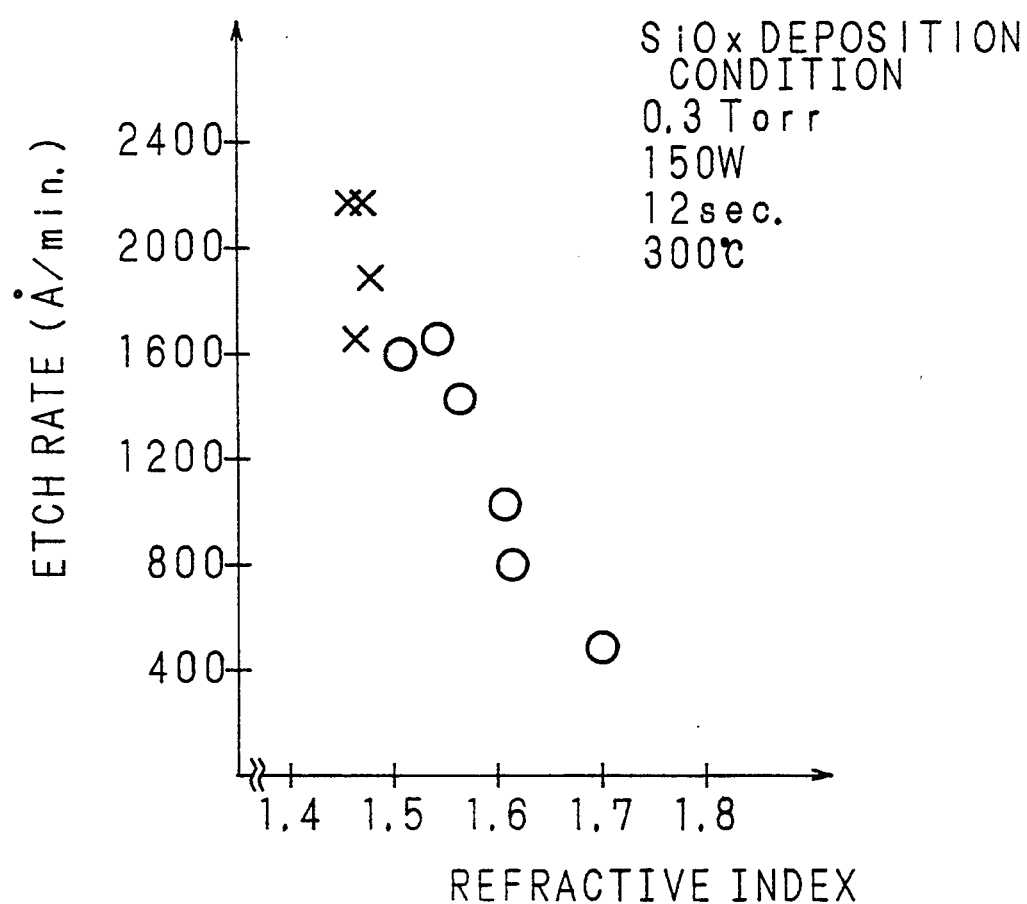
FIG. 3 is a graph showing the relationship between the occurring condition of doping and the properties of an SiOx film.
Figure 4:
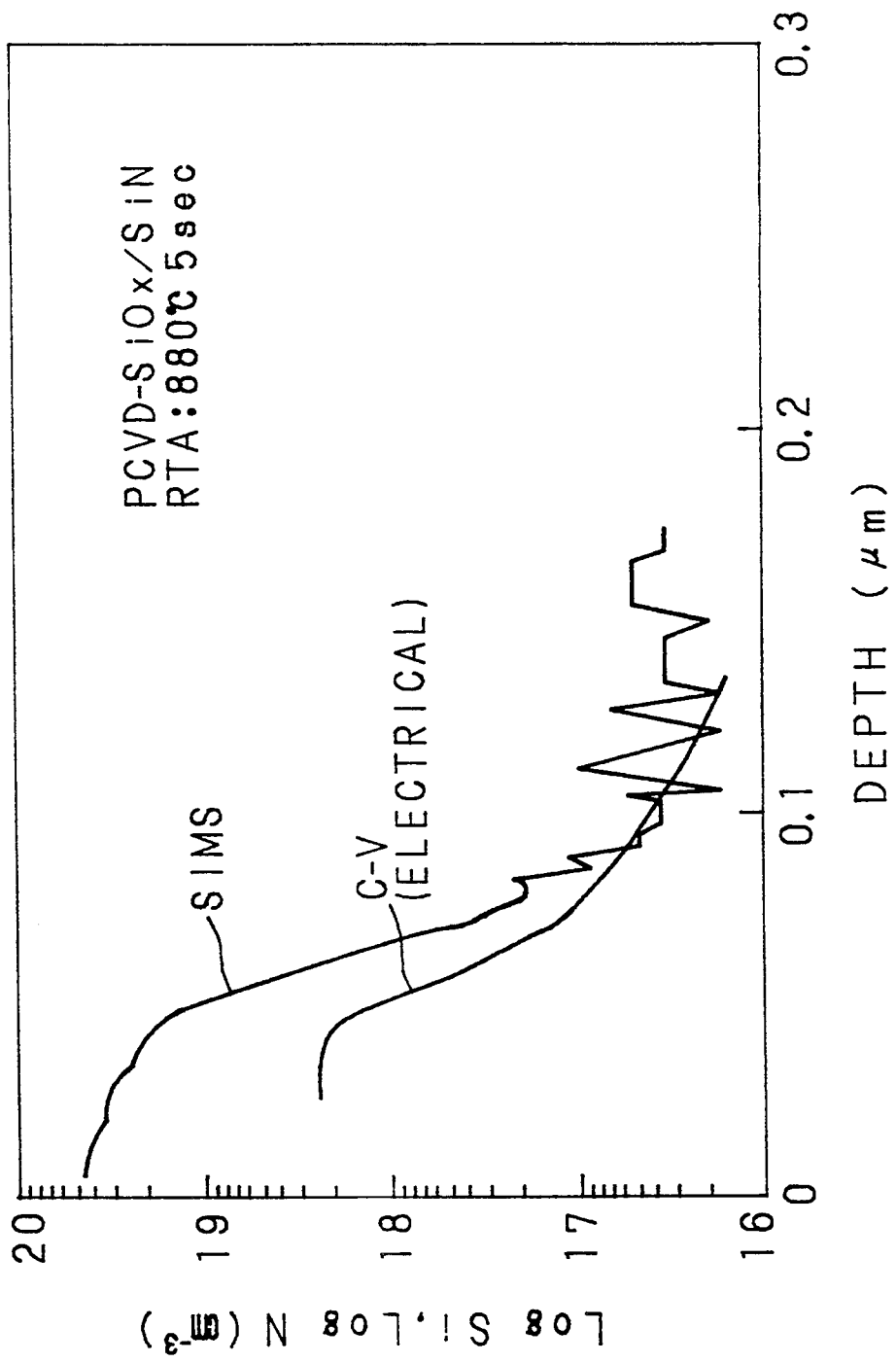
FIG. 4 is a graph showing an Si concentration profile and an electron density profile.

Occurrence or non-occurrence of doping was judged on the basis of the result of the electron density measurement taken by the capacitance-voltage (C-V) measurement method. Also, by using secondary-ion mass spectrometry (SIMS), it was confirmed that the doping was being caused by the diffusion of Si. FIG. 3 is a graph showing the relationship of the occurring condition of doping and the properties of the SiOx film, and FIG. 4 is a graph showing the results of the measurements taken by the C-V and SIMS methods. In FIG. 3, the properties of the SiOx film are defined here by the refractive index (abscissa) and by the etch tale (ordinate) in buffered hydrofluoric acid ($HF:NH_4F=1:6$), and the mark "○" indicates where the occurrence of doping was confirmed, while the mark "X" indicates where it was not confirmed.

As shown in FIG. 3, the occurrence of doping was confirmed in regions where the refractive index of the SiOx film was 1.5 or higher and the etch rate in buffered hydrofluoric acid was 1600 Å or less. Usually, when the composition ratio Si/O of an SiOx film formed by plasma CVD is $\frac{1}{2}$ (i.e., x=2), the refractive index is 1.46; therefore, to achieve a refractive index equal to or greater than 1.5, which is the critical value for the occurrence of doping, the SiOx film is required to have a composition ratio $Si/O > \frac{1}{2}$ (i.e., x<2), which fact is also confirmed by X-ray photoelectron spectroscopy (XPS). The results shown in FIG. 3 were obtained with the film deposition temperature set at 300° C., but the same doping results can be obtained if the film deposition temperature is lowered to 250° C. It was found, however, that when the film deposition temperature was further reduced to 200° C., the etch rate showed a tendency to increase, slightly changing the occurring condition of doping, although there was little change in the critical refractive index for the occurrence of doping.

On the other hand, it can be seen from FIG. 4 that Si was surely diffused into the GaAs substrate, that there was obtained a high concentration layer of about $3 \times 10^{18} cm^{-3}$ though the electron density was one digit smaller compared to the diffused Si, and that there was obtained an ideal electron density profile which is flat near the surface and sleep at the diffusion front.

It has also been confirmed that the doping (Si diffusion) does not occur unless the SiOx film is covered by an SiN film that prevents external diffusion of As. Furthermore, if the refractive index of the SiN film formed by plasma CVD is greater than 1.9, Si diffusion does not occur, It is reported that if the Si concentration in the SiN film excessively increases with a resulting increase in the refractive index, the ability to prevent the external diffusion of As, which is an essential condition of the present invention, decreases (reference: Matsushita et al., Institute of Electronics, Information and Communication Engineers, Electronic Device Research Committee, ED89-70). It is therefore required that the SiN film to be formed by plasma CVD for use in this embodiment should have a refractive index less than 1.9. However, by electron cyclotron resonance (ECR), a more intricate SiN film can be formed than by plasma CVD; therefore, for an SiN film formed by ECR, the doping method of this invention can be applied even if the SiN film has a refractive index as large as 2.0.

EMBODIMENT 2

Figure 5:
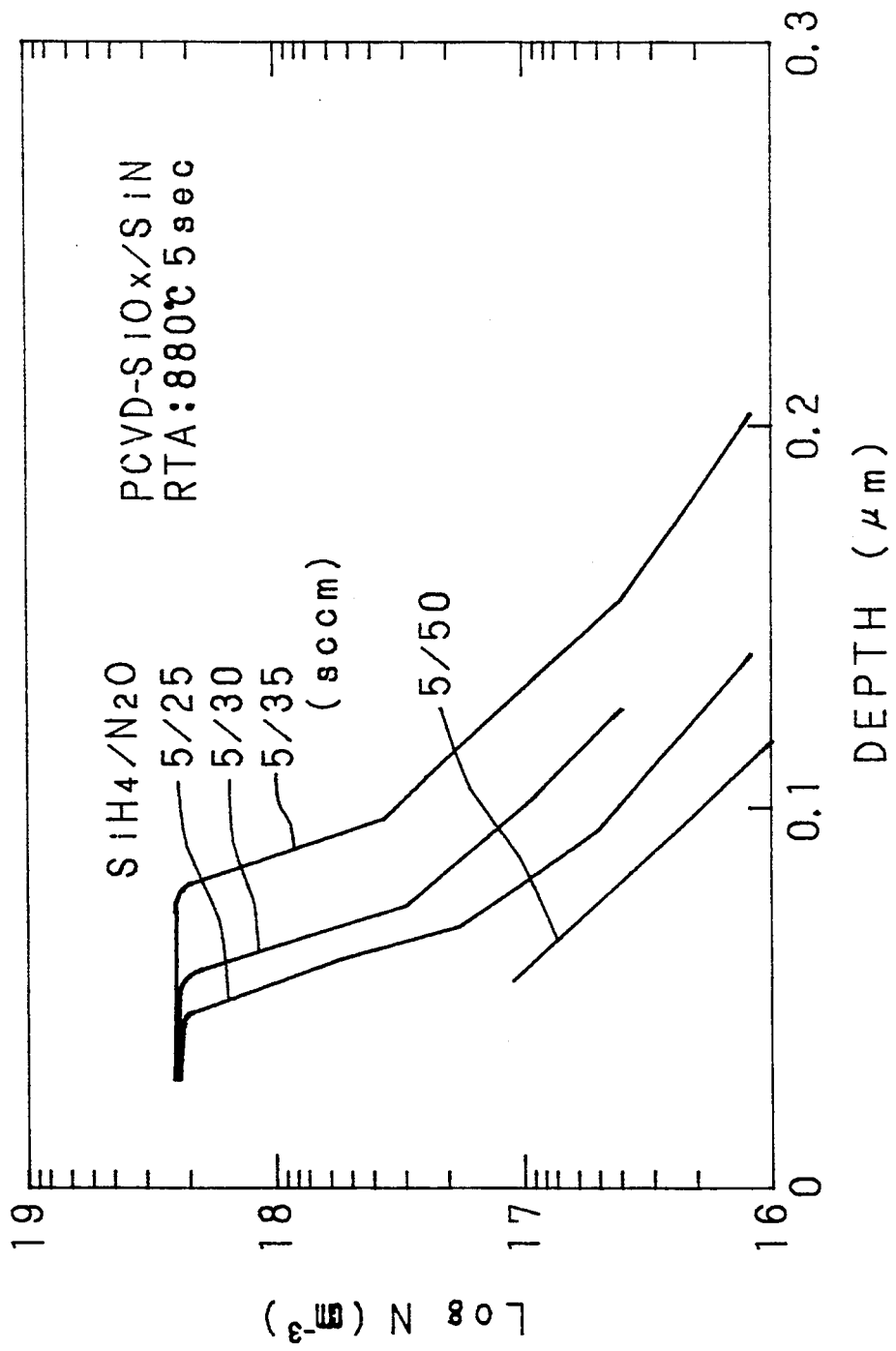
FIG. 5 is a graph showing electron density profiles for explaining the correlationship between the electron density distribution and the gas flow rate for SiOx film deposition.

Embodiment 2 is an example showing the correlationship between the electron density distribution and the gas flow rate for SiOx film deposition. FIG. 5 shows how the electron density profile changes when the flow rate ratio of $SiH_4$ and $N_2O$ for SiOx film deposition is varied. The film deposition conditions and the heat treatment (RTA) conditions for the SiOx film are as follows:

SiOx film: $SiH_4$ 5 sccm, $N_2O$ 25 to 75 sccm; Power 150 W;

Film deposition temperature 300° C.; Film thickness 50 Å;

Refractive index 1.5 to 1.6

RTA: Temperature 880° C.; Time 5 sec.

The film deposition conditions for the SiN film are the same as those in Embodiment 1.

From the results shown in FIG. 5, it can be seen that as the flow rate of $N_2O$ increases within the range of 25 to 35 sccm, the depth of the distribution profile increases while no substantial change occurs in the electron density. On the other hand, outside this range, both the electron density and the profile depth decrease; with the $N_2O$ flow rate at 70 sccm, occurrence of doping could not be confirmed. From the above results, it can be shown that, even when performing heat treatment with the same conditions, the electron density distribution can be controlled by adjusting the properties of the SiOx film.

EMBODIMENT 3

Figure 6:
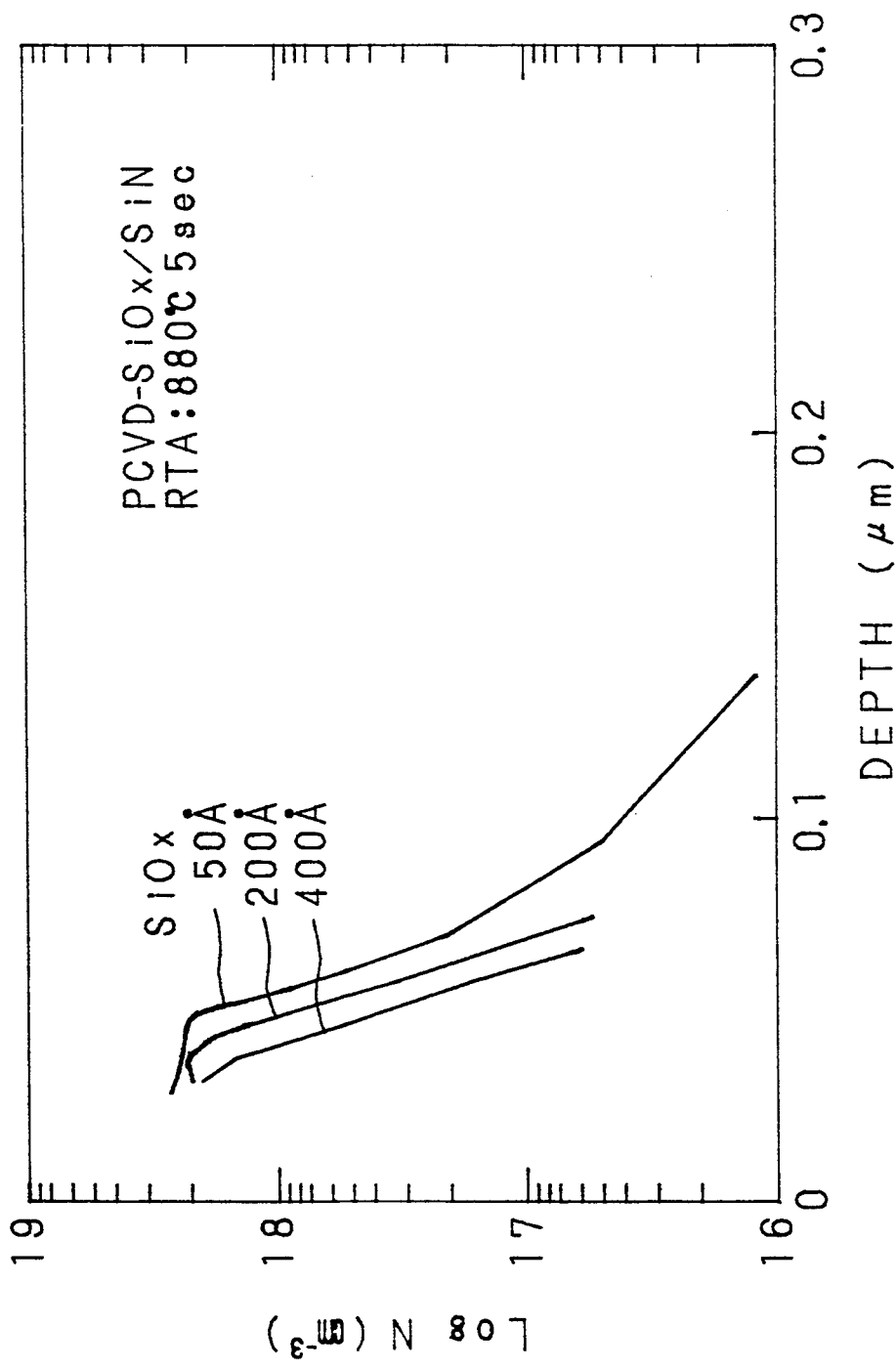
FIG. 6 is a graph showing electron density profiles for explaining the correlationship between the electron density distribution and the SiOx film thickness.

Embodiment 3 is concerned with an example showing the correlationship between the electron density distribution and the thickness of the SiOx film. FIG. 6 shows how the electron density profile changes when the thickness of the SiOx film to be formed is varied. The film deposition conditions and the heat treatment (RTA) conditions for the SiOx film are as follows:

SiOx film: $SiH_4$ 5 sccm, $N_2O$ 25 sccm; Power 150 W; Film deposition temperature 300° C.; Film thickness 50 to 400 Å;

Refractive index 1.52

RTA: Temperature 880° C.; Time 5 sec.

The film deposition conditions for the SiN film are the same as those in Embodiment 1.

From the results shown in FIG. 6, it can be seen that the electron density and the depth of the distribution profile tend to decrease as the thickness of the SiOx film increases. This is thought to be because the increased thickness of the SiOx film increases the amount of external diffusion of As and hence decreases the number of Ga vacancies to be generated. From the above results, it can be shown that, even when performing heat treatment with the same conditions, the electron density distribution can be controlled by adjusting the thickness of the SiOx film.

EMBODIMENT 4

Figure 7:
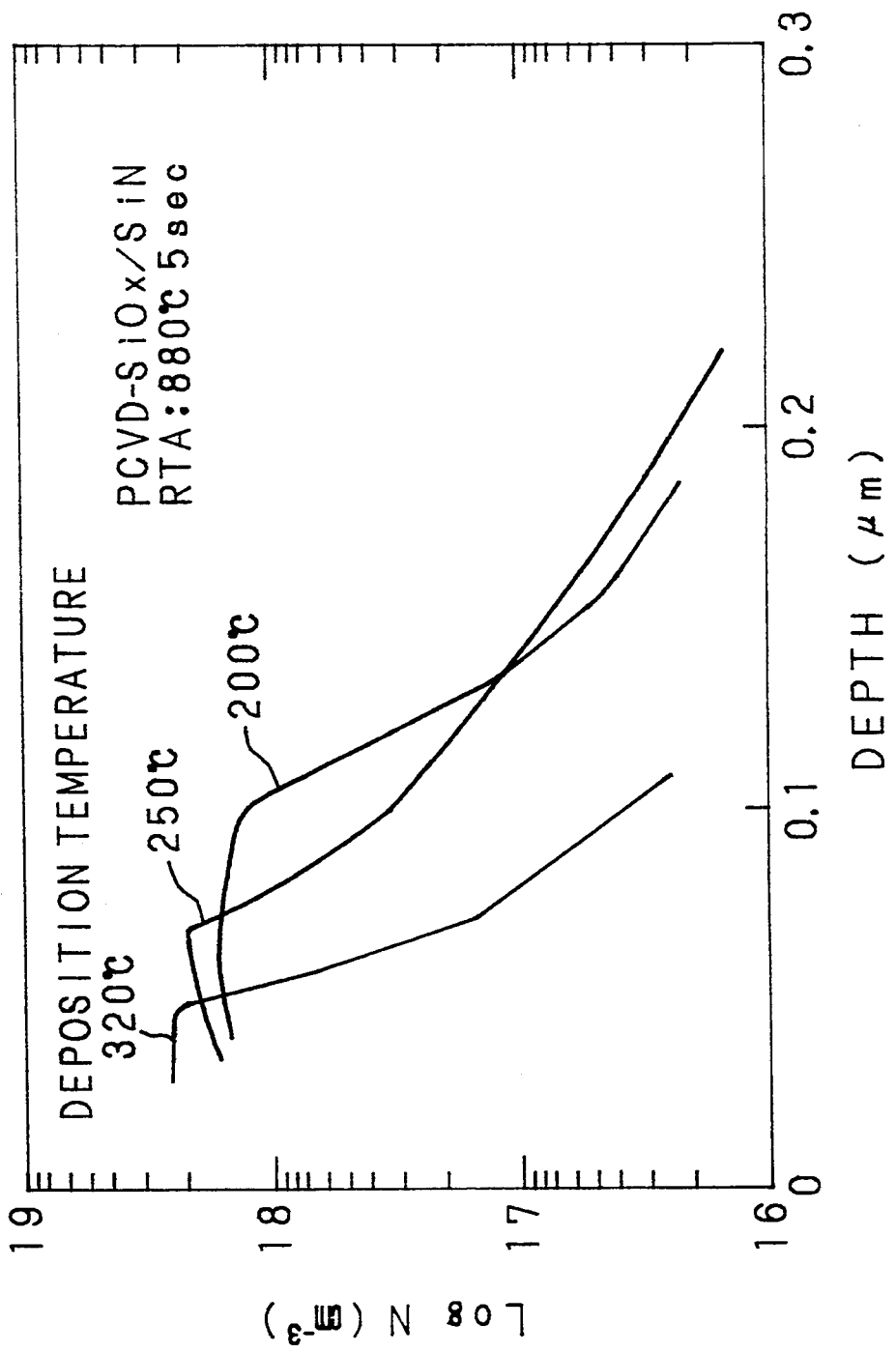
FIG. 7 is a graph showing electron density profiles for explaining the correlationship between the electron density distribution and the temperature for SiOx film deposition.

Embodiment 4 is concerned with an example showing the correlationship between the electron density distribution and the deposition temperature for the SiOx film. FIG. 7 shows how the electron density profile changes when the temperature for the deposition of the SiOx film is varied. The deposition conditions and the heat treatment (RTA) conditions for the SiOx film are as follows:

SiOx film: $SiH_4$ 10 sccm, $N_2O$ 20 sccm; Power 150 W;
  Film deposition temperature 200° to 320° C.; Film thickness 150 Å;
Refractive index 1.5 to 1.62
RTA: Temperature 880° C.; Time 5 sec.
The film deposition conditions for the SiN film are the same as those in Embodiment 1.

From the results shown in FIG. 7, it can be seen that the electron density and the depth of the distribution profile change as the deposition temperature for the SiOx film is varied. This is thought to be because the properties of the SiOx film change as a result of the change in the deposition temperature. From the above results, it can be shown that, even widen performing heat treatment with the same conditions, the electron density distribution can be controlled by adjusting the deposition temperature for the SiOx film.

From the above results obtained in Embodiments 1 and 4, it will be seen that, with the doping method of the invention, the electron density distribution can be controlled by using the properties and thickness of the SiOx film as the parameters even when performing heat treatment with the same conditions.

EMBODIMENT 5

Figure 8:
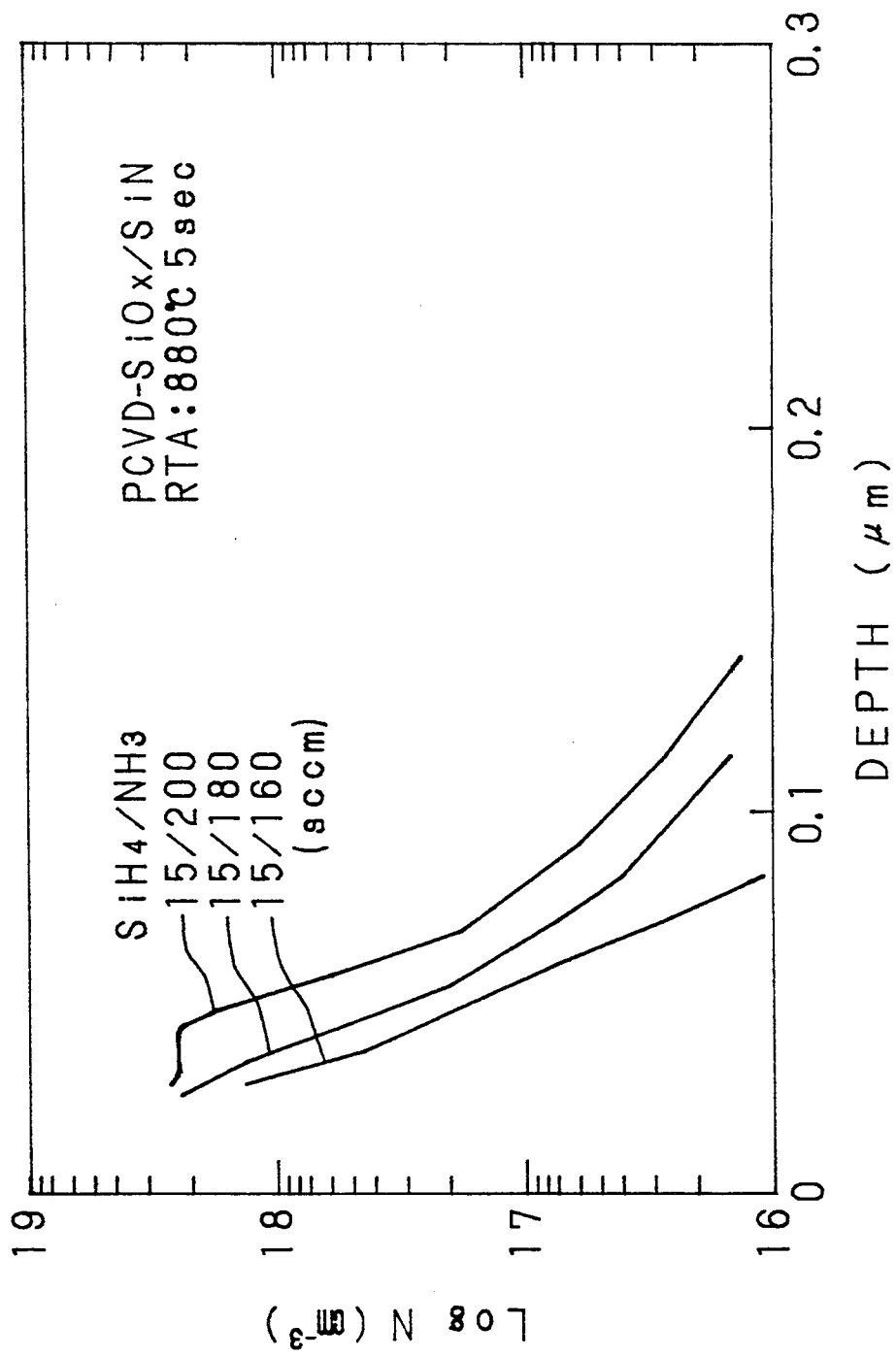
FIG. 8 is a graph showing electron density profiles for explaining the correlationship between the electron density distribution and the gas flow rate in depositing an SiN film.

Embodiment 5 is concerned with an example showing the correlationship between the electron density distribution and the properties of the SiN film. FIG. 8 shows how the electron density profile changes when the flow rate ratio of $SiH_4$ and $NH_3$ for SiN film formation is varied. The film deposition conditions and the heat treatment (RTA) conditions for the SiN film are as follows:

SiN film: $SiH_4$ 15 sccm, $NH_3$ 150 to 200 sccm; Power 250 W;
Film deposition temperature 300° C.; Film thickness 450 Å
RTA: Temperature 880° C.; Time 5 sec.
The film deposition conditions for the SiOx film are the same as those in Embodiment 3 (except that the film thickness is 50 Å and is not changed).

From the results shown in FIG. 8, it can be seen that as the flow rate of $NH_3$ increases, the depth of the distribution profile increases whereas no substantial change occurs in the electron density. However, it was not possible to measure the electron density distribution when the flow rate of $NH_3$ was set at 150 sccm. From the above results, it can be shown that, even when performing heat treatment with the same conditions, the electron density distribution can be controlled by adjusting the properties of the SiN film with the deposition conditions for the SiOx film kept unchanged.

EMBODIMENT 6

Figure 9:
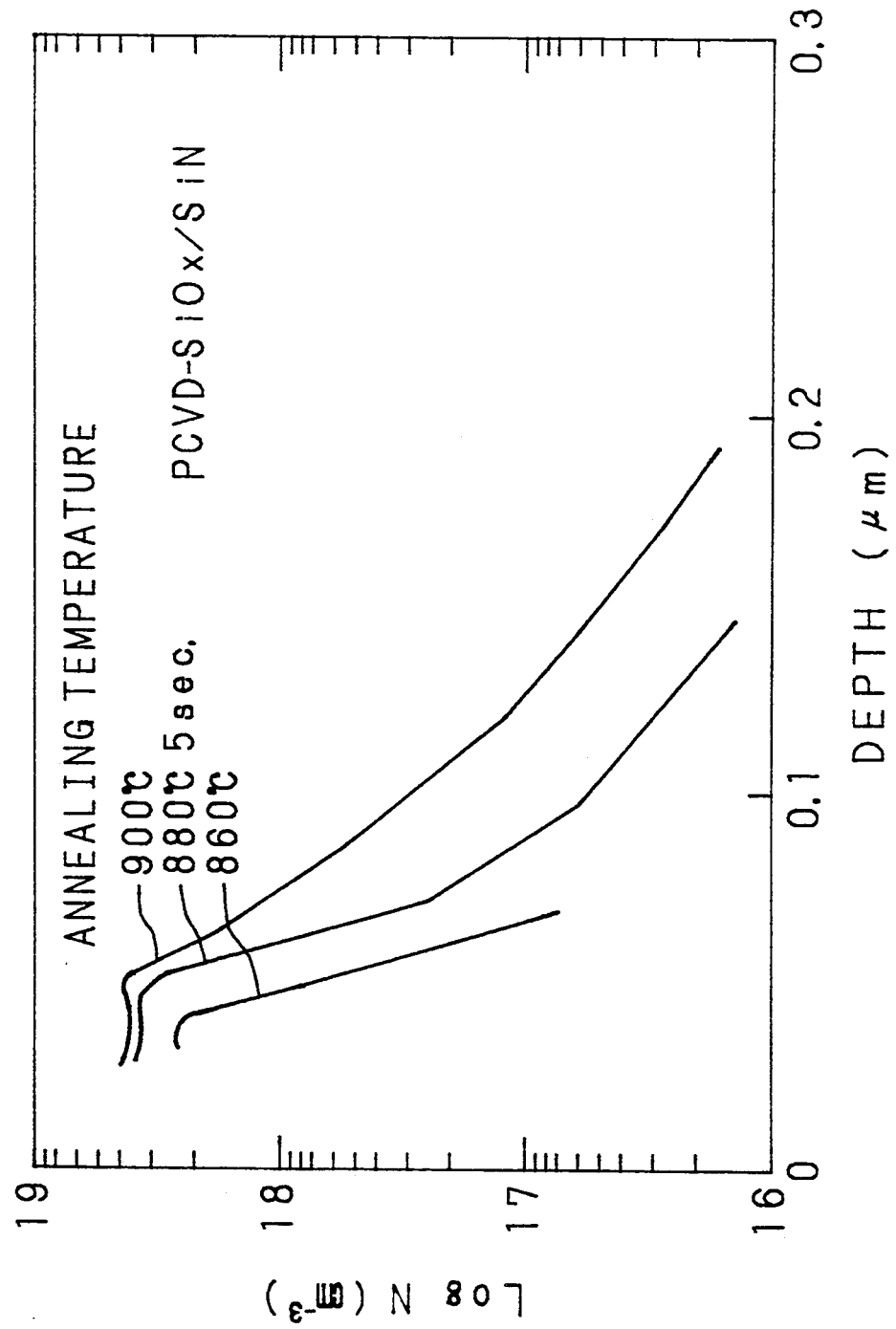
FIG. 9 is a graph showing electron density profiles for explaining the correlationship between the electron density distribution and the heat treatment temperature.

Embodiment 6 is concerned with an example showing the correlationship between the heat treatment temperature and the electron density distribution. FIG. 9 shows how the electron density profile changes when only the heat treatment temperature is varied while keeping the film deposition conditions unchanged for the SiOx and SiN Films. The film deposition conditions and the heat treatment (RTA) conditions for the SiOx and SiN films are as follows:

SiOx film: $SiH_4$ 5 sccm, $N_2O$ 25 sccm; Power 150 W;
  Film deposition temperature 300° C.; Film thickness 50 Å
SiN film: $SiH_4$ 15 sccm, $NH_3$ 200 sccm; Power 250 W;
  Film deposition temperature 300° C.; Film thickness 450 Å
RTA: Temperature 860° to 900° C.; Time 5 sec.

From the results shown in FIG. 9, it can be seen that the electron density and the depth of the profile tend to increase as the heat treatment temperature is increased. From the above results, it can be shown that, as in conventional diffusion methods, the heat treatment temperature is an important parameter in controlling the electron density distribution in the doping method of the invention.

EMBODIMENT 7

Figure 10:
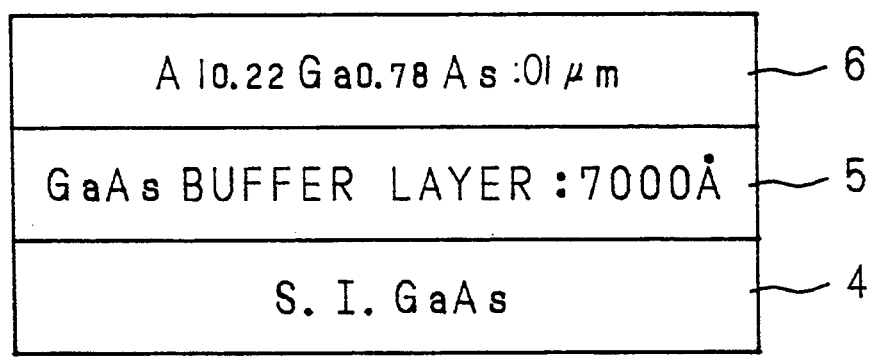
FIG. 10 is a cross-sectional view showing the structure of a wafer used in an example of the invention.

Embodiment 7 is concerned with an example in which AlGaAs film, a ternary compound semiconductor, is used as the Group III-V compound semiconductor. FIG. 10 shows the wafer structure employed in Embodiment 7, in which a GaAs buffer layer 5 (thickness: 7000 Å) and an $Al_{0.22}Ga_{0.78}As$ film 6 (thickness: 0.1 μm) are formed successively on a GaAs (100) semi-insulative substrate 4 by using a molecular beam epitaxy (MBE) process. After forming an SiOx/SiN composite layer over the $Al_{0.22}Ga_{0.78}As$ film 6 in the wafer structure, the device is subjected to heat treatment. Then, by the same mechanism as previously described for GaAs, Si atoms are diffused from the SiOx film into the $Al_{0.22}Ga_{0.78}As$ film 6, thus accomplishing impurity doping of the $Al_{0.22}Ga_{0.78}As$ film 6. The film deposition conditions and the heat treatment (RTA) conditions for the SiOx and SiN films are as follows:

SiOx film: $SiH_4$ 5 sccm, $N_2O$ 25 sccm; Power 150 W;
  Film deposition temperature 300° C.; Film thickness 50 Å
SiN film: $SiH_4$ 15 sccm, $NH_3$ 200 sccm; Power 250 W;
  Film deposition temperature 300° C.; Film thickness 450 Å
RTA: Temperature 880° C.; Time 5 sec.

With AlGaAs used as the Group III-V compound semiconductor, it was confirmed that doping was accomplished by the diffusion of Si, as in the case of GaAs. It was also found that, as in the case of GaAs, the electron density and the profile depth change as the heat treatment temperature and the properties and thicknesses of the SiOx and SiN films are varied.

Figure 11:
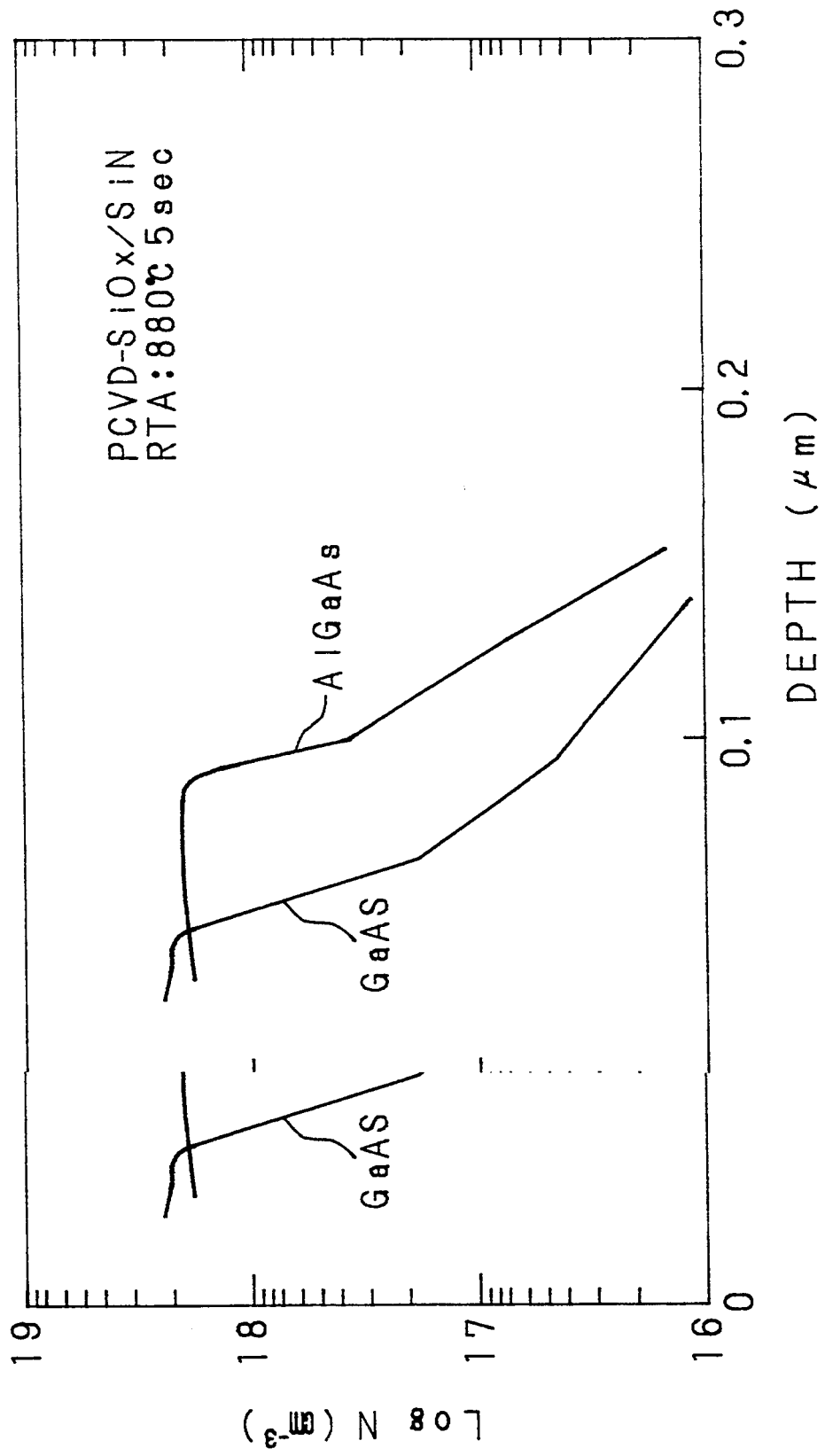
FIG. 11 is a graph showing an electron density profile when the invention is applied to AlGaAs.

FIG. 11 is a graph showing the electron density profile obtained when AlGaAs was doped using the above conditions. FIG. 11 also shows the electron density profile obtained when GaAs was doped using the same conditions as above. From the results shown in FIG. 11, it can be seen that a deeper electron density profile is obtained for AlGaAs than for GaAs. Assuming that the amount of external diffusion of Ga atoms into the SiOx film is approximately equal between the GaAs and AlGaAs, this difference in profile depth is caused presumably by that the Ga vacancies as a result of external diffusion are created deeper in AlGaAs than in GaAs and the Si atoms are allowed to diffuse into deeper positions.

In the above embodiments, GaAs and AlGaAs are used as the Group III-V compound semiconductor, but it will be appreciated that the invention can also be applied for other Group III-V compound semiconductors, such as InP, AlAs, InGaAs, InAlAs, etc., as well as heterojunction substrates constructed from a plurality of such Group III-V compound semiconductors. Furthermore, in the above embodiments, an SiN film is used as the Group V atom diffusion stop film, but alternatively, an AlN film, WSi film, WSiN film, etc., may be used.

As described above, in the doping method of the invention, a wafer of a Group III-V compound semiconductor, with an SiOx film and a Group V atom diffusion stop film formed thereon, is heat-treated to diffuse silicon into the Group III-V compound semiconductor for doping, so that the doping off the Group III-V compound semiconductor can be performed in an extremely easy and well controlled manner. The doping method of the invention can be applied extensively for the fabrication of semiconductor devices using Group III-V compound semiconductors, and thus greatly contributes to the development of semiconductor device fabrication technology.

Embodiments 1 to 7 each have dealt with a method of controlling the diffusion of Si from the SiOx/SiN composite film in the doping method of the invention. In Embodiments 8 to 21 below, semiconductor devices will be described which are fabricated by using the doping method of the invention.

EMBODIMENT 8

Embodiment 8 is concerned with examples in which the doped layer formed in accordance with the invention is used as a resistive layer. Each example below shows a resistive layer whose resistivity can be changed at will while keeping the area of the resistive region restricted.

EXAMPLE 1

Figure 12:
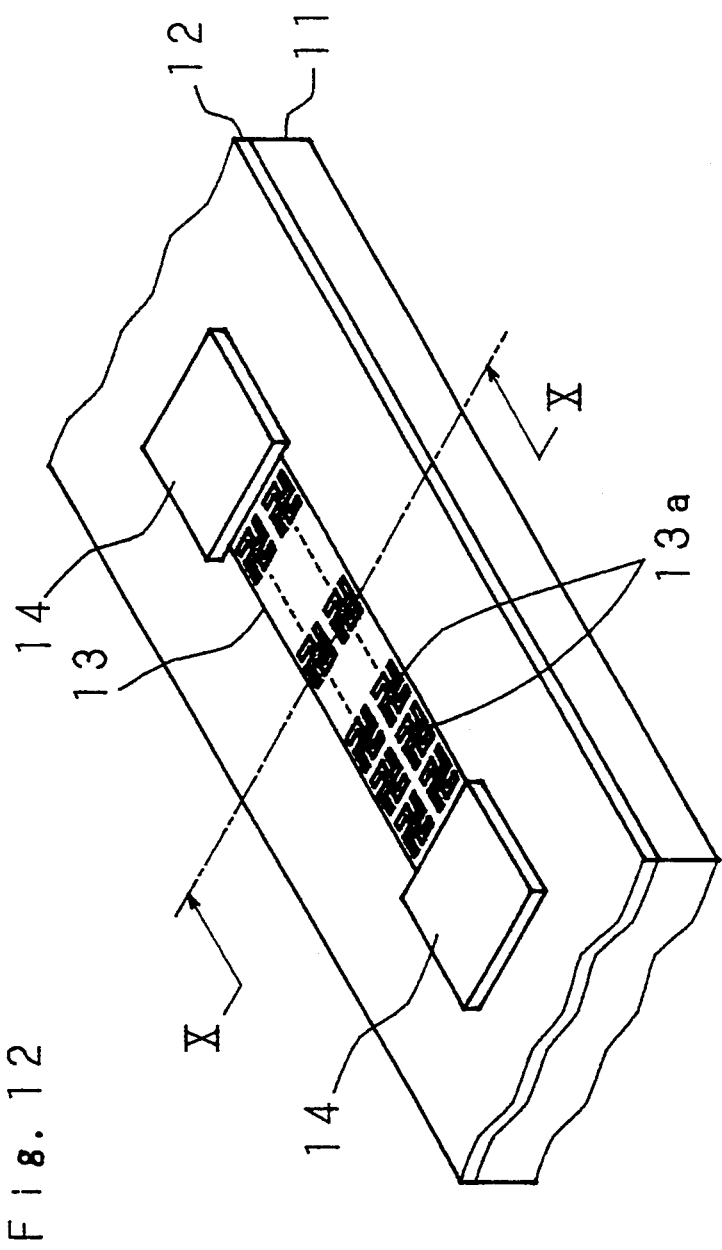
FIG. 12 is a perspective view of a semiconductor device having a resistive layer formed in accordance with Example 1 of Embodiment 8.
Figure 13:
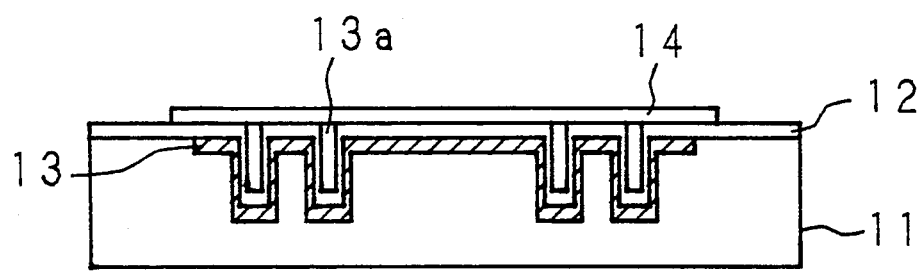
FIG. 13 is a cross-sectional view taken along line X—X in FIG. 12.
Figure 14A:
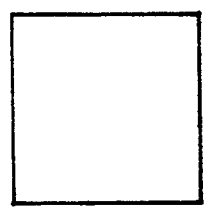
FIG. 14(a) is a plan view showing an example of the shape of a recess according to Example 1.
Figure 14B:
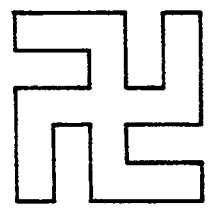
FIG. 14(b) is a plan view showing an example of the shape of a recess according to Example 1.
Figure 14C:
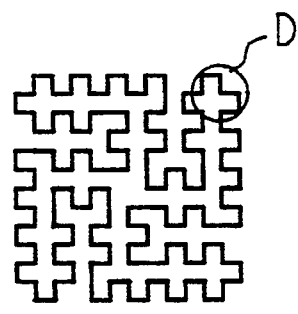
FIG. 14(c) is a plan view showing an example of the shape of a recess according to Example 1.
Figure 14D:
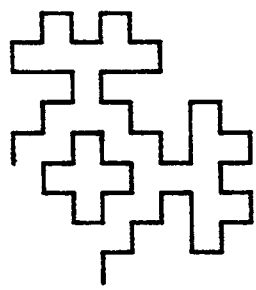
FIG. 14(d) is a plan view showing an example of the shape of a recess according to Example 1.

FIG. 12 is a schematic perspective view of a semiconductor device having a resistive layer formed in accordance with Example 1 of Embodiment 8, and FIG. 13 shows a cross section taken along line X—X in FIG. 12. The semiconductor device shown has the following structure. An Si-diffusible SiOx/SiN composite film 12 is deposited over a semiconductor substrate 11, and at the both ends of a resistive layer 13 are formed electrodes 14 and 14 appropriately spaced apart from each other. In the surface of the semiconductor substrate 11 between the electrodes 14 and 14, there are formed two rows of equally spaced, gammadion-shaped recesses, 13a, 13a, . . . , each row extending along the direction opposing the electrodes 14, 14, with one of the arms of the gammadion being formed in parallel to the opposing direction of the electrodes 14, 14. Impurity is diffused in the surface of the semiconductor substrate 11, including the surfaces of the recesses 13a, 13a, . . . , between the electrodes 14 and 14. The diffused area forms the resistive layer 13, and a current is made to flow between the electrodes 14 and 14 along the opposing direction thereof.

To form the resistive layer 13, etching is first performed on the rectangular area, as viewed from the top, on the surface of the semiconductor substrate 11, where the resistive layer is to be formed, and the gammadion-shaped recesses, 13a, 13a, . . . , are formed at equal intervals. At this time, the recesses, 13a, 13a, . . . , are formed so that one of the arms of the gammadion is parallel to one side of the rectangular area. Thereafter, the SiOx/SiN film 12 is deposited over the semiconductor substrate 11, and impurity is diffused into the rectangular area including the surfaces of the recesses, 13a, 13a, . . . , thus forming the resistive layer 13. Next, the electrodes 14 and 14 are formed at opposite ends of the resistive layer 13 as viewed along the longitudinal direction thereof so that they may be in contact with the resistive layer 13.

As described above, current flows in the resistive layer 13 along the longitudinal direction thereof. The recesses, 13a, 13a, . . . , have side faces extending in two directions, one coinciding with the current direction and the other perpendicular to that direction (such structure is hereinafter described as "fractal"). The resistive layer 13, therefore, consists of portions where the current flow distance, i.e. the effect ire distance, is longer than that in a conventional resistive layer (a resistive layer without such recesses as in this embodiment; hereinafter called the prior art example) by the depth of the side faces, and portions where the effective distance is equal to that in the prior art example, so that the effective distance as a whole is longer than that in the prior art example.

Furthermore, there are portions where the cross-sectional area taken in a direction perpendicular to the current direction, i.e. the effective cross-sectional area, is larger than that of the prior art example by the area of the side faces, and also portions where the cross-sectional area is equal to that of the prior art example, so that the cross-sectional area as a whole is larger than that of the prior art example. As a result, the value of the saturation current increases while the resistivity of the resistive layer 13 remains the same as that of the prior art resistive layer having the same plan area.

FIG. 14 is a plan view showing alternative shapes of the recesses, 13a, 13a, . . . . FIG. 14(a) shows a square-shaped recess, FIG. 14(b) a gammadion-shaped recess as described above, FIG. 14(c) a recess of a shape having a higher fractal dimension than the gammadion-shaped recess, and FIG. 14(d) shows a shape of portion D in FIG. 14(c) with increased fractal dimension. As the number of fractal dimensions is increased, the area of the side faces of each recess increases, resulting in an increase in the effective cross-sectional area of the resistive layer 13. For example, when the area of the side faces perpendicular to the current direction is 1.0 for the recess of FIG. 14(a), the same area is 1.8 for the recess of FIG. 14(b), 4.0 for the recess of FIG. 14(c), and 10.0 for the recess of FIG. 14(d), thus increasing the effective cross-sectional area of the resistive layer.

Figure 15:
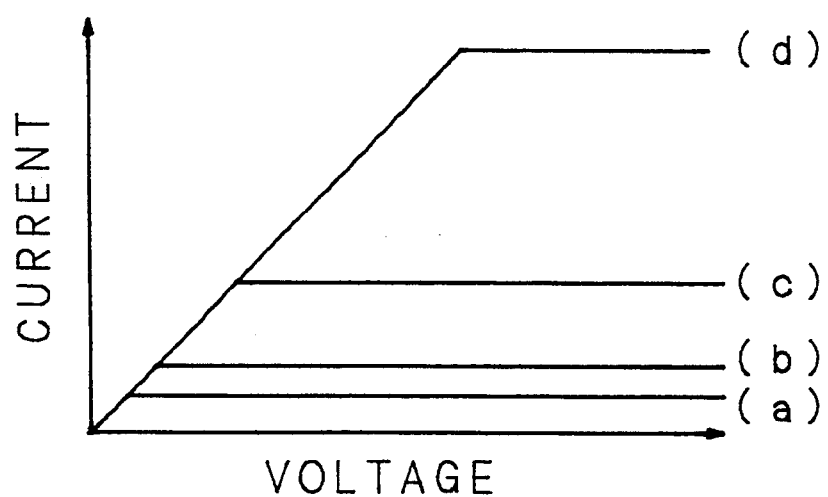
FIG. 15 is a graph showing the current-voltage characteristics of resistive layers formed in accordance with Example 1.

FIG. 15 is a graph showing the current-voltage characteristics of the resistive layer 13 of Example 1 when the fractal recesses 13a, 13a, . . . , shown in FIGS. 14(a) to 14(d), are respectively provided. As is apparent from FIG. 15, the resistive layer 13 provided with recesses of higher fractal dimensions has a larger saturation current value (the largest value is attained with the recess of FIG. 14(d)) since the effective cross-sectional area increases with increasing number of fractal dimensions.

EXAMPLE 2

Figure 16:
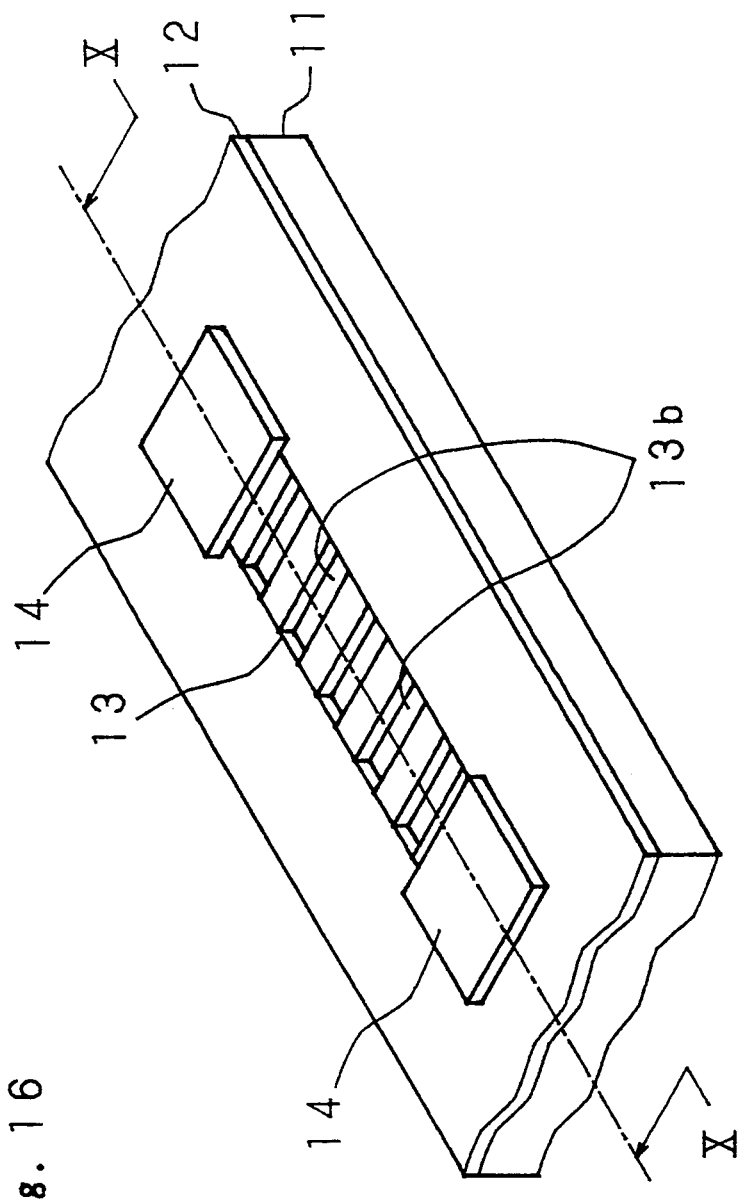
FIG. 16 is a perspective view of a semiconductor device having a resistive layer formed in accordance with Example 2 of Embodiment 8.
Figure 17:
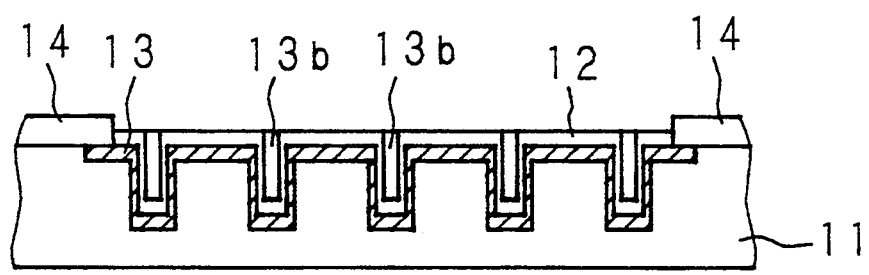
FIG. 17 is a cross-sectional view taken along line X—X in FIG. 16.

FIG. 16 is a schematic perspective view of a semiconductor device having a resistive layer formed in accordance with Example 2 of Embodiment 8, and FIG. 17 shows a cross section taken along line X—X in FIG. 16. The semiconductor device shown has the following structure. An Si-diffusible SiOx/SiN composite film 12 is deposited over a semiconductor substrate 11, and at the both ends of a resist layer 13 are formed electrodes 14 and 14 appropriately spaced apart from each other. In the surface of the semiconductor substrate 11 between the electrodes 14 and 14, there are formed a plurality of equally spaced, rectangular recesses, 13b, 13b, 14, 14, with one side of each recess being in parallel to the opposing direction and with their ends being aligned. Impurity is diffused in the surface of the semiconductor substrate 11, including the surfaces of the recesses 13b, 13b, ..., between the electrodes 14 and 14. The diffused area forms the resistive layer 13, and a current is made to flow between the electrodes 14 and 14 along the opposing direction thereof.

To form the resistive layer 13, etching is first performed on the rectangular area, as viewed from the top, on the surface of the semiconductor substrate 11, where the resistive layer is to be formed, and the recesses, 13b, 13b, direction of the rectangular area, each recess being eroded from one side to the opposing side thereof. Thereafter, the SiOx/SiN composite film 12 is deposited over the semiconductor substrate 11, and impurity as diffused into the rectangular area including the surfaces of the recesses 13b, 13b, ..., thus forming the resistive layer 13. Next, the electrodes 14 and 14 are formed at opposite ends of the resistive layer 13 as viewed along the longitudinal direction thereof so that they may be in contact with the resistive layer 13.

As described above, current flows in the resistive layer 13 along the longitudinal direction thereof. Since the recesses, 13b, 13b, ..., have side faces extending in a direction perpendicular to the current direction, the effective length is longer than that in the prior art example while the effective cross sectional-area is equal to that of the prior art example. This means that the resistivity of the resistive layer 13 of Example 2 is greater than that of the prior art example having the same plan area.

EXAMPLE 3

Figure 18:
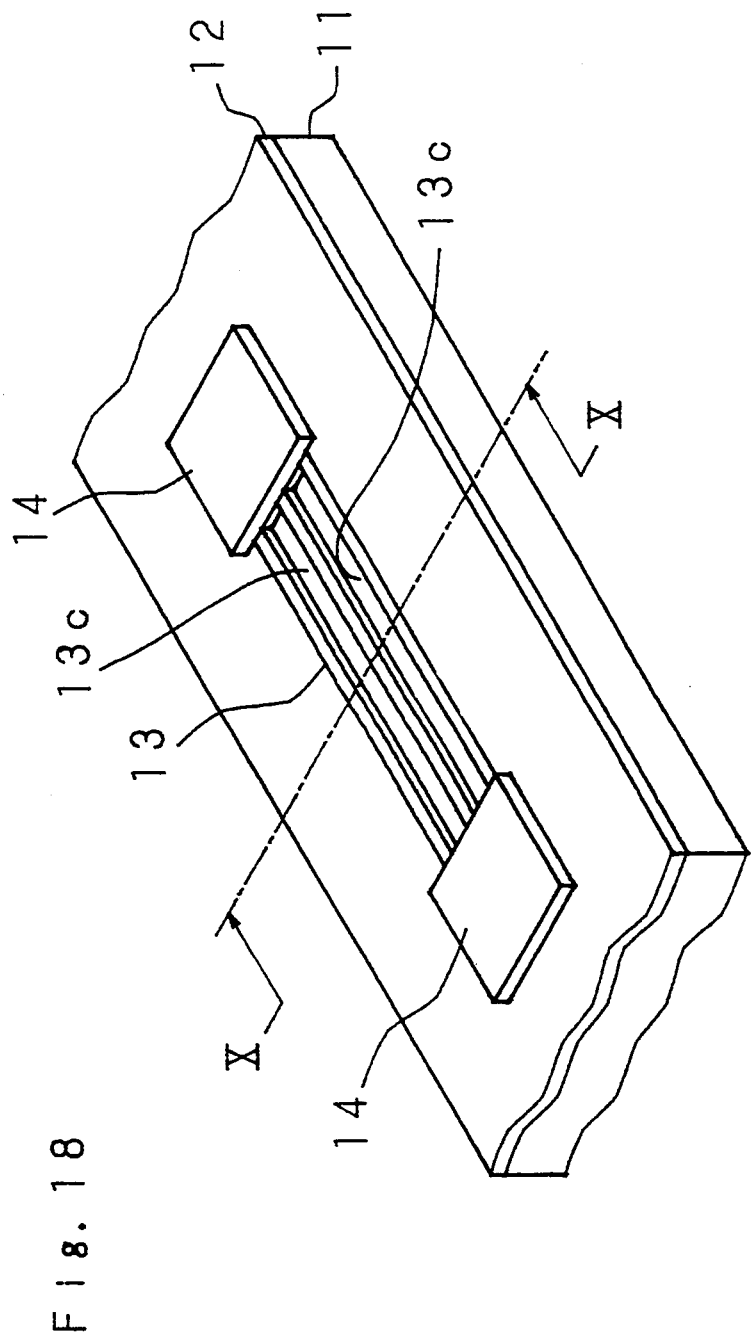
FIG. 18 is a perspective view of a semiconductor device having a resistive layer formed in accordance with Example 3 of Embodiment 8.
Figure 19:
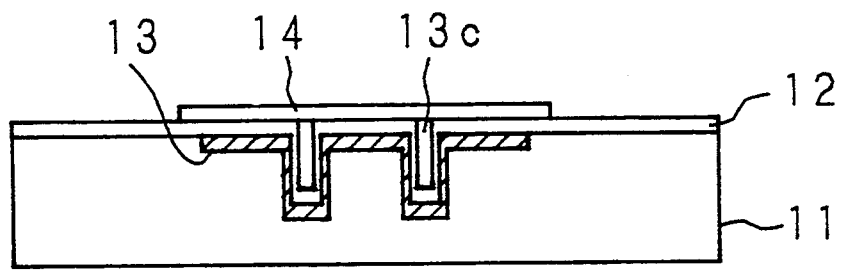
FIG. 19 is a cross-sectional view taken along line X—X in FIG. 18.

FIG. 18 is a schematic perspective view of a semiconductor device having a resistive layer formed in accordance with Example 3 of Embodiment 8, and FIG. 19 shows a cross section taken along line X—X in FIG. 18. The semiconductor device shown has the following structure. An Si-diffusible SiOx/SiN composite film 12 is deposited over a semiconductor substrate 11, and at the both ends of a resistive layer 13 are formed electrodes 14 and 14 appropriately spaced apart from each other. In the surface of the semiconductor substrate 11 between the electrodes 14 and 14, there are formed two rectangular recesses 13c and 13c extending in parallel to the direction opposing the electrodes 14, 14, and appropriately spaced apart in a direction perpendicular to the opposing direction. Impurity is diffused in the surface of the semiconductor substrate 11, including the surfaces of the recesses 13c and 13c, between the electrodes 14 and 14. The diffused area forms the resistive layer 13, and a current is made to flow between the electrodes 14 and 14 along the opposing direction thereof.

To form the resistive layer 13, etching is first performed on the rectangular area, as viewed from the top, on the surface of the semiconductor substrate 11, where the resistive layer is to be formed, and the recesses 13c and 13c are formed along the longitudinal direction of the rectangular area, each recess being eroded from one side to the opposing side thereof. Thereafter, the SiOx/SiN composite film 12 is deposited over the semiconductor substrate 11, and impurity is diffused into the rectangular area including the surfaces of the recesses 13c and 13c, thus forming the resistive layer 13. Next, the electrodes 14 and 14 are formed at opposite ends of the resistive layer 13 as viewed along the longitudinal direction thereof so that they may be in contact with the resistive layer 13.

As described above, current flows in the resistive layer 13 along the longitudinal direction thereof. Since the recesses 13c and 13c have side faces in a direction coincident with the current direction, the effective cross-sectional area is larger than that of the prior art example while the effective length is equal to that in the prior art example. This means that the resistivity of the resistive layer 13 of Example 2 is smaller, and the saturation current value is greater, than the corresponding values of the prior art example having the same plan area.

Figure 20:
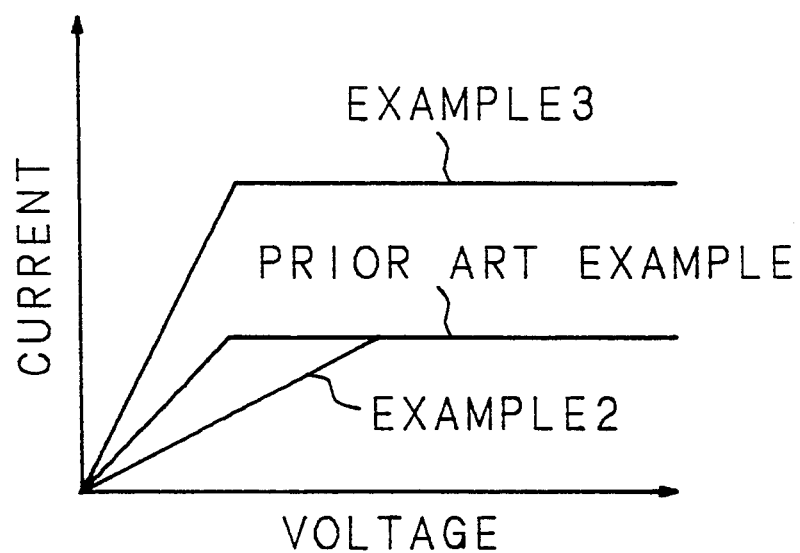
FIG. 20 is a graph showing the current-voltage characteristics of the resistive layers of Examples 2 and 3.

FIG. 20 is a graph showing the current-voltage characteristics of the resistive layers 13 of Examples 2 and 3, respectively. Also shown is the current-voltage curve for the prior art example, that is, a resistive layer that has the same area occupying in the semiconductor substrate as the resistive layers of Examples 2 and 3. From FIG. 20, it can be seen that Example 2 exhibits a greater resistivity than the prior art example though the value of the saturation current is equal between them. It is also shown that Example 3 has a greater saturation current value and a smaller resistivity as compared with the prior art example.

As described, according to Embodiment 8, recesses are formed in the resistive layer, and current flows along the side faces of the recesses. The resistive layer call therefore be formed with a desired resistivity without changing its area size in the semiconductor layer; furthermore, the saturation current value can be increased, and the ohmic characteristics can be improved.

EMBODIMENT 9

Embodiment 9 is concerned with a GaAs FET (a metal-semiconductor field-effect transistor) that employs a high-melting metal which is becoming a predominant material for the gate electrode. Generally, the resistivity of a high-melting metal is about 100 times greater than that of Au-based materials, and the large gate resistance is not desirable particularly in low-noise FETs. Therefore, there is employed a method in which the electrode is formed in T shape to increase the cross-sectional area and reduce the gate resistance. However, if the overhanging portion of the T-shaped gate electrode is enlarged to increase the cross-sectional area of the gate, it will become difficult to form a doped layer, which has a higher impurity concentration than the channel layer in order to reduce the source-gate resistance, in a semiconductor layer below the overhanging portion in self-aligned fashion to the gate. Embodiment 9 has been presented to overcome this difficulty.

Figure 21A:
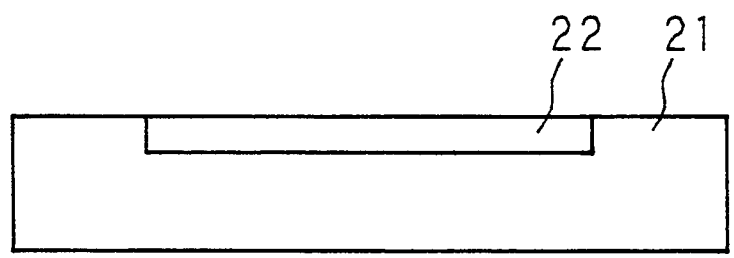
FIG. 21(a) is a cross-sectional view showing a fabrication processing step for a field-effect transistor (FET) according to Embodiment 9.
Figure 21B:
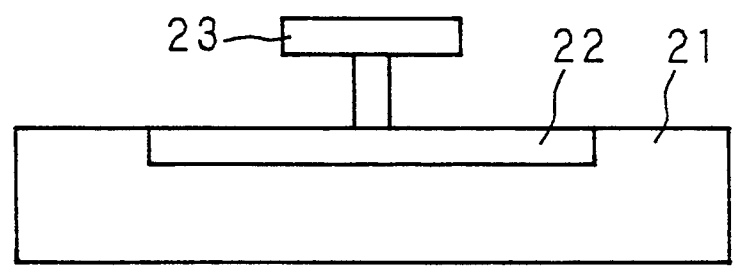
FIG. 21(b) is a cross-sectional view showing a fabrication processing step for the FET of Embodiment 9.

FIG. 21 shows schematic cross-sectional views for explaining a fabrication process sequence for a field-effect transistor (FET) according to Embodiment 9. First, as shown in FIG. 21(a), a GaAs semi-insulative substrate 21 is selectively doped with an n-mode impurity to form a lightly doped layer 22 ($8\times10^{17}$cm$^{-3}$). WSiN/Au is then deposited by sputtering, after which by ion milling and reactive ion etching a T-shaped gate electrode 23 (overhang (Au) width of 1.5 μm, leg (WSiN) width of 0.5 μm) is formed on the center portion of the surface of the lightly doped layer 22 (FIG. 21(b)).

Next, a diffusion source 24, consisting of an SiOx film (x<2) and an SiN film, is formed over the entire surface by plasma CVD, and is then removed leaving only the portions thereof covering the surfaces of the lightly doped layer 22 and T-shaped electrode 23. Over the thus formed surface structure, a silicon oxide (SiO$_2$) film 25 is deposited to a thickness of 700 Å (FIG. 21(c)), which serves as a protective film for subsequent heat treatment. The deposition conditions for the SiOx and SiN films of the diffusion source 24 are as follows:

SiOx: SiH$_4$ 5 sccm, N$_2$O 25 sccm; Power 150 W; Film deposition temperature 300° C.; Film thickness 50 Å

SiN: SiH$_4$ 15 sccm, NH$_3$ 200 sccm; Power 250 W; Film deposition temperature 300° C.; Film thickness 450 Å

Then, selective ion implantation is performed into both end portions of the lightly doped layer 22 to form highly doped layers 26 ($2.5\times10^{18}$cm$^{-3}$) for source and drain regions (FIG. 21(d)).

Thereafter, rapid thermal annealing is performed at 860° C. for 5 seconds, to activate the lightly doped layer 22 and the highly doped layers 26, accelerating the exchange between Ga in the GaAs substrate 21 and Si in the SiOx film and thus accomplishing the doping of the substrate with the Si diffused from the diffusion source 24. As a result, a moderately doped layers 27 of 400 Å thickness and $2\times10^{18}$cm$^{-3}$ concentration are formed below the overhanging portions of the T-shaped gate electrode 23, as shown in FIG. 21(e). The SiN film acts as an As diffusion stop layer during the above heat treatment. Finally, ohmic electrodes 28 are formed on top of the highly doped layers 26 (FIG. 21(f)).

Table 1 below shows a comparison of characteristics between the FET of Embodiment 9 and an FET formed without such diffused layers 27 as shown in FIG. 21.

TABLE 1

| Mode | With diffused layers | Without diffused layers |
| --- | --- | --- |
| Rs | 1.2 Ω/mm | 0.62 Ω/mm |
| gm | 290 mS/mm | 380 mS/m |
| gd | 21 mS/mm | 25 mS/mm |
| ft | 30 GHz | 42 GHz |

Rs: Source-gate resistance,
gm: Mutual conductance,
gd: Drain conductance,
ft: Current shutoff frequency It can be seen from Table 1 that the FET of Embodiment 9 achieves improvement in both static and high-frequency characteristics. The values shown in Table 1 are the average values of the FETs fabricated on a 3-inch wafer. Each characteristic value was within ±8% of the average, exhibiting excellent uniformity.

Figure 22:
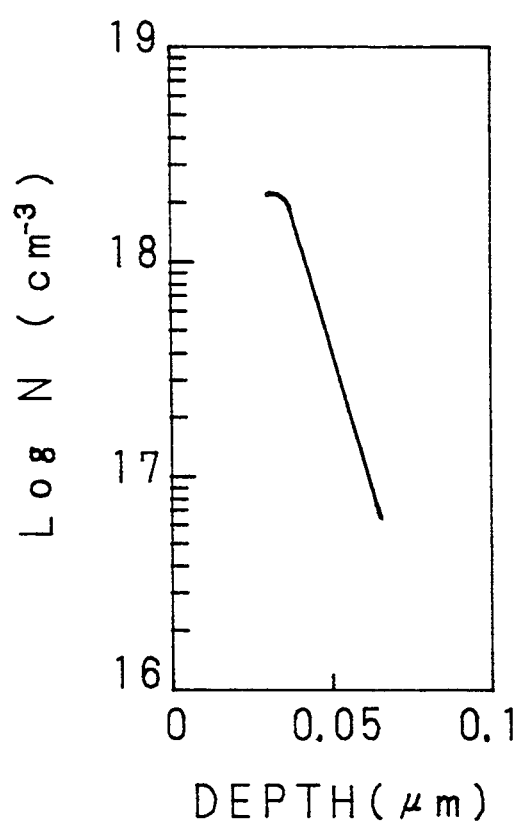
FIG. 22 is a graph showing all electron density profile in a diffused layer shown in FIG. 21.

In the above heat treatment, doping is accomplished with the Si in the SiOx film of the diffusion source 24 being diffused into the regions of the GaAs substrate 21 and lightly doped layer 22 that lie below the overhanging portions of the T-shaped gate 23. FIG. 22 shows the electron density profile taken along the depth direction of the diffused layers 27 formed with the above conditions. The density distribution can be controlled by adjusting the heat treatment conditions and the properties and thicknesses of the SiOx and SiN films.

This embodiment has dealt with an example employing a T-shaped gate electrode, but it will be appreciated that the shape of the electrode is not limited to the illustrated one. Furthermore, any other substrate may be used as long as it consists of a Group III-V compound semiconductor. The SiN film is used as an As diffusion stop layer during heat treatment, but other types of Group V atom diffusion stop layer may be substituted.

According to the FET fabrication process of Embodiment 9, a diffusion layer of two-layered structure consisting of an SiOx film and a diffusion stop layer is formed, and heat treatment is performed to diffuse Si. This enables doping of good surface uniformity even in areas where doping cannot be easily effected by prior art techniques, and thus achieves the fabrication of high-performance, high-quality FETs.

EMBODIMENT 10

In the doping method of the invention, since the SiOx/SiN composite layer is built using plasma CVD, selective doping of desired geometry can be made at desired positions on the wafer. Embodiment 10 shows an example of fabrication of a vertical GaAs MESFET utilizing this feature of the invention.

FIG. 23 shows schematic cross-sectional views illustrating an FET fabrication process sequence according to Embodiment 10. First, a semi-insulative GaAs substrate 1 is selectively etched in the direction substantially perpendicular to the surface (FIG. 23(a)). For the etching, reactive ion etching (RIE), a dry etching technique, is employed which uses a mixed gas of CCl$_2$F$_2$ and He. Using plasma CVD, an SiOx film 32 and an SiN film 33, which acts as a Group V atom diffusion stop film, are formed in this order over the horizontal and vertical surfaces of the selectively etched GaAs substrate 31, and the resulting structure is subjected to heat treatment. With heat treatment, Ga atoms in the GaAs substrate 31 are replaced by Si atoms frown the SiOx film 32, as previously described, thus diffusing the Si atoms into the GaAs substrate 31 and form-ing an n-mode active layer 34 at the horizontal and vertical surfaces of the GaAs substrate 31 (FIG. 23(b)). The film deposition conditions and the heat treatment (RTA) condi-tions for the SiOx film 32 and SiN film 33 are as follows:

SiOx film: SiH$_4$ 5 sccm, N$_2$O 25 sccm; Power 150 W; Film deposition temperature 300° C.; Film thickness 50 Å

SiN film: SiH$_4$ 15 sccm, NH$_3$ 200 sccm; Power 250 W; Film deposition temperature 300° C.; Film thickness 450 Å

RTA: Temperature 880° C.; Time 5 sec.

Figure 23A:
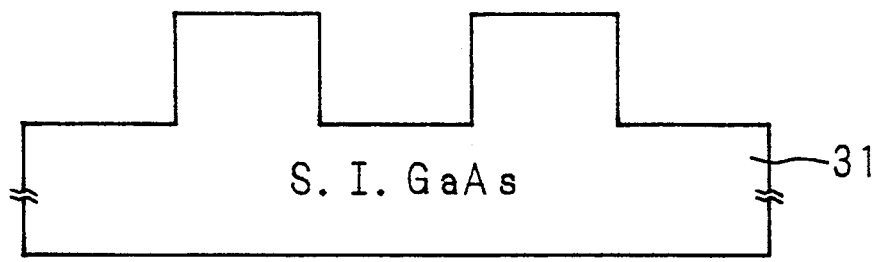
FIG. 23(a) is a cross-sectional view showing a fabrication processing step for an FET of Embodiment 10.
Figure 23B:
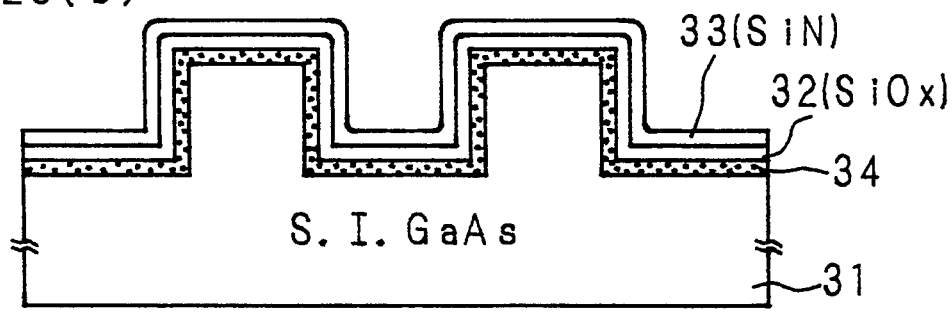
FIG. 23(b) is a cross-sectional view showing a fabrication processing step for the FET of Embodiment 10.
Figure 23C:
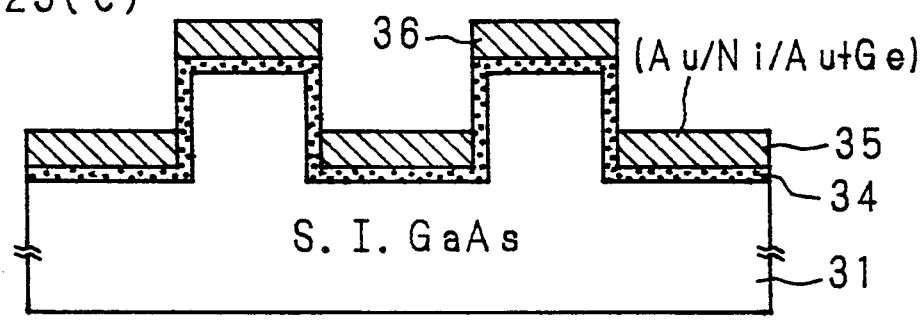
FIG. 23(c) is a cross-sectional view showing a fabrication processing step for the FET of Embodiment 10.

After removal of the composite film of the SiOx film 32 and SiN film 33 by etching, an Au/Ni/Au+Ge film which forms ohmic electrodes is deposited by vacuum evaporation over the portions of the active layer 34 that lie on the horizontal staff aces of the GaAs substrate 31, and then alloyed in a 450° C. hydrogen gas atmosphere, to form a source electrode 35 and a drain electrode 36 (FIG. 23(c)).

Figure 23D:
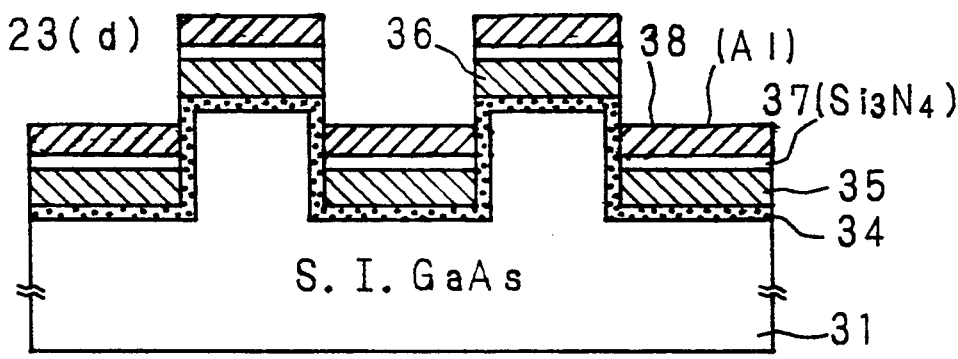
FIG. 23(d) is a cross-sectional view showing a fabrication processing step for the FET of Embodiment 10.

Next, after depositing an Si$_3$N$_4$ film 37 (thickness: 0.1 μm) on the source electrode 35 and the drain electrode 36 by ECR-CVD, an Al film (thickness: 0.03 μm), which forms a Schottky junction, is deposited on top of the Si₃N₄ film 37 by vacuum evaporation, the Al film serving as a gate electrode 38 contacting the active layer 34 formed on the vertical surfaces of the GaAs substrate 31, thus completing the fabrication of the FET (FIG. 23(d)).

In the above fabrication process, the composite film consisting of the SiOx film 32 and SiN film 33 is first formed over the GaAs substrate 31 in a single step by P-CVD, and then, the whole structure is subjected to heat treatment to form the active layer 34. This enables the active layer 34 with uniform impurity concentration to be formed easily also on the vertical surfaces of the selectively etched GaAs substrate 31, so that vertical FETs based on GaAs materials can be fabricated with high reproducibility and high production yield.

Furthermore, since the gate electrode length can be controlled by adjusting the thickness of the Al film to be deposited, the gate electrode 38 of 0.05 μm or shorter length can be formed with good reproducibility. In this embodiment, the thickness of the Al film, i.e., 0.03 μm, is defined as the effective gate length. The thus reduced gate length allows an increase in the frequency (100 GHz or over).

Moreover, the source-to-gate spacing can be controlled by adjusting the thickness of the insulating film (the Si₃H₄ film 37). In this embodiment, the thickness of the Si₃H₄, i.e., 0.1 μm, is defined as the source-to-gate spacing. The thus reduced source-to-gate spacing allows a reduction in the source resistance and hence, an increase in mutual conductance. Furthermore, since each element occupies less space as compared with the conventional horizontal structure, a higher degree of integration can be achieved.

As described above, according to the FET fabrication process of Embodiment 10, a composite film of a SiOx film and an As diffusion stop film is first formed on a Group III-V compound semiconductor substrate selectively etched in the vertical direction, and then, the whole structure is subjected to heat treatment to form an active layer. Therefore, the active layer with uniform impurity concentration can be formed also on the vertical surfaces of the compound semiconductor substrate, so that vertical FETs that can achieve high performance compared with the more conventional horizontal structure can be fabricated with good reproducibility even when Group III-V compound semiconductor substrates are used.

EMBODIMENT 11

Embodiment 11 is concerned with a high-power FET designed to reduce the knee voltage, in which the drain-source resistance call be reduced without decreasing the gate breakdown voltage.

EXAMPLE 1

Figure 24:
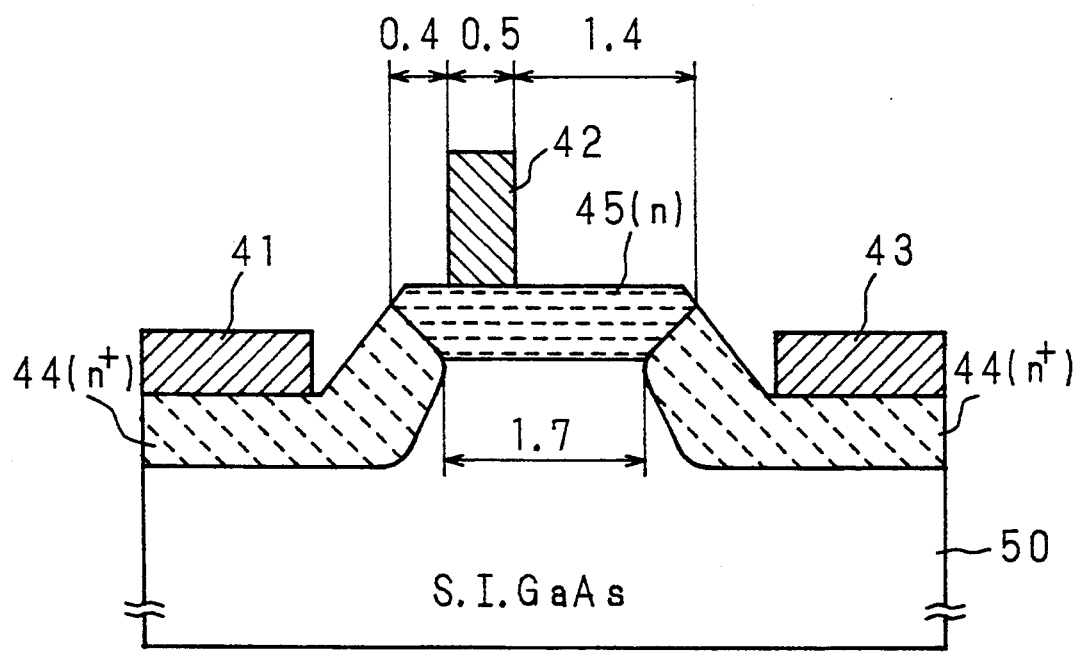
FIG. 24 is a cross-sectional view showing the structure of an FET according to Example 1 of Embodiment 11.

FIG. 24 is a cross-sectional view showing the structure of an FET according to Example 1 of Embodiment 11. In FIG. 24, the reference numeral 50 designates a semi-insulative GaAs substrate used as the semiconductor substrate. The GaAs substrate 50 includes a stepped portion of mesa structure, and an active layer (n layer) 45 is formed to a prescribed depth below the top surface of the mesa in the GaAs substrate 50. In the surface of GaAs substrate 50 extending from the side to the bottom of the mesa structure, there are formed, to a prescribed depth, n+ layers 44 and 44 separated by a prescribed distance and forming the source and drain regions, respectively. On the top surface of the mesa in the GaAs substrate 50, a gate electrode 42 is formed which is connected to the active layer (n layer) 45, and on the surface of the GaAs substrate 50 in the lower part of the mesa, there are formed a source electrode 41 and a drain electrode 43 which are connected to the respective n+ regions 44 and 44. The top surface length and the bottom surface length of the active layer 45 formed in the upper part of the mesa are 2.3 μm and 1.7 μm, respectively, and the gate length of the gate electrode 42 is 0.5 μm. The gate-to-source spacing (the distance from the edge of the gate electrode 42 to the edge of the source region, the n+ layer 44) and the gate-to-drain spacing (the distance from the edge of the gate electrode 42 to the drain region, the n+ layer 44) are 0.4 μm and 1.4 μm, respectively; such an offset gate structure allows an increase in the gate-to-drain breakdown voltage.

To fabricate the FET of the above structure, first a resist is formed everywhere except the top of the mesa, and then, by using an ion implantation technique, dopant is implanted into the top of the mesa at an acceleration voltage of 70 keV and at a dose of $2.5 \times 10^{12} \text{cm}^{-2}$, to form the active layer 45 in the top surface of the mesa in the GaAs substrate 50. Next, after removing the resist, another resist is applied and patterned, and then, dopant is ion-implanted into the surface of the GaAs substrate 50, including the sloping surfaces of the mesa, at an acceleration voltage of 100 keV and at a dose of $5 \times 10^{13} \text{cm}^{-2}$ to form the n+ regions 44 and 44 in the surface portions of the GaAs substrate 50 extending from the side to the bottom of the mesa. Finally, the gate electrode 42, source electrode 41, and drain electrode 43 are separately formed by metallization and lift-off techniques.

In the FET of Example 1, since the dopant is implanted through the sloping surfaces of the mesa, the n+ regions 44 and 44 that form the source and drain regions are formed as shown in FIG. 24. This structure allows the drain-to-source spacing to be reduced without decreasing the gate-to-drain spacing; therefore, the drain-source resistance can be reduced without decreasing the gate breakdown voltage.

EXAMPLE 2

Figure 25:
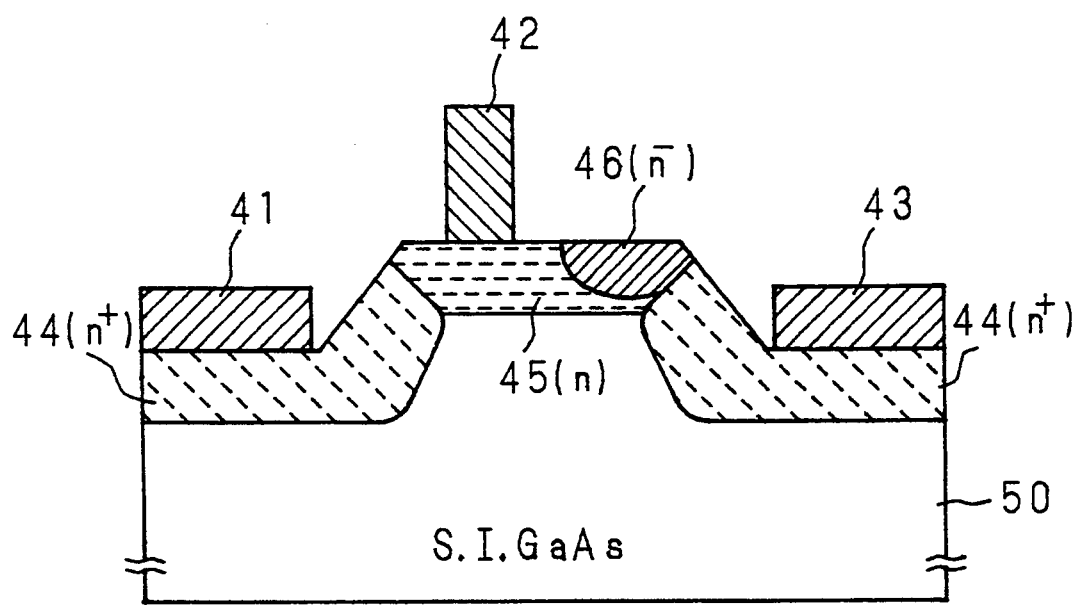
FIG. 25 is a cross-sectional view showing the structure of an FET according to Example 2 of Embodiment 11.

FIG. 25 is a cross-sectional view showing the structure of an FET according to Example 2 of Embodiment 11. The structure is identical to that of the foregoing Embodiment 1, except that an n— region 46 is formed within the active layer 45 in a portion thereof adjacent to the drain region, the n+ region 44. The same reference numerals as those in Example 1 are used to designate the same parts, and the description of the structure is omitted herein. It is apparent that the structure of Example 2 offers the same effects as described in Example 1.

EXAMPLE 3

Figure 26:
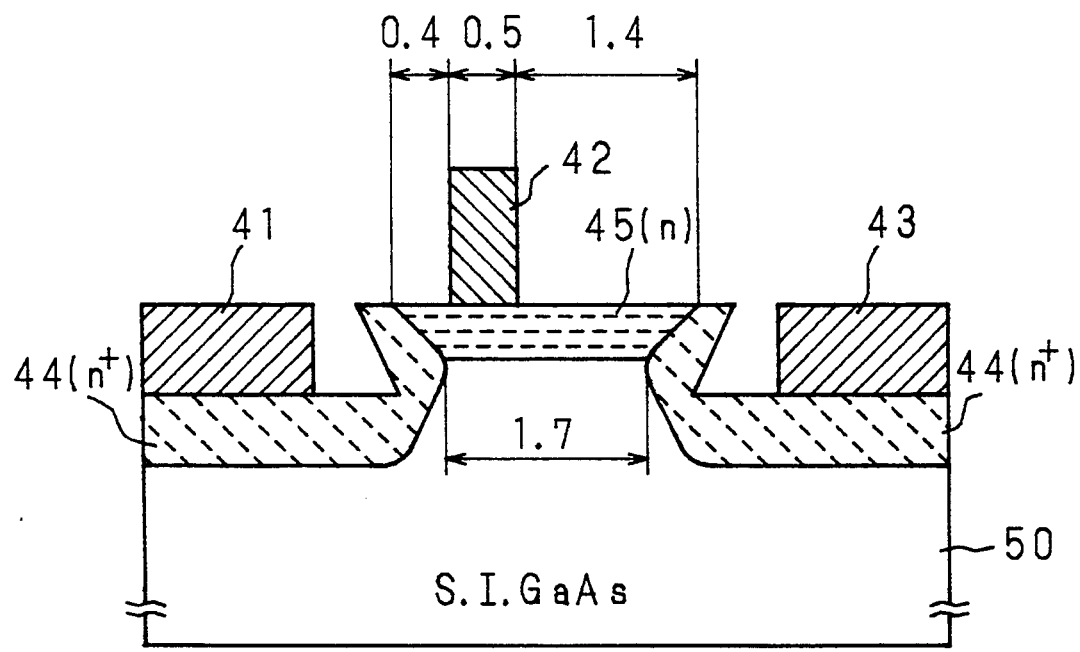
FIG. 26 is a cross-sectional view showing the structure of an FET according to Example 3 of Embodiment 11.

FIG. 26 is a cross-sectional view showing the structure of an FET according to Example 3 of Embodiment 11. In FIG. 26, the reference numeral 50 designates a semi-insulative GaAs substrate used as the Group III-V compound semiconductor substrate. The GaAs substrate 50 includes a stepped portion of inverted mesa structure, and an active layer (n layer) 45 is formed to a prescribed depth below the top surface of the inverted mesa in the GaAs substrate 50. In the surface of GaAs substrate 50 extending from the side to the bottom of the inverted mesa structure, there are formed, to a prescribed depth, n+ layers 44 and 44 separated by a prescribed distance and forming the source and drain regions, respectively. On the top surface of the inverted mesa in the GaAs substrate 50, a gate electrode 42 is formed which is connected to the active layer (n layer) 45, and on the surface of the GaAs substrate 50 in the lower part of the inverted mesa, there are formed a source electrode 4 and a drain electrode 43 which are connected to the respective n+ regions 44 and 44. The top surface length and the bottom surface length of the active layer 45 formed in the upper part of the inverted mesa are 2.3 μm and 1.7 μm, respectively, and the gate length of the gate electrode 42 is 0.5 μm. The gate-to-source spacing (the distance from the edge of the gate electrode 42 to the edge of the source region, the n+ layer 44) and the gate-to-drain spacing (the distance from the edge of the gate electrode 42 to the drain region, the n+ layer 44) are 0.4 μm and 1.4 μm, respectively; such an offset gate structure allows an increase in the gate-to-drain breakdown voltage.

Next, a process for fabricating an FET of the structure shown in FIG. 26 will be described below with reference to FIG. 27 which shows the processing steps of fabrication. First, the semi-insulative GaAs substrate 50 is etched using an etchant of the composition CH(OH)COOH (tartaric acid)+$H_2O_2$+$H_2O$, to form a stepped portion of inverted mesa structure with an etching angle of 55° (FIG. 27(a)). After forming a resist everywhere except the top of the inverted mesa, dopant is ion-implanted into the top of the inverted mesa at an acceleration voltage of 70 keV and at a dose of $2.5 \times 10^{12}$cm$^{-2}$, to form the active layer 45 in the upper part of the inverted mesa in the GaAs substrate 50 (FIG. 27(b)).

Then, the impurity diffused layers (n+ layers) that form the source and drain regions are formed; in Example 3, since the stepped portion is of inverted mesa structure, it is not possible to form impurity diffused layers on the side walls of the inverted mesa by using the ion implantation technique as employed in Example 1. Therefore, in Example 3, the impurity diffused layers (n+ layers) are formed by using the silicon diffusion technique described below.

Figure 27A:
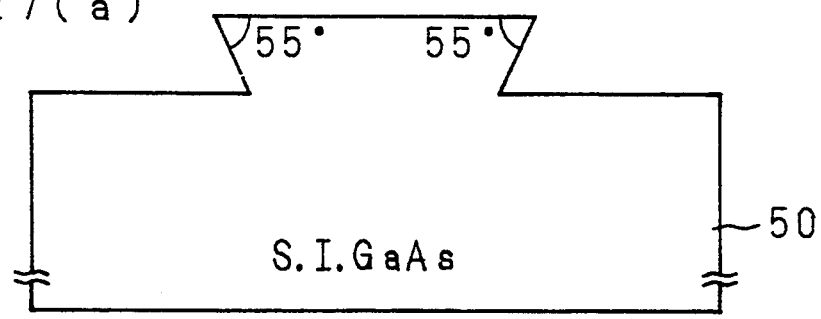
FIG. 27(a) is a cross-sectional view showing a fabrication processing step for the FET shown in FIG. 26.
Figure 27B:
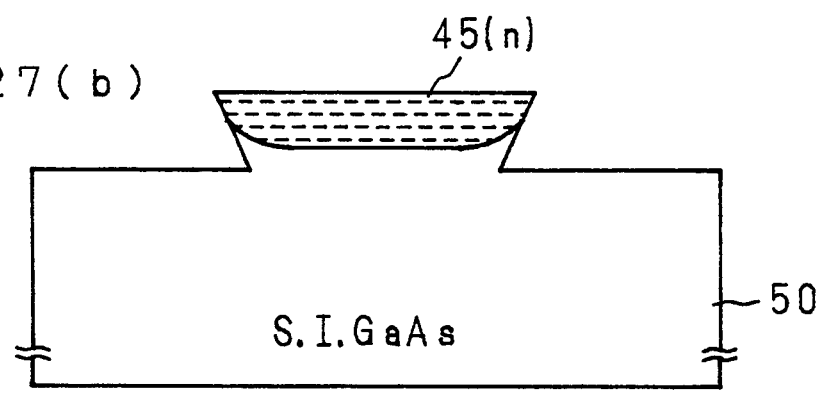
FIG. 27(b) is a cross-sectional view showings a fabrication processing step for the FET shown in FIG. 26.
Figure 27C:
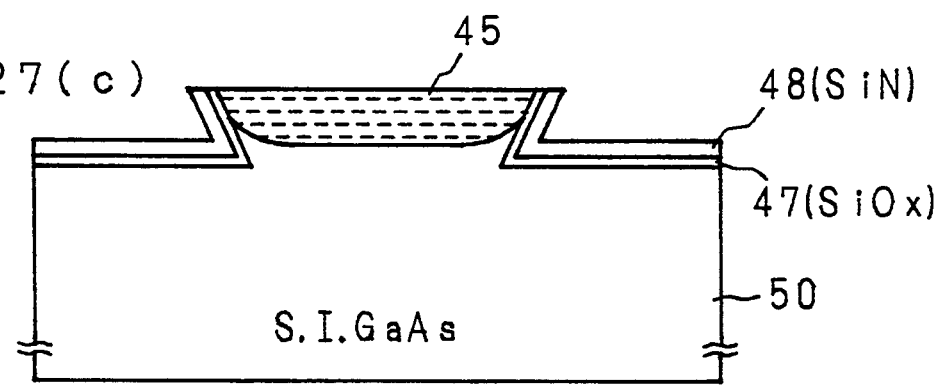
FIG. 27(c) is a cross-sectional view showing a fabrication processing step for the FET shown in FIG. 26.
Figure 27D:
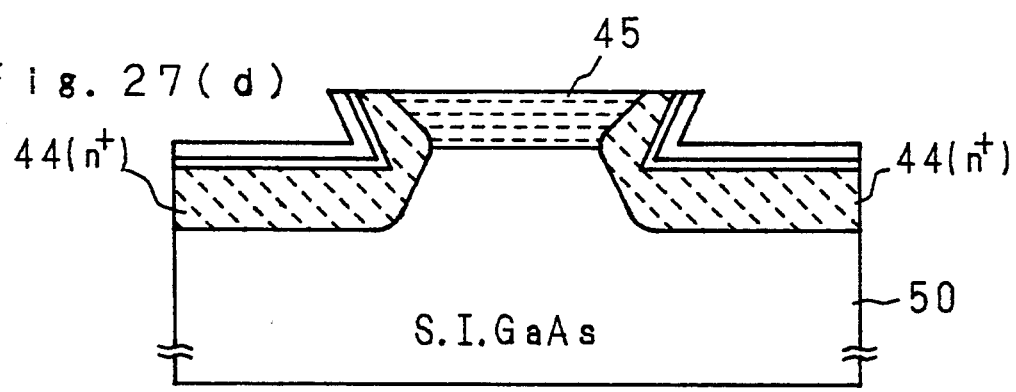
FIG. 27(d) is a cross-sectional view showing a fabrication processing step for the FET shown in FIG. 26.

Using P-CVD, an SiOx film 47 (x<2) and an SiN film 48, which acts as a Group V atom diffusion stop film, are formed in this order over the side and bottom surfaces of the inverted mesa in the GaAs substrate 50 (FIG. 27(c)), after which the entire structure is subjected to heat treatment. With heat treatment, Ga atoms in the GaAs substrate 50 are replaced by Si atoms from the SiOx film 47, as previously described, thus diffusing the Si atoms into the GaAs substrate 50 and forming the n+ layers 44 and 44 on the side and bottom surfaces of the inverted mesa (FIG. 27(d)). The film deposition conditions and the heat treatment (RTA) conditions for the SiOx film 47 and SiN film 48 are as follows:

SiOx film: SiH$_4$ 5 sccm, N$_2$O 25 sccm; Power 150 W;
Film deposition temperature 300° C.; Film thickness 50 Å

SiN film: SiH$_4$ 15 sccm, NH$_3$ 200 sccm; Power 250 W;
Film deposition temperature 300° C.; Film thickness 450 Å

RTA: Temperature 880° C.; Time 5 sec.

After removing the composite film of the SiOx film 47 and SiN film 48 by etching, the gate electrode 42, source electrode 41, and drain electrode 43 are formed separately by metallization and lift-off techniques, to complete the fabrication of the FET of the structure shown in FIG. 26.

In the FET of Example 3, since the dopant (Si) is diffused from the composite structure of the SiOx film 47 and SiN film 48 into the sloping surfaces of the inverted mesa, the n+ regions 44 and 44 that form the source and drain regions are formed as shown in FIG. 26. This structure allows the drain-to-source spacing to be reduced without decreasing the gate-to-drain spacing; therefore, the drain-source resistance can be reduced without decreasing the gate breakdown voltage.

EXAMPLE 4

Figure 28:
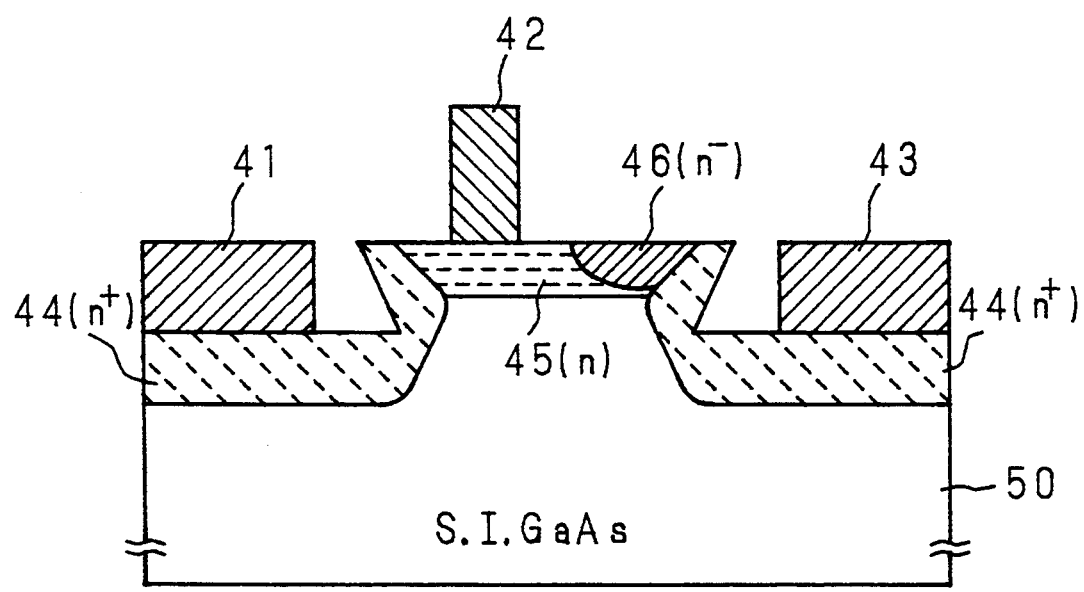
FIG. 28 is a diagram showing a cross-sectional structure of an FET according to Example 4 of Embodiment 11.

FIG. 28 is a cross-sectional view showing the structure of an FET according to Example 4 of Embodiment 11. The structure is identical to that of the foregoing Embodiment 3, except that an n− region 46 is formed within the active layer 45 in a portion thereof adjacent to the drain region, the n+ region 44. The same reference numerals as those in Example 3 are used to designate the same parts, and the description of the structure is omitted herein. It is apparent that the structure of Example 4 offers the same effects as described in Example 3.

During the manufacture of Example 1, the technique of ion implantation was used to form the n+ layers 44 and 44, but alternatively, a composite film of an SiOx film and an SiN film may be formed first, and then subjected to heat treatment to diffuse silicon from the SiOx film to form the n+ layers 44 and 44, as practiced in the manufacture of Example 3. Furthermore, the active layer 45 may be formed by using the same technique as for forming the n+ layers 44 and 44.

The following compares the transistor characteristics, gate breakdown voltages, and source-drain resistances between a prior art FET (hereinafter referred to as the prior art example), the FET of Example 1 shown in FIG. 24, and the FET of Example 3 shown in FIG. 26. Table 2 shows the numerical results of the comparison of these FETs.

TABLE 2

|  | Prior Art | Example 1 | Example 3 |
| --- | --- | --- | --- |
| Saturation output current at Vgs = 0 1 Idss (mA/mm) | 47.1 | 50 | 45 |
| Source-gate breakdown voltage Vrgs (V) | 5.9 | 5.5 | 5.0 |
| Drain-gate breakdown voltage Vrgd (V) | 10.3 | 11.0 | 10.1 |
| Drain-source resistance Rds (Ω/mm) | 5.6 | 3.7 | 3.2 |
| Knee Voltage Vk (V) | 1.0 | 0.65 | 0.60 |

From the results shown in Table 2, it can be seen that the drain-source resistance is drastically reduced in Examples 1 and 3 of Embodiment 11 as compared with the prior art example while no substantial change is noted in the gate breakdown voltages. It can be also seen that the knee voltage is lowered in Examples 1 and 3 as compared with the prior art example.

As described above, in the FET of Embodiment 11, since the impurity diffused layers that constitute the source and drain regions are formed on the side and bottom surfaces of the stepped portion of the semiconductor substrate, the drain-source resistance can be reduced without decreasing the gate breakdown voltage; as a result, this embodiment offers a high-power, high-efficiency power amplifying FET that decreases the knee voltage and that does not impose limitations on the magnitude of the output power. Furthermore, the reduced drain-source resistance allows an improvement in the transistor characteristics such as increased mutual conductance gm.

Moreover, according to the FET fabrication process of Embodiment 11, an SiOx film and a Group V atom diffusion stop film are deposited one on top of the other on the side and bottom surfaces of a stepped portion formed in a Group III-V compound semiconductor substrate, and after that, the composite structure is subjected to heat treatment to form impurity diffused layers. The impurity diffused layers, therefore, can be formed easily along the sides of the stepped portion of the compound semiconductor substrate regardless of the shape of the stepped portion, so that FETs with improved transistor characteristics can be fabricated with good reproducibility.

EMBODIMENT 12

Embodiment 12 is concerned with an example of FET fabrication utilizing the doping technique of the invention, wherein an n layer for the channel and n+ layers for the source and drain regions are formed in two steps of heat treatment.

EXAMPLE 1

FIG. 29 shows cross-sectional views illustrating a fabrication process sequence for an FET according to Example 1 of Embodiment 12. First, a diffusion source 52 is formed by depositing an undoped SiOx film (x<2) and an SiN film, which acts as a Group V atom diffusion stop film, in this order over the region of a GaAs semi-insulative substrate 51 where a doped layer is to be formed. The deposition conditions for the diffusion source 52 are as follows:

SiOx film: SiH$_4$ 10 sccm, N$_2$O 20 sccm; Substrate temperature 300° C.; RF power 150 W; Film thickness 100 Å

SiN film: SiH$_4$ 15 sccm, NH$_3$ 200 sccm; Substrate temperature 300° C.; RF power 250 W; Film thickness 400 Å

Figure 29A:
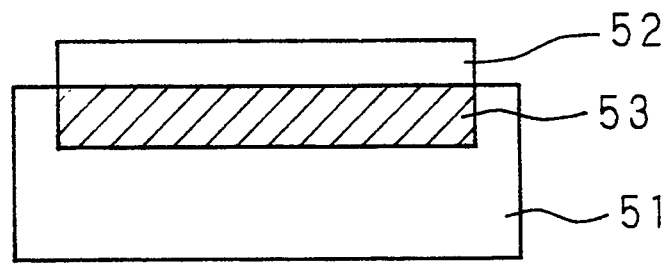
FIG. 29(a) is a cross-sectional view showing a fabrication processing step for an FET according to Example 1 of Embodiment 12.

The first heat treatment (800° C., 30 seconds) is performed to form an n layer 53 (doping concentration $2\times10^{18}$cm$^{-3}$, thickness 0.03 μm) in the surface of the GaAs substrate 51 (FIG. 29(a)).

Figure 29B:
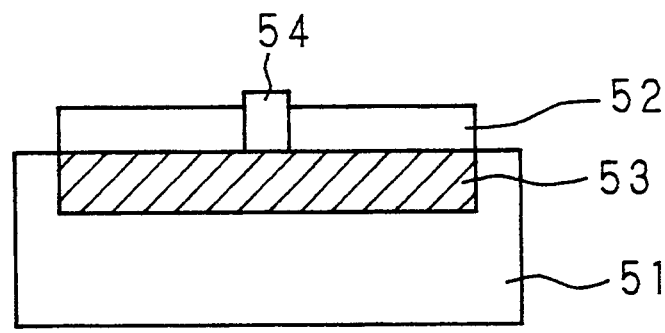
FIG. 29(b) is a cross-sectional view showing a fabrication processing step for the FET according to Example 1 of Embodiment 12.
Figure 29C:
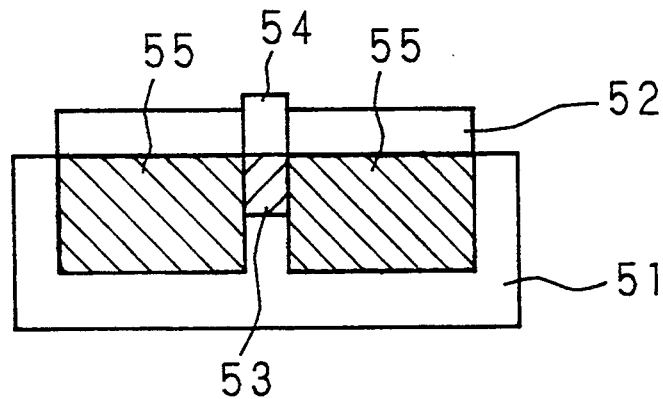
FIG. 29(c) is a cross-sectional view showing a fabrication processing step for the FET according to Example 1 of Embodiment 12.
Figure 29D:
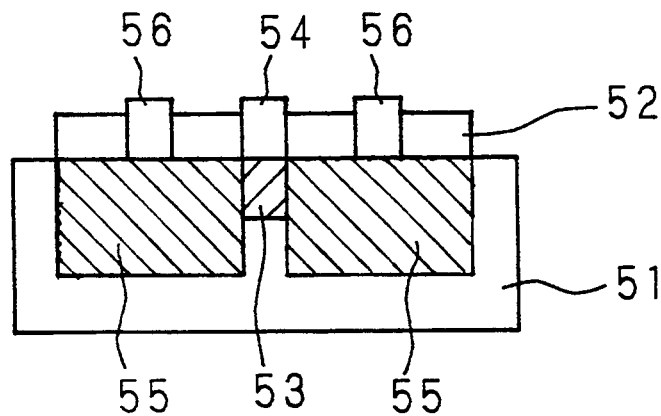
FIG. 29(d) is a cross-sectional view showing a fabrication processing step for the FET according to Example 1 of Embodiment 12.
Figure 30A:
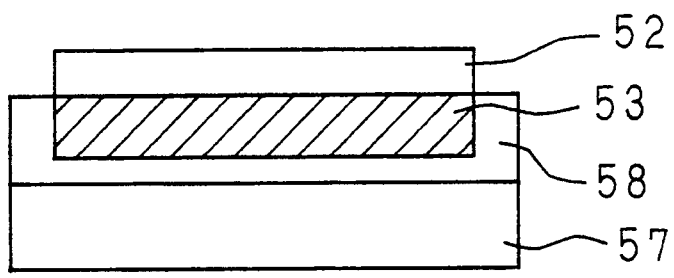
FIG. 30(a) is a cross-sectional view showing a fabrication processing step for an FET according to Example 2 of Embodiment 12.
Figure 30B:
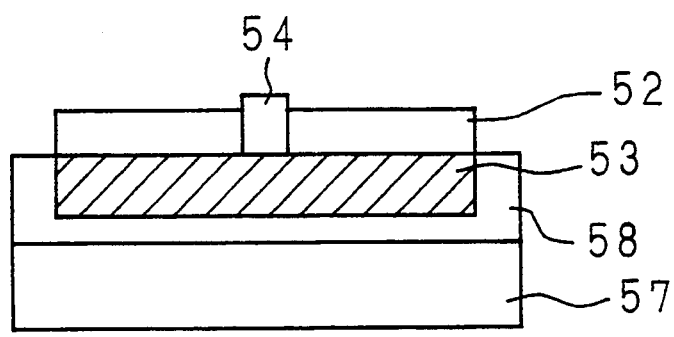
FIG. 30(b) is a cross-sectional view showing a fabrication processing step for the FET according to Example 2 of Embodiment 12.
Figure 30C:
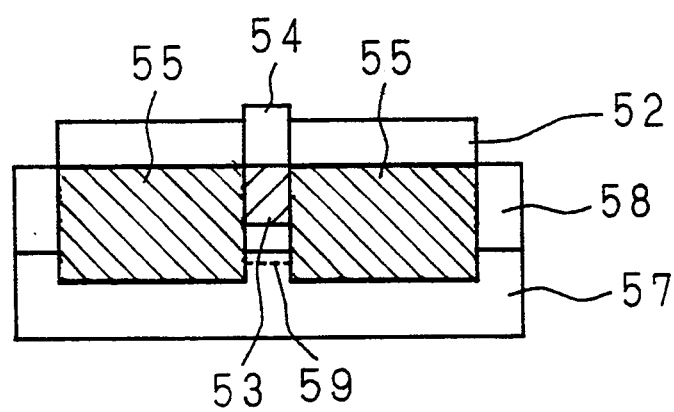
FIG. 30(c) is a cross-sectional view showing a fabrication processing step for the FET according to Example 2 of Embodiment 12.
Figure 30D:
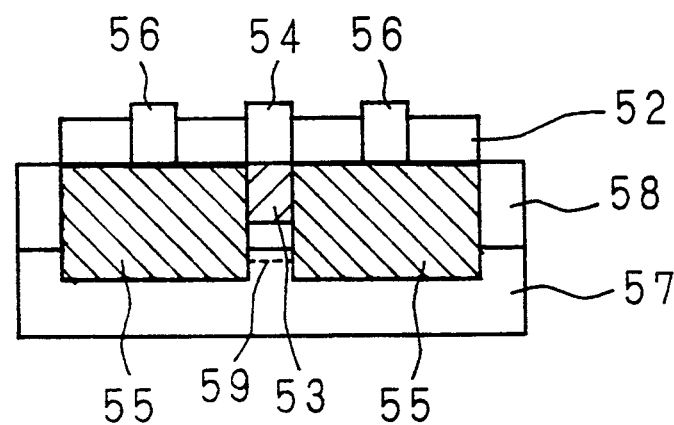
FIG. 30(d) is a cross-sectional view showing a fabrication processing step for the FET according to Example 2 of Embodiment 12.

Next, the diffusion source 52 is selectively removed in a designated area, in which area a gate electrode 54 is formed from WSi, a high-melting metal (FIG. 29(b)). Thereafter, the second heat treatment (880° C., 5 seconds) is performed to further dope the region below the diffusion source 52, as a result of which n+ layers 55 and 55 are selectively formed that have a higher doping concentration ($4\times10^{18}$cm$^{-3}$) and a greater thickness (0.07 μm) than the n layer 53 (FIG. 29(c)). Then, the diffusion source 52 is removed in designated areas on the n+ layers 55 and 55, and ohmic electrodes 56 and 56 of AuGe/Ni/Au are formed in the designated areas (FIG. 29(d)).

EXAMPLE 2

FIG. 30 shows cross-sectional views illustrating an FET fabrication process sequence according to Example 2 of Embodiment 12. Shown here is an example of a modulation-doped FET. A diffusion source 52 is formed on a region where a doped layer is to be formed, as in Example 1, but this time on a GaAs/AlGaAs substrate that consists of an undoped GaAs layer 57 and an undoped AlGaAs layer 58 formed thereon by molecular beam epitaxy (MBE). In the first heat treatment (800° C., 30 seconds), an n layer 53 (doping concentration $2\times10^{18}$cm$^{-3}$, thickness 0.06 μm) is formed in the AlGaAs layer 58 (FIG. 30(a)).

Next, the diffusion source 52 is selectively removed in a designated area, in which area a gate electrode 54 is formed from WSi, a high-melting metal (FIG. 30)). Thereafter, the second heat treatment (880° C., 5 seconds) is performed to further dope the region below the diffusion source 52, as a result of which n+ layers 55 and 55 are selectively formed that have a higher doping concentration ($4\times10^{18}$cm$^{-3}$) and a greater thickness (0.15 μm) than the n layer 53 (FIG. 30(c)). Then, the diffusion source 52 is removed in designated areas on the n+ layers 55 and 55, and ohmic electrodes 56 and 56 of AuGe/Ni/Au are formed in the designated areas (FIG. 30(d)), thus completing the fabrication of a modulation-doped FET in which a two-dimensional electron gas layer 59 is formed selectively below the gate electrode 54 (FIG. 30(d)).

Figure 31:
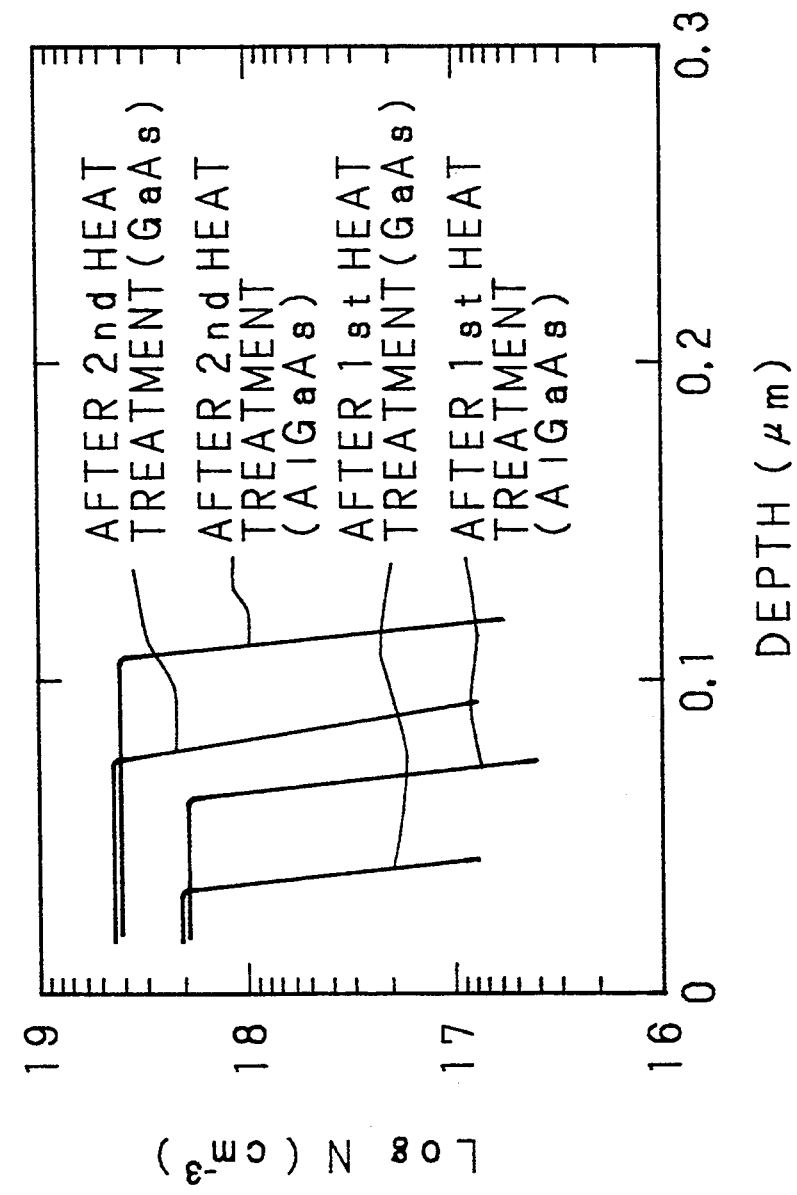
FIG. 31 is a graph showing electron density profiles in doped layers shown in FIGS. 29 and 30.

FIG. 31 is a graph showing electron density profiles in the doped layers shown in FIGS. 29 and 30. In both of GaAs (the GaAs substrate 51) and AlGaAs (the AlGaAs layer 58), the doped layer formed by the second heat treatment has a higher doping concentration (electron density) and a greater doping depth than the doped layer formed by the first heat treatment. By varying the temperature and time of heat treatment in this manner, the doping concentration and the doping depth can be easily controlled.

Using the method of the invention, it is easy to form doped layers of two or more different doping concentrations by performing two or more heat treatments.

The above embodiment has dealt with the GaAs substrate and the GaAs/AlGaAs heterojunction substrate as examples, but it will be appreciated that the embodiment is also applicable to other Group III-V compound semiconductor substrates.

As described above, according to the FET fabrication process of Embodiment 12, an SiOx film and a Group V atom diffusion stop film are formed, and heat treatment is performed to form a doped layer, after which further heat treatment is performed with the SiOx and Group V atom diffusion stop films left only over a region where a highly doped layer is to be formed. The process thus achieves easy formation of doped layers of high impurity concentrations, and realizes a simplified fabrication process and improved fabrication yield.

EMBODIMENT 13

Embodiment 13 is concerned with a method of fabrication wherein an enhancement-mode and a depletion-mode FET are fabricated in a single heat treatment by controlling the thickness of the SiN film.

Figure 32:
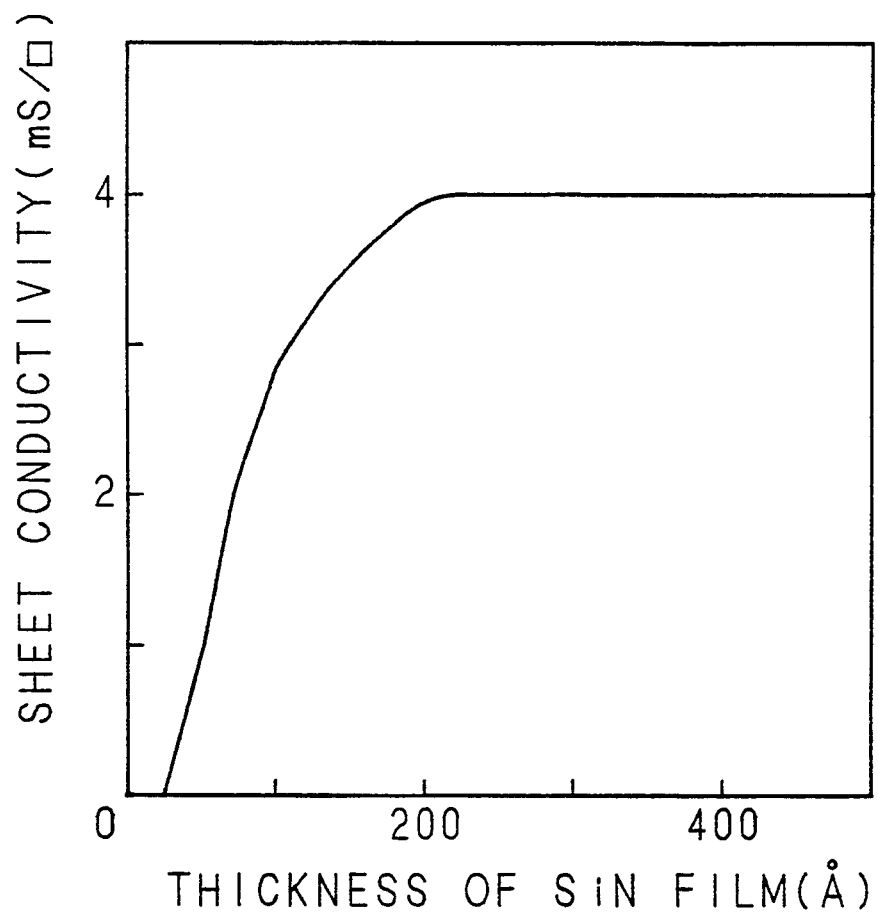
FIG. 32 is a graph showing the relationship between the SiN film thickness and the sheet conductivity.

Embodiment 13 utilizes the property that in the doping method of the invention the external diffusion of the Group V atoms and the diffusion of the Si atoms can be controlled by adjusting the thickness of the SiN film. FIG. 32 is a graph s owing the relationship between the thickness of the SiN film and the reciprocal of the sheet resistance (i.e., the sheet conductivity) of the diffused layer. As shown, the sheet conductivity is substantially constant when the thickness of the SiN film is 200 Å or over, but for thickness less than 200 Å, the sheet conductivity changes greatly.

Figure 1:
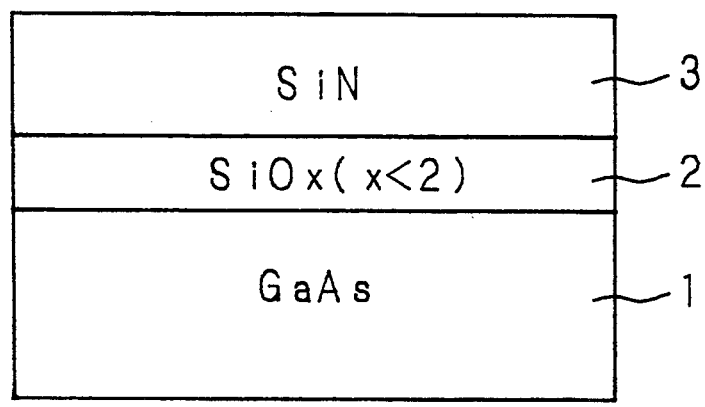
FIG. 1 is a cross sectional view showing the structure of an SiOx/SiN composite film for explaining the principle of the doping method of the invention.
Figure 2A:
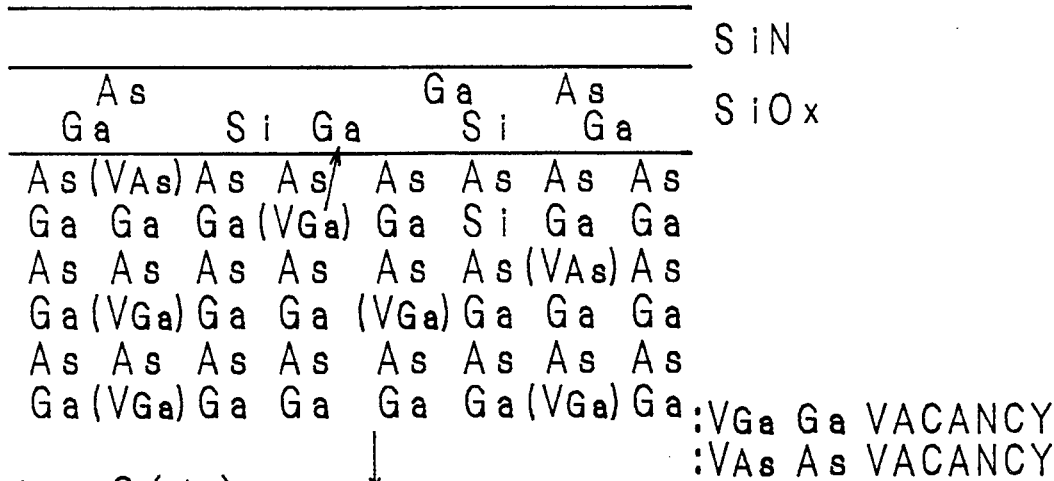
FIG. 2(a) is a schematic diagram for explaining the mechanism of Si doping according to the invention.
Figure 2B:
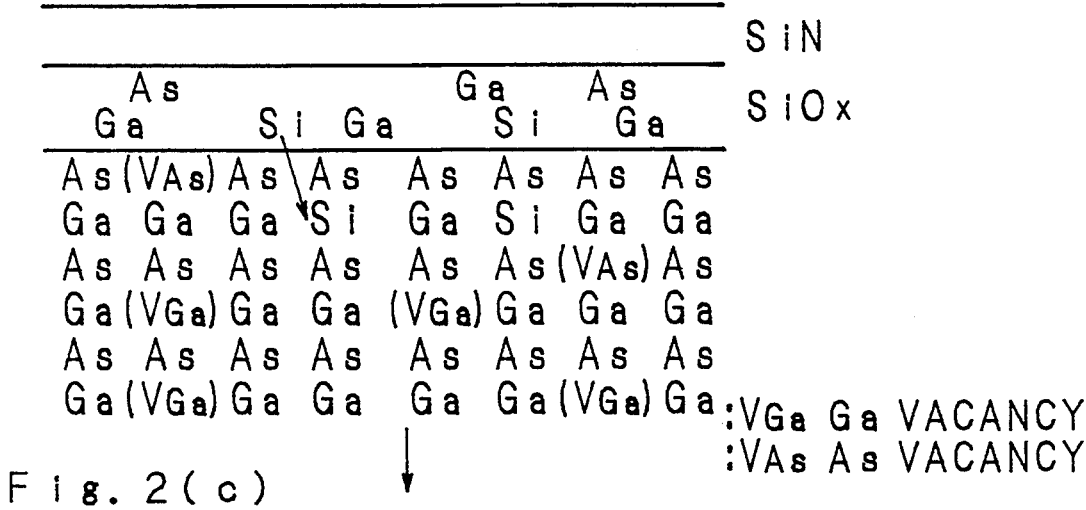
FIG. 2(b) is a schematic diagram for explaining the mechanism of Si doping according to the invention.
Figure 2C:
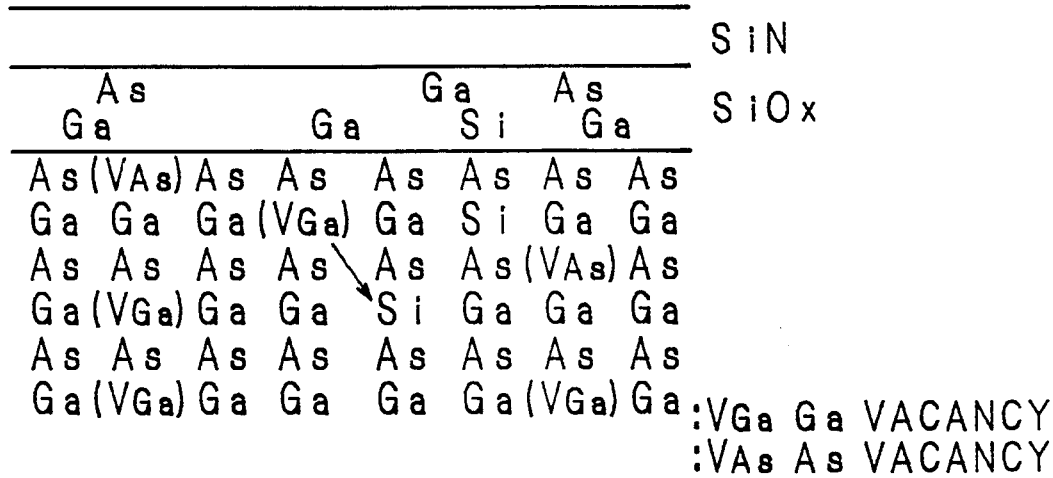
FIG. 2(c) is a schematic diagram for explaining the mechanism of Si doping according to the invention.
Figure 33A:
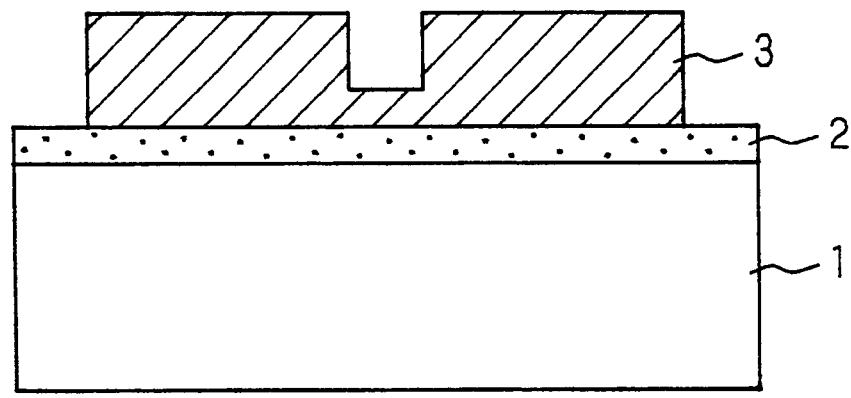
FIG. 33(a) is a cross-sectional view showing a process of forming conductive layers according to Embodiment 13.
Figure 33B:
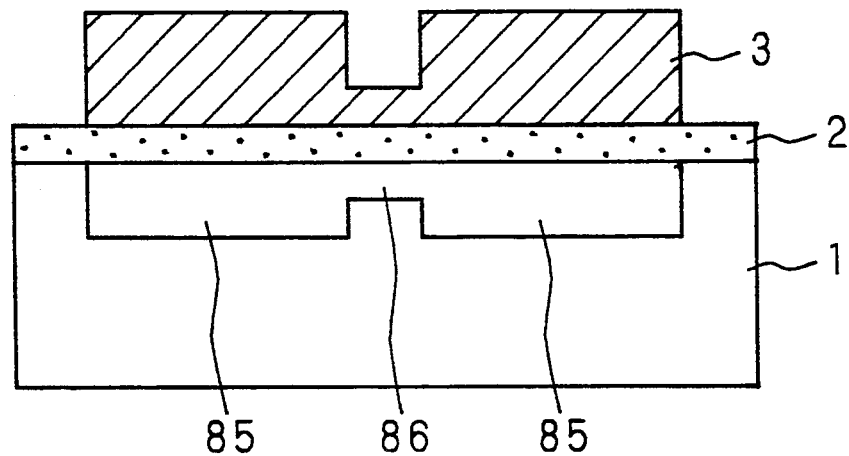
FIG. 33(b) is a cross-sectional view showing a process of forming the conductive layers according to Embodiment 13.

FIG. 33 shows diagrams for explaining a process for forming conductive layers utilizing the above phenomenon. When heat treatment is performed with the SiN film 3 shown in FIG. 1 partially thinned down as shown in FIG. 33(a), there is formed below the thinned part of the SiN film 3 a conductive layer 86 having a higher resistance than that of a conductive layer 85 formed below the thicker part of the SiN film 3. The conductive layer 86 has a shallower diffusion depth and a lower carrier concentration than the conductive layer 85. By adjusting the thickness of the SiN film 3 in this manner, conductive layers having different resistivities can be formed simultaneously in a single heat treatment.

Embodiment 13 provides the further effect that since conductive layers of different resistivities are formed in a heterojunction layer, a desired modulation-doped structure can be obtained easily.

EXAMPLE 1

FIG. 34 shows diagrams for explaining a fabrication process for a GaAs FET according to Example 1 of Embodiment 13. First, as shown in FIG. 34(a), a diffusion source 64 consisting of an SiOx film 62 and an SiN film 63 is deposited over a semi-insulative GaAs substrate 61 using parallel-plate RF plasma CVD equipment, the deposition conditions being as follows:

SiOx film 62: $SiH_4$ 10 sccm, $N_2O$ 30 sccm; Power 150 W; Film deposition temperature 300° C.; Film thickness 50 Å

SiN film 63: $SiH_4$ 15 sccm, $NH_3$ 200 sccm; Power 250 W; Film deposition temperature 300° C.; Film thickness 60 Å

A resist 65 is applied over an area where a conductive layer is to be formed, and the portions of the diffusion source 64 that are not covered by the resist 65 are removed.

Figure 34A:
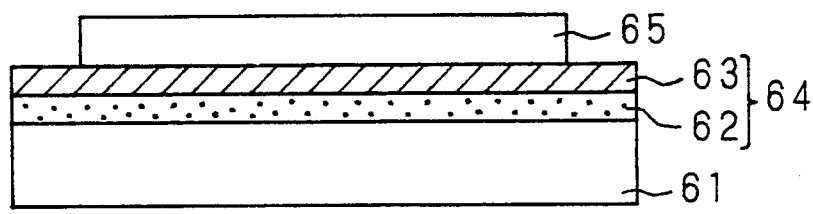
FIG. 34(a) is a cross-sectional view showing a fabrication processing step for a GaAs FET according to Embodiment 13.
Figure 34B:
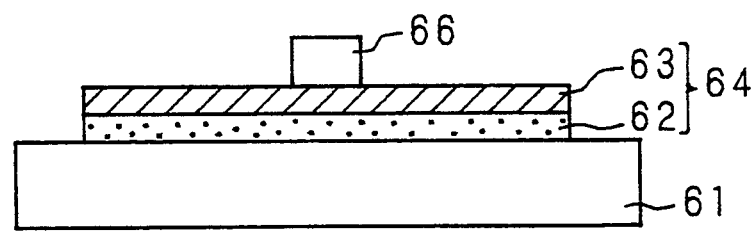
FIG. 34(b) is a cross-sectional view showing a fabrication processing step for the GaAs FET according to Embodiment 13.
Figure 34C:
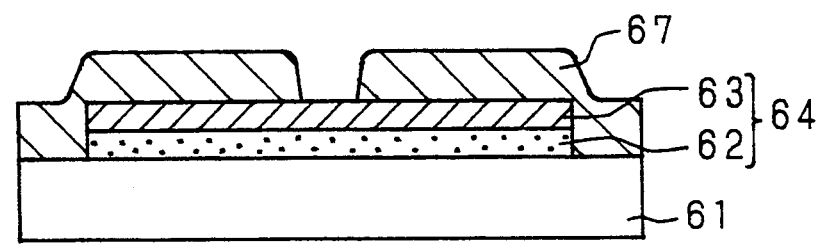
FIG. 34(c) is a cross-sectional view showing a fabrication processing step for the GaAs FET according to Embodiment 13.

After removing the resist 65, a resist 66 is formed as a dummy gate at a position where a gate electrode is to be formed (FIG. 34(b)). Next, using an ECR-CVD technique, an SiN film 67, which can be formed at room temperatures, is deposited over the entire surface with the following conditions; thereafter, the resist 66 is removed by lift-off to form an inverted pattern (FIG. 34(c)).

SiN film 67: $SiH_4$ 13 sccm, $N_2$ 30 sccm; Power 600 W; Film deposition temperature Room temperature; Film thickness 100 Å

Figure 34D:
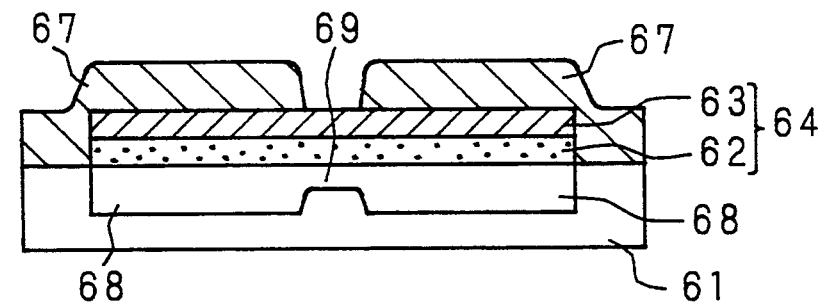
FIG. 34(d) is a cross-sectional view showing a fabrication processing step for the GaAs FET according to Embodiment 13.
Figure 34E:
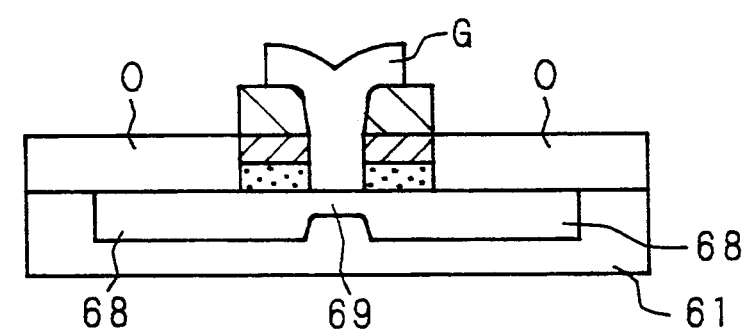
FIG. 34(e) is a cross-sectional view showing a fabrication processing step for the GaAs FET according to Embodiment 13.

In this condition, heat treatment is performed at 880° C. for 5 seconds; in the regions below the portions of the diffusion source 64 that are covered with the SiN film 67, Si atoms are sufficiently diffused into the GaAs substrate 61, forming a low-resistance conductive layer 68 (sheet resistance 250 $\Omega/\Box$), while in the region below the portion not covered with the SiN film 67, diffusion does not proceed sufficiently, and as a result, a high-resistance conductive layer 69 (800 $\Omega/\Box$) is formed (FIG. 34(d)). Next, the portion of the diffusion source 64 over the conductive layer 69 is etched away, a gate electrode G is formed in self-aligned fashion, the portions of the diffusion source 64 where ohmic electrodes are to be formed over the conductive layer 68 are etched away, and finally, the ohmic electrodes O are formed, to complete the fabrication of the FET shown in FIG. 34(e). In this example of Embodiment 13, two different kinds of conductive layers can be formed in a single heat treatment.

EXAMPLE 2

FIG. 35 shows diagrams for explaining a fabrication process for an E-mode and a D-mode FET according to Example 2 of Embodiment 13. First, as shown in FIG. 35(a), a diffusion source 64 consisting of an SiOx film 62 and an SiN film 63 is formed, in the same manner as in the foregoing example, over the regions of a GaAs semi-insulative substrate 61 where the E-mode and D-mode FETs are to be formed. Then, an SiN film 67 is formed everywhere except where gate electrodes are to be formed.

Figure 35A:
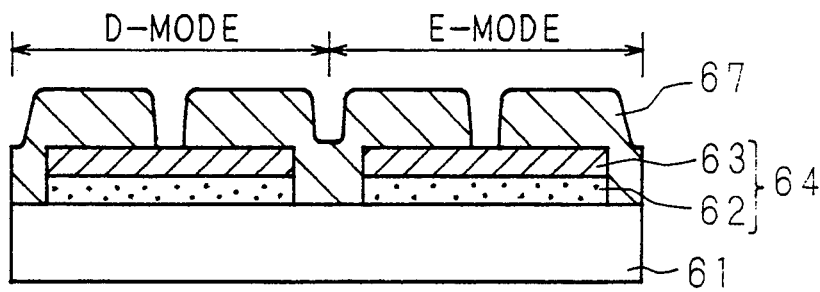
FIG. 35(a) is a cross-sectional view showing a fabrication processing step for an E-mode and a D-mode FET according to Embodiment 13.
Figure 35B:
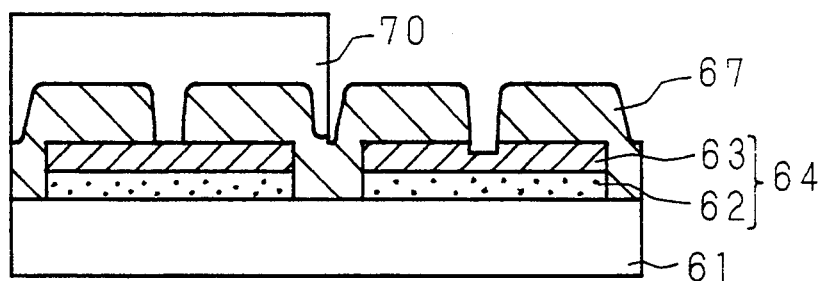
FIG. 35(b) is a cross-sectional view showing a fabrication processing step for the E-mode and D-mode FETs according to Embodiment 13.
Figure 35C:
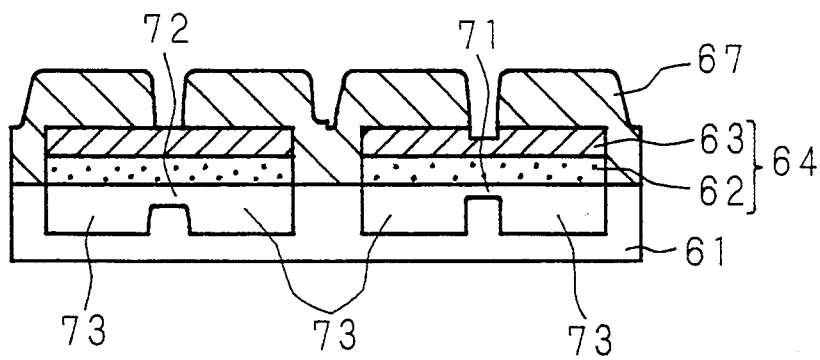
FIG. 35(c) is a cross-sectional view showing a fabrication processing step for the E-mode and D-mode FETs according to Embodiment 13.
Figure 35D:
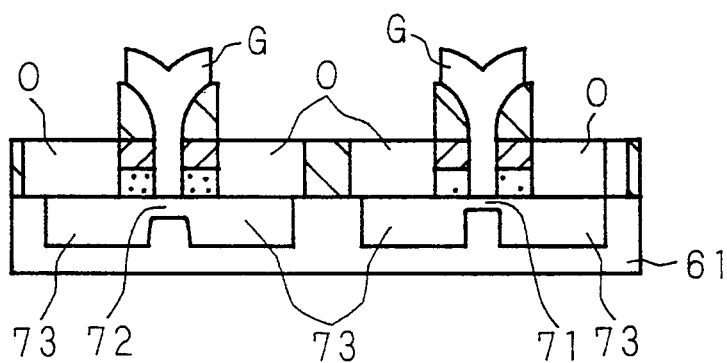
FIG. 35(d) is a cross-sectional view showing a fabrication processing step for the E-mode and D-mode FETs according to Embodiment 13.

Next, a resist 70 is applied to cover the region where the D-mode FET is to be formed, and the portion of the SiN film 63 exposed in the E-mode FET region is etched to a depth of 20 Å using buffered hydrofluoric acid (FIG. 35(b)). After removing the resist. 70, heat treatment is performed at 880° C. for 5 seconds; in the portion where the SiN film 63 is partially etched off, the diffusion of the Si atoms is suppressed most, resulting in the formation of a high-resistance conductive layer 71 (3000 $\Omega/\Box$). In the D-mode FET region, on the other hand, a conductive layer 72 having a slightly lower resistance than the conductive layer 71 is formed in the portion not covered by the SiN film 67, while in the portion covered by the SiN film 67, a conductive layer 73 is formed which has an even lower resistance (250 $\Omega/\Box$) (FIG. 35(c)).

After that, the diffusion source 64 and the SiN film 67 are removed everywhere except at the boundaries between the conductive layers and between the devices, and a gate electrode G is formed on each of the conductive layers 71 and 72, followed by the formation of ohmic electrodes O over the conductive layers 73. Thus, the D-mode FET in which conduction takes place with zero gate bias and the E-mode FET in which conduction does not occur with zero gate bias are formed simultaneously.

EXAMPLE 3

FIG. 36 shows diagrams for explaining a fabrication process sequence for an AlGaAs/GaAs modulation-doped FET according to Example 3 of Embodiment 13. First, after forming an undoped AlGaAs layer 74 (Al composition ratio 0.22) on a semi-insulative GaAs substrate 61, as shown in FIG. 36(a), a diffusion source 64 consisting of an SiOx film 62 and an SiN film 63 are formed using the same conditions as first described. Then, a resist 75 is applied over an area where a conductive layer is to be formed, and the portions of the diffusion source 64 that are not covered by the resist 75 are removed.

Figure 36A:
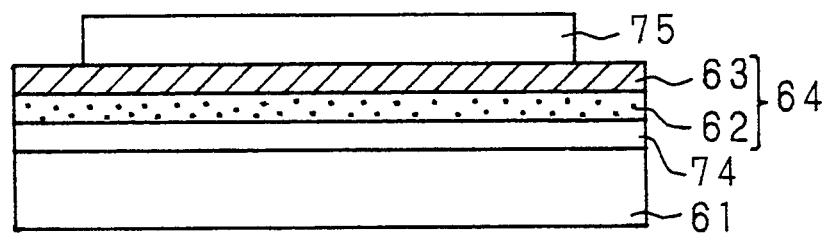
FIG. 36(a) is a cross-sectional view showing a fabrication processing step for a modulation-doped FET according to Embodiment 13.
Figure 36B:
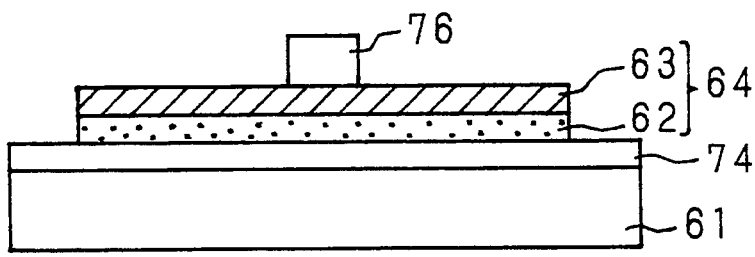
FIG. 36(b) is a cross-sectional view showing a fabrication processing step for the modulation-doped FET according to Embodiment 13.
Figure 36C:
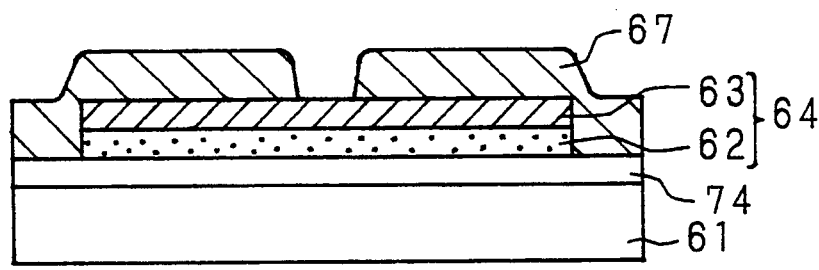
FIG. 36(c) is a cross-sectional view showing a fabrication processing step for the modulation-doped FET according to Embodiment 13.

After removing the resist 75, a resist 76 is formed as a dummy gate at a position where a gate electrode is to be formed (FIG. 36(b)). Next, using an ECR-CVD technique, an SiN film 67, which can be formed at room temperatures, is deposited over the entire surface using the same conditions as first described; thereafter, the resist 76 is removed by lift-off to form an inverted pattern (FIG. 36(c)).

Figure 36D:
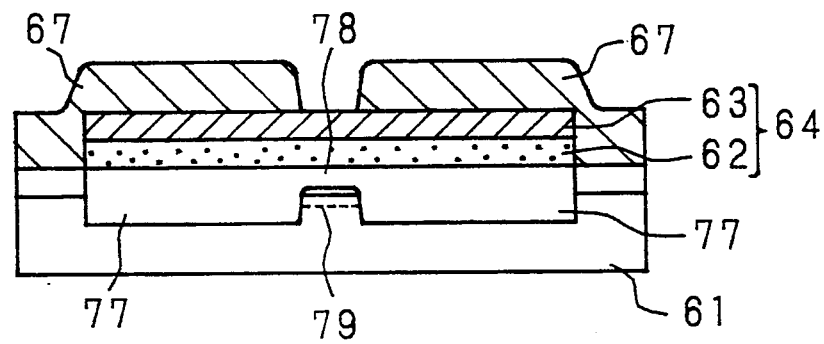
FIG. 36(d) is a cross-sectional view showing a fabrication processing step for the modulation-doped FET according to Embodiment 13.
Figure 36E:
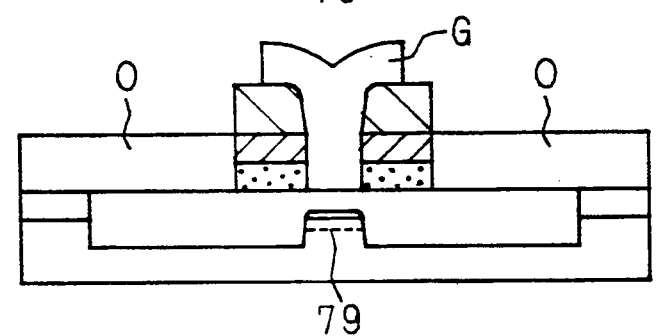
FIG. 36(e) is a cross-sectional view showing a fabrication processing step for the modulation-doped FET according to Embodiment 13.

In this condition, heat treatment is performed at 880° C. for 5 seconds; in the regions below the portions of the diffusion source 64 that are covered with the SiN film 67, Si atoms are sufficiently diffused through the AlGaAs layer 74 into the GaAs substrate 61 (diffusion depth 1500Å), forming a low-resistance conductive layer 77 (sheet resistance 250 $\Omega/\Box$), while in the region below the portion not covered with the SiN film 67, Si atoms are diffused halfway through the AlGaAs layer 74 (diffusion depth 400 Å), and this AlGaAs diffusion doped layer 78 becomes an electron supply layer, as a result, a two-dimensional electron gas layer 79 (1200 Ω/□) is formed on the GaAs layer side of the AlGaAs/GaAs interface, thus forming a modulation-doped structure (FIG. 36(d)). Next, the portion of the diffusion source 64 over the conductive layer 78 is etched away, a gate electrode G is formed in self-aligned fashion, the portions of the diffusion source 64 where ohmic electrodes are to be formed over the conductive layer 68 are etched away, and finally, the ohmic electrodes O are formed, to complete the fabrication of the modulation-doped FET shown in FIG. 36(e). In this example of Embodiment 13, a modulation-doped FET can be fabricated, requiring only a single step of heat treatment.

EXAMPLE 4

FIG. 37 shows diagrams for explaining a fabrication process sequence for an E-mode and a D-mode AlGaAs/GaAs modulation-doped FET according to Example 4 of Embodiment 13. First, after forming an undoped AlGaAs layer 74 on a semi-insulative GaAs substrate 61, as shown in FIG. 37(a), a diffusion source 64 consisting of an SiOx film 62 and an SiN film 63 is formed, using the same conditions as first described, over a region where a conductive layer is to be formed. Then, an SiN film 67 is formed everywhere except where gate electrodes are to be formed.

Figure 37A:
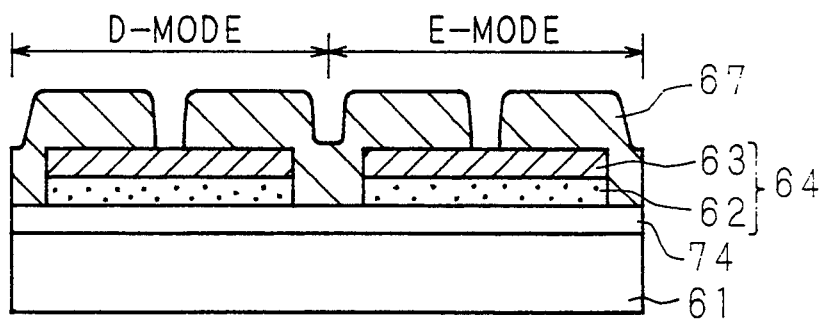
FIG. 37(a) is a cross-sectional view showing a fabrication processing step for an E-mode and a D-mode modulation-doped FET according to Embodiment 13.
Figure 37B:
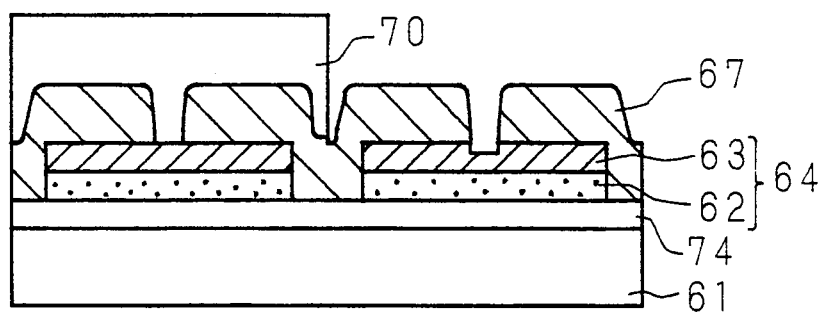
FIG. 37(b) is a cross-sectional view showing a fabrication processing step for the E-mode and D-mode modulation-doped FETs according to Embodiment 13.
Figure 37C:
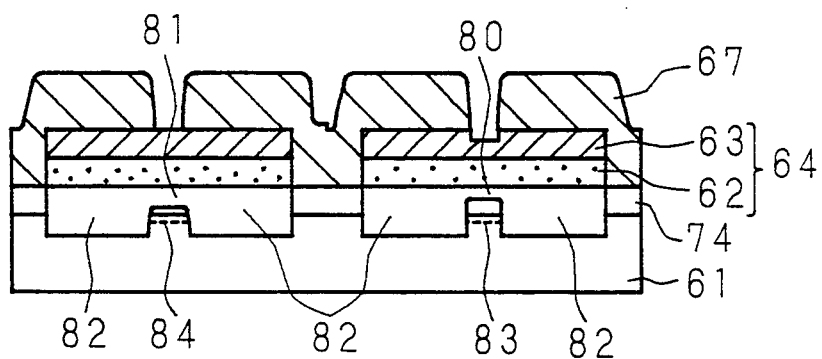
FIG. 37(c) is a cross-sectional view showing a fabrication processing step for the E-mode and D-mode modulation-doped FETs according to Embodiment 13.
Figure 37D:
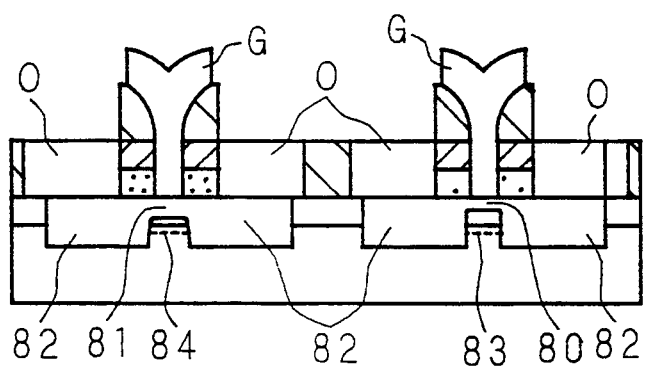
FIG. 37(d) is a cross-sectional view showing a fabrication processing step for the E-mode and D-mode modulation-doped FETs according to Embodiment 13.

Next, a resist 70 is applied to cover the region where the D-mode modulation-doped FET is to be formed, and the portion of the SiN film 63 exposed in the E-mode modulation-doped FET region is etched to a depth of 20 Å using buffered hydrofluoric acid (FIG. 37(b)). After removing the resist 70, heat treatment is performed at 880° C. for 5 seconds; in the portion where the SiN film 63 is partially etched off, an AlGaAs diffusion doped layer 80 in which diffusion of the Si atoms is suppressed most (diffusion depth 200 Å) is formed, as shown in FIG. 37(c). In the D-mode modulation-doped FET region, an AlGaAs diffusion doped layer 81 having a slightly larger diffusion depth than the diffusion doped layer 80 is formed (diffusion depth 400 Å) below the portion not covered by the SiN film 67, and two-dimensional electron gas layers 83 (5000 Ω/□) and 84 (1200 Ω/□) are formed respectively on the GaAs layer side of the AlGaAs/GaAs interface. The two-dimensional electron gas layer 84 has a smaller carrier concentration than that in the two-dimensional electron gas layer 83. Furthermore, conductive layers 82 having an even lower resistance (250 Ω/□) are formed below the portions covered by the SiN film 67.

After that, the diffusion source 64 and the SiN film 67 are removed everywhere except at the boundaries between the conductive layers and between the devices, and a gate electrode G is formed on each of the conductive layers 80 and 81, followed by the formation of ohmic electrodes O over the conductive layers 82. Thus, the D-mode modulation-doped FET in which conduction takes place with zero gate bias and the E-mode modulation-doped FET in which conduction does not occur with zero gate bias are formed simultaneously (FIG. 37(d)).

In the above described embodiment, AlGaAs/GaAs is used as the heterojunction layer, but it will be appreciated that other types of heterojunction layer consisting of a wide-gap semiconductor layer and a narrow-gap semiconductor layer, both Group III-V compound semiconductors, may be used as well.

In Embodiment 13, since the thickness of the Group V atom diffusion stop film is controlled using the doping method described above, semiconductor integrated circuit devices having different resistivities can be fabricated with a single heat treatment and without using expensive ion implantation equipment, thus reducing the manufacturing costs.

EMBODIMENT 14

The diffusion coefficient Dp of Si in the doped layer formed by the doping technique of the invention is $D_p = 0.0216 \exp(-2.19 \text{ eV}/kT)$ (k: Boltzmann constant). In a low-temperature heat treatment, for example, at about 620° C., the diffusion coefficient is $1 \times 10^{-14} \text{cm}^2/\text{sec}$, which indicates that diffusion can be made even at such a low temperature. On the other hand, the diffusion coefficient of Si in an Si-doped layer formed by MBE or by ion implantation is one digit smaller than the above, which means that a very high temperature is needed for rediffusion. Therefore, it has not been possible to control the device characteristics by rediffusion. Embodiment 14 is concerned with a technique that can be utilized when the doped layer formed in accordance with the invention is used as a channel layer in a MESFET or as an electron supply layer in a high electron mobility transistor (HEMT). According to the method of Embodiment 14 hereinafter described, when the current value and the threshold voltage of a completed FET fall short of the desired values, a second heat treatment is performed to modify the doping profile in the channel region, thereby increasing these values to the desired levels.

EXAMPLE 1

Figure 38:
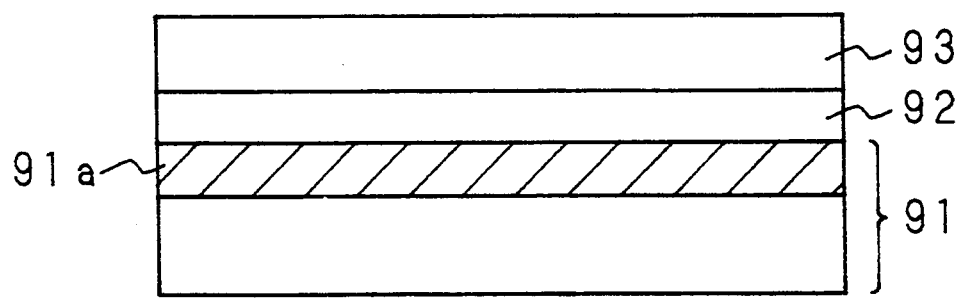
FIG. 38 is a diagram showing a cross-sectional structure during the process of forming an Si-doped layer according to Embodiment 14.

FIG. 38 is a diagram showing a cross-sectional structure during the process of forming an Si-doped layer according to Example 1 of Embodiment 14. As shown in FIG. 38, an undoped SiOx film (x<2) 92 and an overlying SiN film 93, which acts as a Group V atom diffusion stop film, are successively formed by P-CVD on a GaAs substrate 9 which is a Group III-V compound semiconductor. The film deposition conditions are as follows:

SiOx film: SiH$_4$ 10 sccm, N$_2$O 20 sccm; Substrate temperature 300° C.; RF power 150 W SiN film: SiH$_4$ 15 sccm, NH$_3$ 200 sccm; Substrate temperature 300° C.; RF power 250 W Thereafter, a first heat treatment is performed by lamp heating at 880° C. for 5 seconds, to diffuse Si to form a doped layer 91a in the GaAs substrate 91. The Si diffusion is accomplished with the Si migrating into the Ga vacancies created in the GaAs substrate 91 by heat treatment, as described previously.

Next, the SiOx film 92 and the SiN film 93 are removed, and a second heat treatment is performed. Usually, for a doped layer formed in a Group III-V compound semiconductor substrate by crystal growth or ion implantation techniques, the diffusion coefficient is in the range of $1 \times 10^{-15}$ to $2 \times 10^{-14}$ cm$^2$/sec in a heat treatment at 850° C., which means that the diffusion of a doped layer by heat treatment requires a long heat treatment time at such a high temperature. However, in the case of the doped layer formed by first depositing successively the undoped SiOx film and SiN film on a Group III-V compound semiconductor, for example, on a GaAs substrate, and then performing heat treatment to diffuse Si, the Si atoms ($Si_{Ga}$) occupying Group III sites are diffused with each Si atom being paired with the nearest Ga vacancy ($V_{Ga}$) by the coulomb force, and therefore, the diffusion coefficient Dp of the ($Si_{Ga}$-$V_{Ga}$) pair is larger than the diffusion coefficient of the Si alone, giving the value first mentioned and thus allowing diffusion at the first mentioned temperature.

Figure 39:
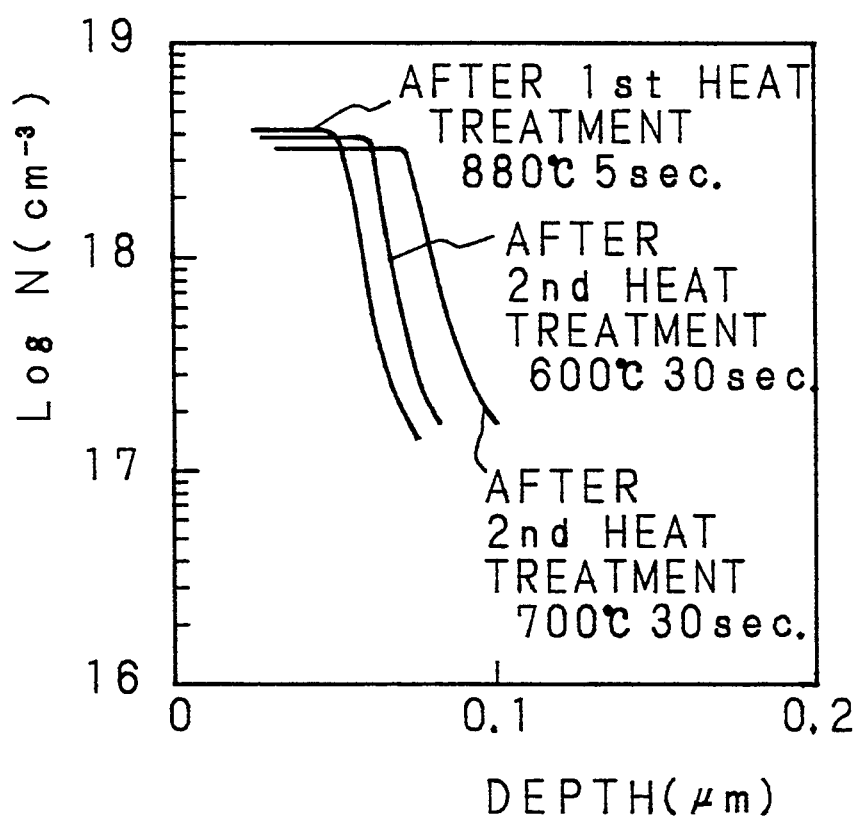
FIG. 39 is a graph showing carrier concentrations measured after a second heat treatment according to Embodiment 14.

FIG. 39 is a graph showing the relationship between the depth of the doped layer 91a and the carrier concentration, after the first heat treatment and after the additional second heat treatment, respectively. The carrier concentration is plotted along the ordinate, and the depth of the doped layer along the abscissa. The second heat treatment was performed using two different conditions, i.e. at 600° C. for 30 seconds and at 700° C. for 30 seconds. It can be seen from FIG. 39 that the carrier concentration decreased slightly and the thickness of the doped layer increased after the second heat treatment as compared with the corresponding values obtained after the first heat treatment; this indicates that Si was diffused further into deeper positions by the second heat treatment. It is also shown that the difference in the conditions of the second heat treatment results in different degrees of Si diffusion, which means that the depth of the doped layer 91a can be controlled by varying the heat treatment conditions.

EXAMPLE 2

We will now describe an FET, according to Example 2 of Embodiment 14, in which the doped layer formed by the Si diffusion in accordance with the invention is used as a channel layer. FIG. 40 shows schematic cross-sectional views illustrating the structure of a MESFET during a fabrication process according to Example 2. An undoped SiOx film (x<2) 92 and an overlying SiN film 93 are successively formed by plasma CVD on a GaAs substrate 91 which is a Group III-V compound semiconductor. The film deposition conditions are the same as first described. Thereafter, a first heat treatment is performed by lamp heating at 860° C. for 5 seconds, to form a doped layer 91a which will subsequently be formed as a channel layer. After that, the SiOx film 92 and the SiN film 93 are removed. At this time, the thickness of the doped layer 91a is 450 Å, and the carrier concentration is about $2 \times 10^{18} cm^{-3}$. Next, as shown in FIG. 40(a), a gate electrode of WSi, with gate length of 0.5 μm and gate width of 20 μm, is formed on the doped layer 91a, and a source electrode 95 and a drain electrode 96, both of Ni/Si/W, are formed on opposite sides of the gate electrode 94.

Figure 40A:
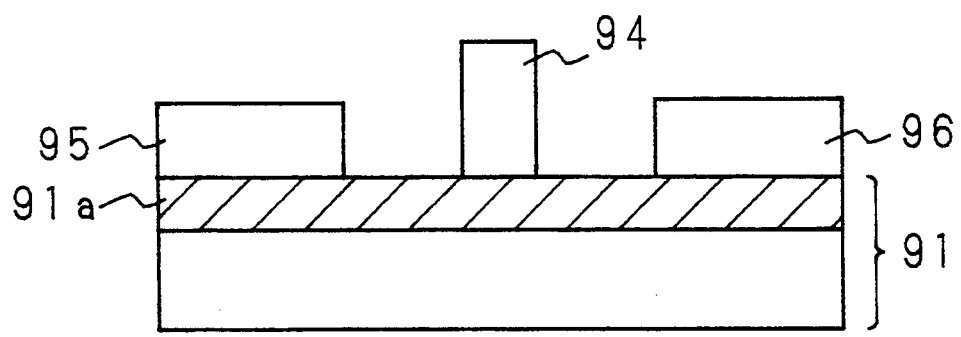
FIG. 40(a) is a cross-sectional view showing the structure of a MESFET at a manufacturing stage according to Embodiment 14.
Figure 40B:
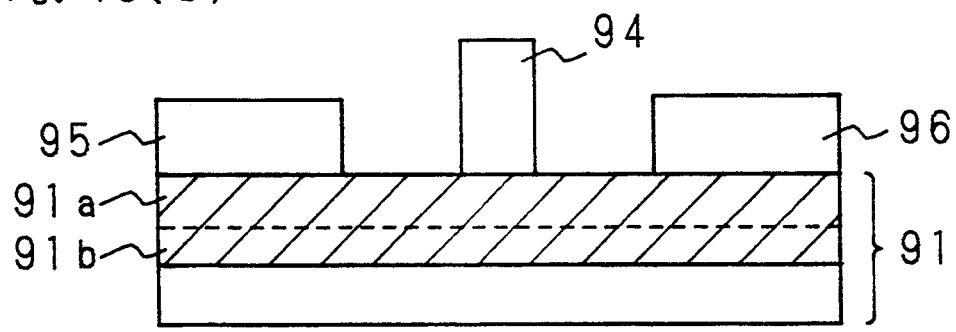
FIG. 40(b) is a cross-sectional view showing the structure of the MESFET at a manufacturing stage according to Embodiment 14.

The thus formed MESFET structure shown in FIG. 40(a) is subjected to a second heat treatment at 600° C. for 45 seconds by lamp heating. With this heat treatment, Si in the doped layer 91a is diffused into deeper positions in the GaAs substrate 91, as shown in FIG. 40(b), forming a doped layer 91b and hence, a combined doped layer (91a+91b) with increased thickness.

The DC characteristics, i.e. the drain current value Idss with zero gate voltage and the threshold voltage Vth, of the MESFET were measured for comparison before and after the second heat treatment. Table 3 shows the results of the comparison. As can be seen from Table 3, the drain current value Idss and the threshold voltage −Vth can be increased by performing the second heat treatment.

TABLE 3

| Heat treatment (number of times) | Idss(mA) | Vth(mV) |
| --- | --- | --- |
| 1 | 2.5 | −288 |
| 2 | 3.5 | −380 |

As described, when the drain current value Idss and the threshold voltage −Vth of the completed MESFET fall short of the desired values, the second heat treatment is performed to increase them to the desired values.

EXAMPLE 3

Figure 41A:
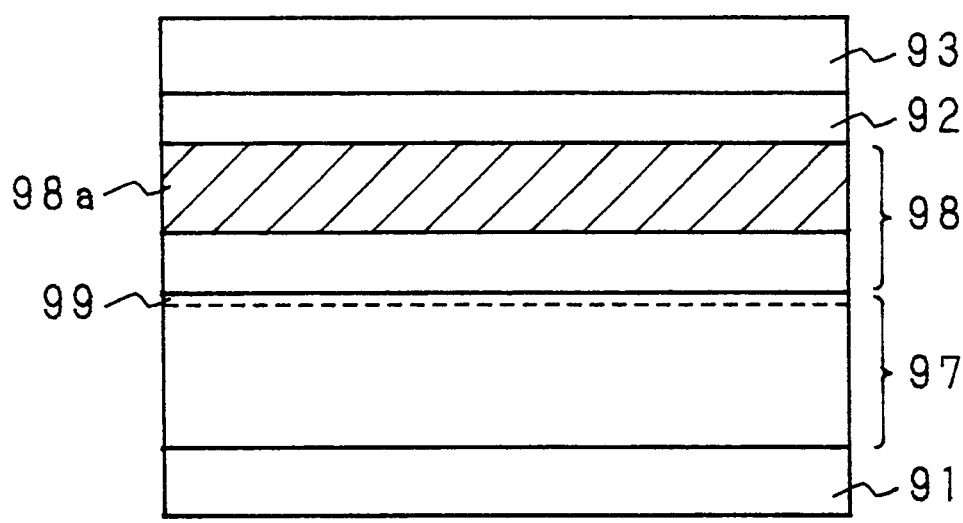
FIG. 41(a) is a cross-sectional view showing the structure of a modulation-doped transistor during a manufacturing process according to Embodiment 14.

Next, we will describe in detail a modulation-doped transistor, according to Example 3 of Embodiment 14, in which the doped layer formed in accordance with the invention is used as an electron supply layer. FIG. 41 shows schematic cross-sectional views illustrating the structure of a modulation-doped transistor during a fabrication process according to Example 3. As shown in FIG. 41(a), a GaAs layer 97 of 8000 Å thickness and an overlying AlGaAs layer 98 of 500 Å thickness are successively formed by molecular beam epitaxy (MBE) on a GaAs substrate 91, and on top of this structure, an SiOx film 92 and an SiN film 93 are formed in this order. The film deposition conditions for the SiOx film 92 and SiN film 93 are the same as those in Example 1. Thereafter, a first heat treatment is performed by lamp heating at 840° C. for 5 seconds, to form a doped layer 98a as an electron supply layer to a depth of 400 Å below the surface of the AlGaAs layer 98 of 500 Å thickness. At this time, the carrier concentration in the doped layer 98a is about $2 \times 10^{18} cm^{-3}$. At the same time, a two-dimensional electron gas layer 99 is formed at the interface between the AlGaAs layer 98 and the GaAs layer 97.

Figure 41B:
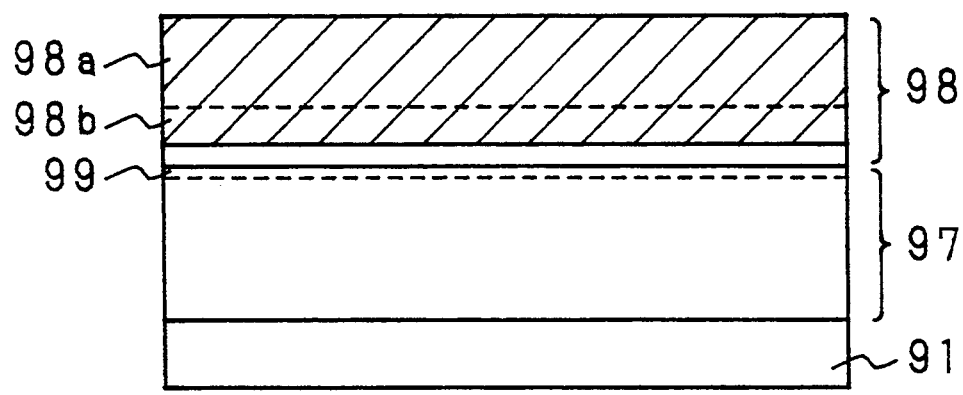
FIG. 41(b) is a cross-sectional view showing the structure of the modulation-doped transistor during a manufacturing process according to Embodiment 14.

The SiOx film 92 and the SiN film 93 are removed, and then, a second heat treatment is performed at 600° C. for 30 seconds. With this heat treatment, Si in the doped layer 98a is diffused into deeper positions in the AlGaAs layer 98, as shown in FIG. 41(b), forming a combined doped layer (98a+98b) with increased thickness.

For comparison purposes, the Hall measurement was made of the two-dimensional electron gas layer 99 formed in the above structured modulation-doped transistor before and after the second heat treatment. Table 4 shows the results of the measurements. As can be seen from Table 4, the sheet carrier concentration ($cm^{-2}$) is increased and the Hall mobility ($cm^2/Vs$) is decreased as a result of the second heat treatment. This is presumably because the doped layer (98a+98b) with increased thickness was formed as a result of the second heat treatment.

TABLE 4

| Heat treatment (number of times) | Measurement temperature(K.) | Sheet carrier concentration($cm^{-2}$) | Hall mobility ($cm^2/Vs$) |
| --- | --- | --- | --- |
| 1 | 300 | $5.07 \times 10^{11}$ | 5060 |
|   | 77 | $2.86 \times 10^{11}$ | 97500 |
| 2 | 300 | $8.82 \times 10^{11}$ | 5000 |
|   | 77 | $7.82 \times 1011$ | 30000 |

In the modulation-doped transistor having the two-dimensional electron gas layer 99, when the drain current value Idss and the threshold voltage −Vth fall short of the desired value, the second heat treatment is performed to increase the thickness of the doped layer 98a, thereby increasing these values to the desired levels.

As described above, according to Embodiment 14, when the current value and threshold voltage of a completed FET fall short of the desired value, low-temperature heat treatment is performed to further diffuse the Si present in the doped layer to increase the current value and threshold value to the desired levels. This therefore increases production yield.

EMBODIMENT 15

Embodiment 15 shows an example of a basic process for forming a two-dimensional electron gas region and a quantum wire by using the doping method of the invention.

FIG. 42 shows diagrams for explaining processing steps of building an electric conductive region. The example shown is for building a two-dimensional electric conductive region. First, as shown in FIG. 42(a), an undoped i-GaAs layer 101a and an undoped i-AlGaAs layer 101b are formed one on top of the other to build a heterojunction substrate 101. Next, a diffusion source 102 consisting of an SiOx film 102a (100 Å) and an SiN film 102b (400 Å) is formed on top of the heterojunction substrate 101 by plasma CVD. The film deposition conditions are as follows:

SiOx film: $SiH_4$ 5 sccm; $N_2O$ 25 sccm; RF power 150 W; Film deposition temperature 300° C.; Film thickness 100 Å

SiN film: $SiH_4$ 15 sccm; $NH_3$ 200 sccm; RF power 250 W; Film deposition temperature 300° C.; Film thickness 100 Å

Figure 42A:
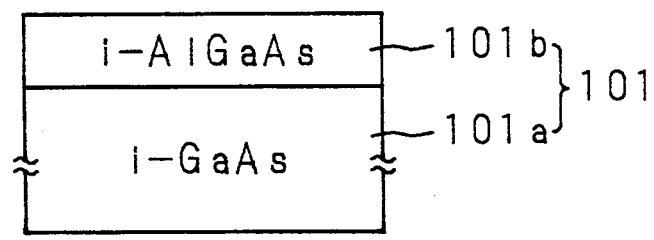
FIG. 42(a) is a cross-sectional view showing a processing step of building a electric conductive region according to Embodiment 15.
Figure 42B:
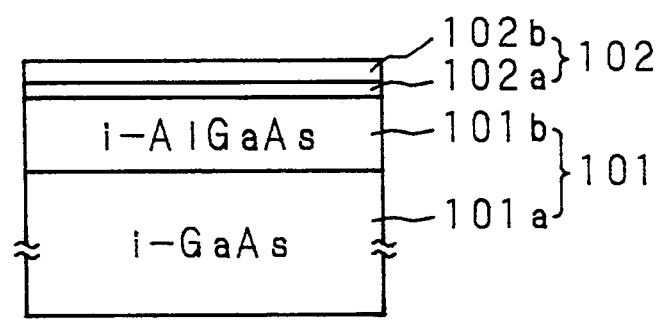
FIG. 42(b) is a cross-sectional view showing a processing step of building the electric conductive region according to Embodiment 15.
Figure 42C:
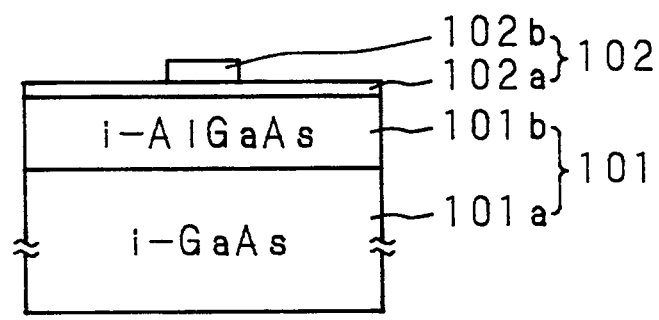
FIG. 42(c) is a cross-sectional view showing a processing step of building the electric conductive region according to Embodiment 15.
Figure 42D:
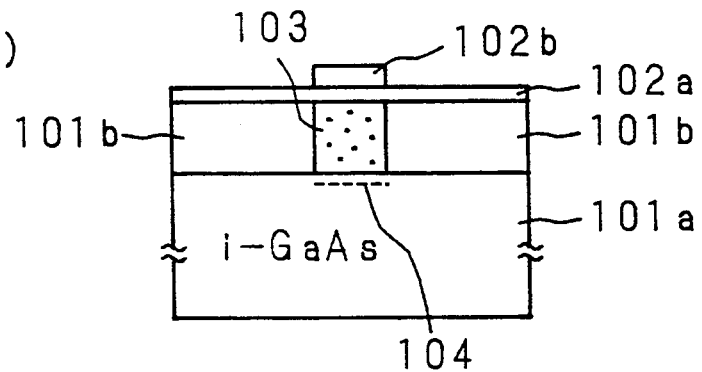
FIG. 42(d) is a cross-sectional view showing a processing step of building the electric conductive region according to Embodiment 15.

After that, the SiN film 102b is removed by plasma etching everywhere except, the desired area as shown in FIG. 42(c). The etching is performed at a power of 250 W, using a mixed gas of $CF_4$ (17 cc)+$O_2$ (3 cc) that provides a high selectivity of the SiN film 102b to the SiOx film 102a. Rapid thermal annealing is then performed, which causes exchange between Ga in the i-AlGaAs layer 101b only below the SiN film 102b and Si in the SiOx film 102a, the Si thus being diffused only into the region of the i-AlGaAs layer 101b under the SiN film 102b, forming an n-AlGaAs layer 103 in that region, as shown in FIG. 42(d). Since the electron density profile in the n-AlGaAs layer 103 is steep at the diffusion front, a modulation-doped structure is formed and a good two-dimensional electric conductive region 104 can be obtained.

Table 5 below compares the carrier mobility and sheet carrier concentration for the above two-dimensional electric conductive region with those for a two-dimensional electric conductive region obtained by a prior art method in which the conductive layer is formed over the entire surface of an insulating substrate by crystal growth.

TABLE 5

|  | Mobility($cm^2$/V.s) | | Sheet carrier concentration($cm^{-2}$) | |
| --- | --- | --- | --- | --- |
|  | 77K | 300K | 77K | 300K |
| Method of Invention | 97500 | 5400 | $4.2 \times 10^{11}$ | $5.15 \times 10^{11}$ |
| Prior Art Method | <98000 | <6000 | $<5.0 \times 10^{11}$ | $<5.5 \times 10$ |

As shown in Table 5, the two-dimensional electric conductive region of Embodiment 15 exhibits the carrier mobility and sheet carrier concentration almost equivalent to those of the widely used two-dimensional electric conductive region which is formed over the entire wafer surface. According to Embodiment 15, since the two-dimensional electric conductive region is formed in the desired position, the conductive layer need not be subjected to etching or other treatment, thus virtually eliminating the possibility of introducing defects. The resulting two-dimensional electric conductive region, therefore, has very excellent characteristics.

Figure 43:
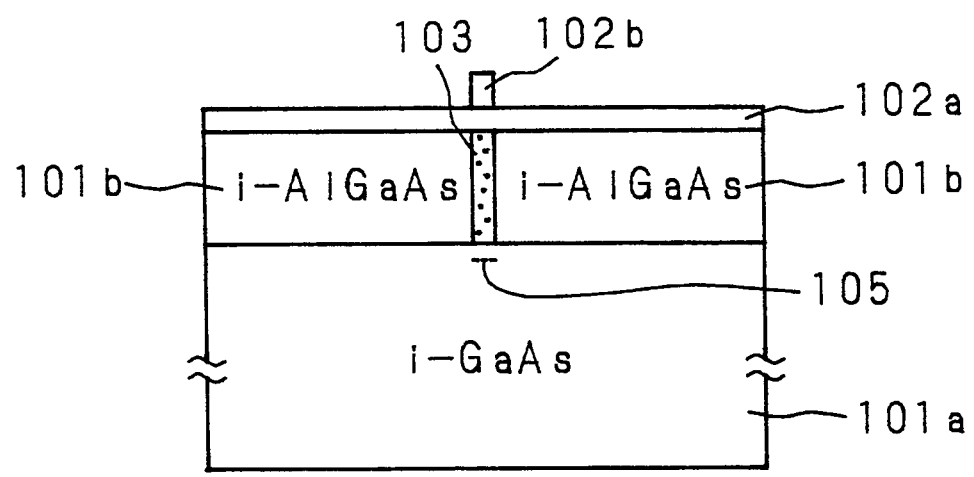
FIG. 43 is a schematic diagram showing a one dimensional electric conductive region obtained according to Embodiment 15.

FIG. 43 shows an alternative example in which, in the etching process of etching the SiN film 102b shown in FIG. 42(c), the width of the SiN film 102 is reduced to the resolution limit of the pattern, forming a one-dimensional electric conductive region in the form of a very fine line. The thus formed one-dimensional electric conductive region 105 also has very excellent characteristics.

As described above, in the method of Embodiment 15 for building an electric conductive region, an SiOx film and a Group V diffusion stop film are formed in this order on a Group III-V compound semiconductor, and then, the Group V diffusion stop film is removed everywhere except where a one-dimensional or two-dimensional electric conductive region is to be formed; after that, Si can be diffused into the desired area of the Group III-V compound semiconductor just by performing heat treatment. Furthermore, according to the above method, since the Group III-V compound semiconductor need not be subjected to etching or other treatment, no defects are introduced and a good electric conductive region can be obtained.

EMBODIMENT 16

Embodiment 16 shows examples of processes for forming a quantum wire by using the doping method of the invention.

EXAMPLE 1

FIG. 44 shows schematic cross-sectional views of a Group III-V compound semiconductor substrate at various stages of forming a quantum wire according to Example 1 of Embodiment 16. First, as shown in FIG. 44(a), a GaAs layer 112 of about 1 μm thickness, an undoped AlGaAs layer 113 of about 50 Å, an n-mode AlGaAs layer 114 of 100 Å, and an undoped AlGaAs layer 115 are formed in this order on top of a semi-insulative substrate 111, to build a Group III-V compound semiconductor substrate L of modulation-doped structure. Then, using $SiH_4$ and $NH_3$, an SiN layer of about 200 Å thickness is deposited by plasma CVD on the AlGaAs layer 115, followed by dry etching to form an SiN layer 116, which acts as an Si diffusion stop layer, over the region of the AlGaAs layer 115 in which a quantum wire is to be formed. The result is the formation of a step as shown.

Figure 44A:
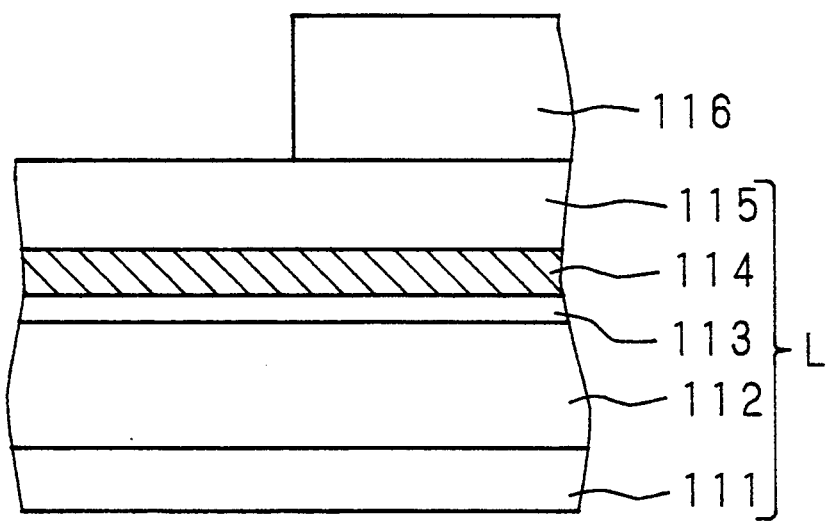
FIG. 44(a) is a cross-sectional view of a compound semiconductor at a stage of forming a quantum wire according to Example 1 of Embodiment 16.
Figure 44B:
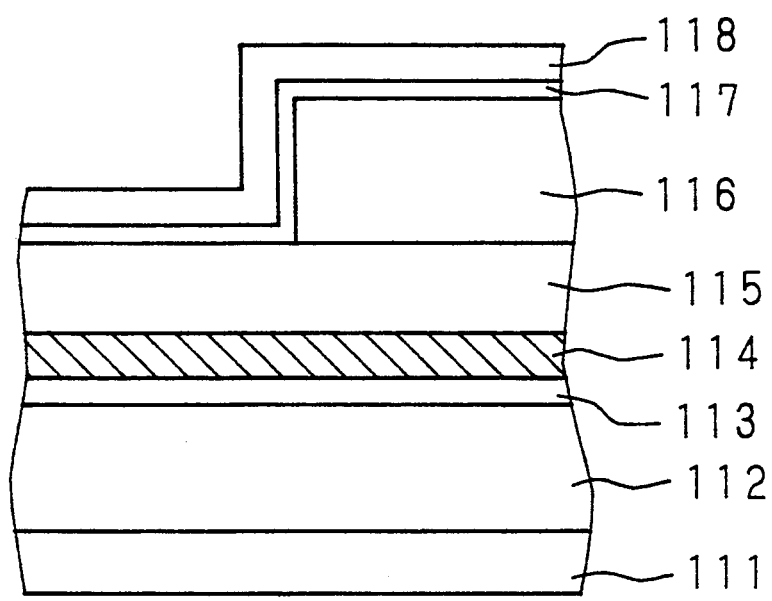
FIG. 44(b) is a cross-sectional view of the compound semiconductor at a stage of forming the quantum wire according to Example 1 of Embodiment 16.

Next, plasma CVD is performed at temperature of 300° C. with $SiH_4$ at 5 sccm and $N_2O$ at 30 sccm, to deposit a 50-Å SiOx layer 117 (x<2) over the AlGaAs layer 115 and the SiN layer 116 in such a manner as to cover the step, as shown in FIG. 44(b). Then, a 100-Å SiN layer 18, which acts as the Group V atom diffusion stop layer, is deposited over the SiOx layer 117 by plasma CVD at 300° C. with $SiH_4$ at 15 sccm and $NH_3$ at 200 sccm.

Figure 44C:
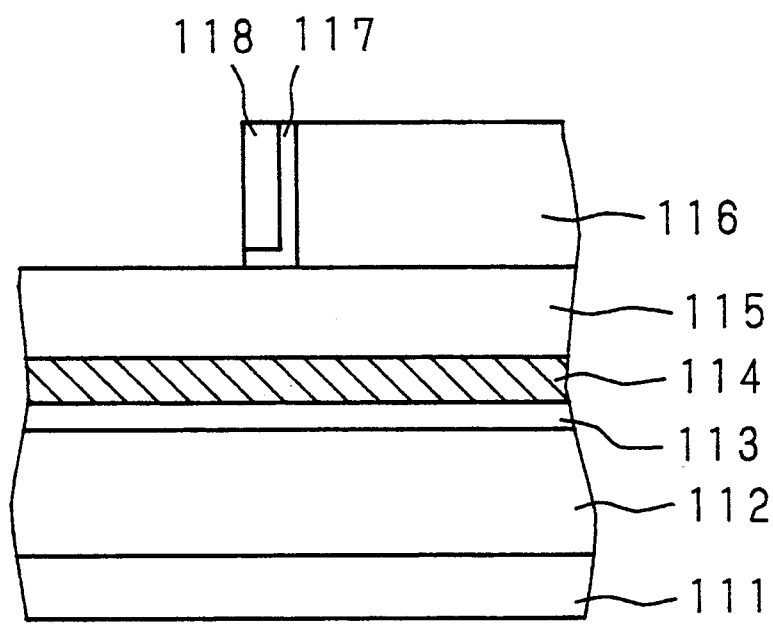
FIG. 44(c) is a cross-sectional view of the compound semiconductor at a stage of forming the quantum wire according to Example 1 of Embodiment 16.
Figure 44D:
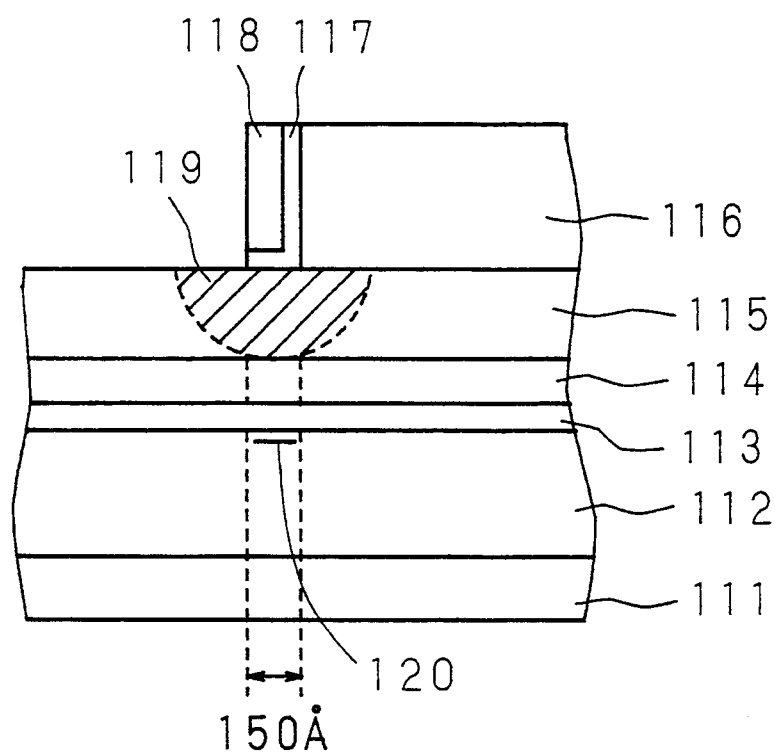
FIG. 44(d) is a cross-sectional view of the compound semiconductor at a stage of forming the quantum wire according to Example 1 of Embodiment 16.

After that, the SiOx layer 117 and the SiN layer 118 are removed everywhere except the portions thereof formed on the sidewall of the SiN layer 116, as shown in FIG. 44(c). The SiN/SiOx composite layer 118/117 formed on the sidewall acts as the diffusion source from which Si is diffused into the AlGaAs layer 115. The width of its surface contacting the AlGaAs layer 115 is 150 Å. The width of the contacting surface is controlled by adjusting the thickness of the SiN layer 118 formed on the sidewall of the SiN layer 116, and can be made very thin with good accuracy.

The thus fabricated substrate is then subjected to heat treatment. With this heat treatment, Al, a Group III element in the AlGaAs layer 115, is diffused outside, leaving vacancies in the AlGaAs layer 115. Si, the Group IV element in the SiOx layer 117, is diffused into these vacancies. Diffusion of As, the Group V element in the AlGaAs layer 115, is suppressed by the presence of the SiN layer 118. When the Si is diffused in this manner, no crystal defects are caused in the substrate.

With the heat treatment at 880° C. for 5 seconds, Si atoms of about $1 \times 10^{18} cm^{-3}$ are diffused to a depth of about 200 Å into the 150-Å region of the AlGaAs layer 115 directly below the SiN/SiOx diffusion layer 118/117, forming a diffused area 119. As a result, carriers of line concentration of about $10^6 cm^{-1}$ are generated, thus forming a quantum wire 120 of 150-Å channel width.

The thus formed quantum wire is free from crystal defects, and its channel width can be made very thin with good accuracy by controlling the thickness of the SiN layer 118.

EXAMPLE 2

FIG. 45 shows schematic cross-sectional views of a Group III-V compound semiconductor substrate at various stages of forming a quantum wire according to Example 2 of Embodiment 16. As shown in FIG. 45(a), the structure of this example is identical to that of the compound semiconductor substrate of Example 1, except that the AlGaAs layer 115 in the modulation-doped Group III-V compound semiconductor substrate L has a stepped portion. In FIG. 45, the same reference numerals are used as those in FIG. 44, and their descriptions are omitted herein. Using SiH4 and NH3, an SiN layer 116 of about 200 Å thickness, which acts as an Si diffusion stop layer, is deposited over the Group III-V compound semiconductor substrate by plasma CVD.

Figure 45A:
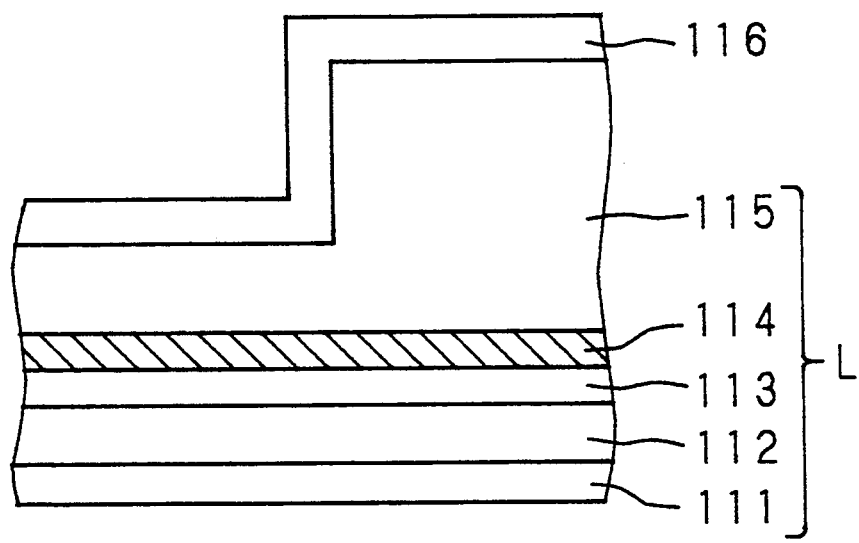
FIG. 45(a) is a cross-sectional view of a compound semiconductor at a stage of forming a quantum wire according to Example 2 of Embodiment 16.
Figure 45B:
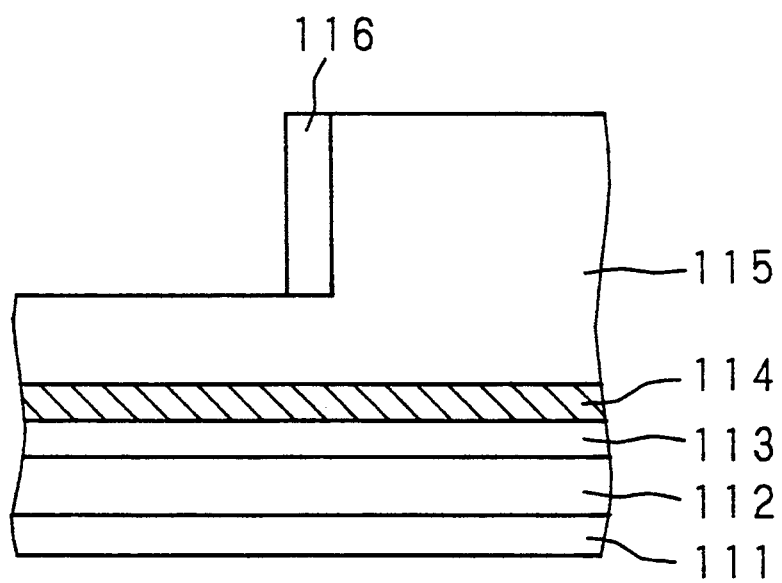
FIG. 45(b) is a cross-sectional view of the compound semiconductor at a stage of forming the quantum wire according to Example 2 of Embodiment 16.
Figure 45C:
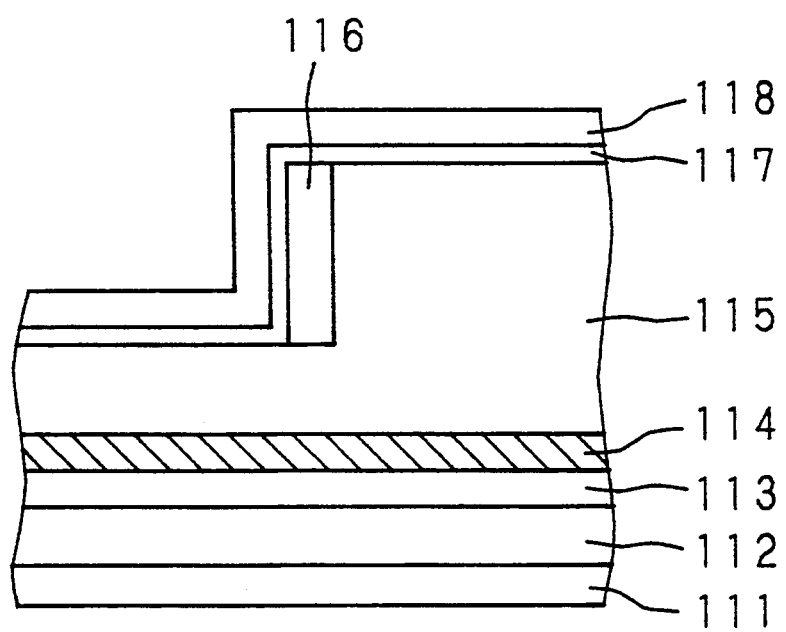
FIG. 45(c) is a cross-sectional view of the compound semiconductor at a stage of forming the quantum wire according to Example 2 of Embodiment 16.
Figure 45D:
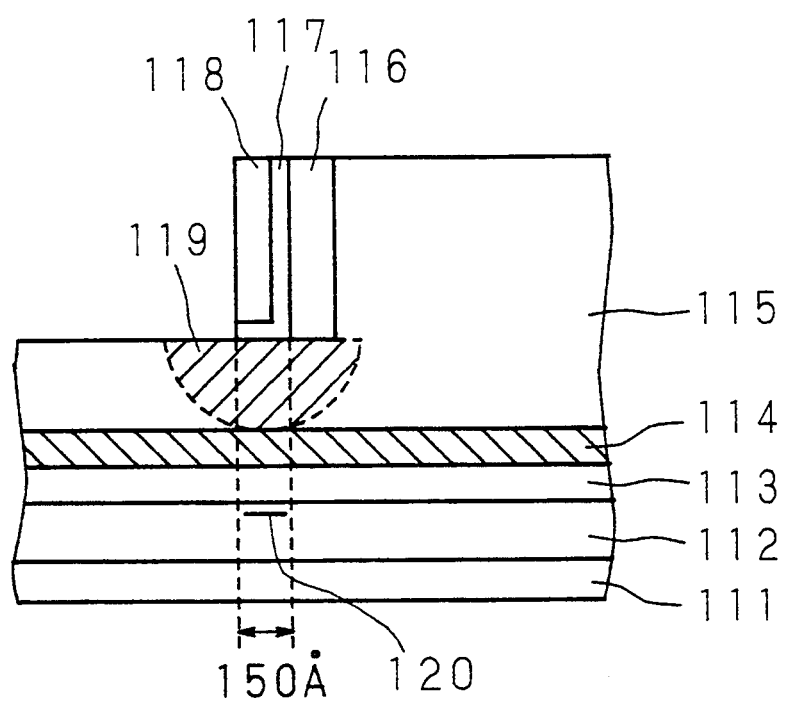
FIG. 45(d) is a cross-sectional view of the compound semiconductor at a stage of forming the quantum wire according to Example 2 of Embodiment 16.

Then, as shown in FIG. 45(b), the SiN layer 116 is removed by dry etching, leaving only the portion thereof formed on the sidewall of the stepped portion of the AlGaAs layer 115. Next, as shown in FIGS. 45(c) and (d), a 50-Å SiOx layer 117 (x<2) and a 100-Å SiN layer 118, which acts as the Group V atom diffusion stop layer, are deposited using the same conditions as in Example 1. Then, by performing heat treatment at 880° C. for 5 seconds, a diffused area 119 is formed in the AlGaAs layer 115, thus forming a quantum wire 120 having a channel width of 150 Å.

As described above, the quantum wire thus formed in the stepped compound semiconductor substrate is free from crystal defects, and its channel width can be made very thin with good accuracy by controlling the thickness of the SiN layer 118.

EXAMPLE 3

Figure 46:
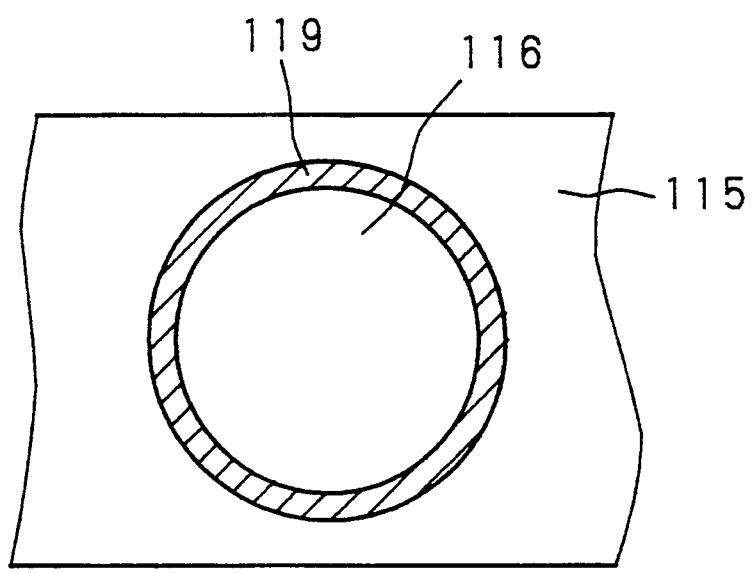
FIG. 46 is a plan view of a compound semiconductor substrate with a quantum wire formed therein according to Example 3 of Embodiment 16.

FIG. 46 is a schematic plan view of a compound semiconductor substrate with a quantum wire formed therein according to Example 3 of Embodiment 16. An SiN layer 116, which acts as an Si diffusion stop layer, is deposited in a disc-like form on an AlGaAs layer 115, thus forming a step. Then, an SiOx layer (x<2) and an SiN layer, a Group V atom diffusion stop layer, are formed around the sidewall of the step, followed by heat treatment to form a diffused area 119 as shown in FIG. 46. By thus depositing the SiN layer 116 in a disc-like form, an annular quantum wire can be formed. Since the diffused area 119 is formed along the sidewall of the SiN layer 116, the quantum wire can be formed in a desired shape.

As described above, in the quantum wire forming method of Embodiment 16, vacancies are created in the Group III-V compound semiconductor substrate, and Si is diffused to fill the vacancies; thus, the quantum wire can be formed without causing crystal defects. Furthermore, since the channel width within which the Si is diffused is determined by controlling the thickness of the diffused layer formed on the Group III-V compound semiconductor substrate, the channel width can be made very thin with good accuracy. Moreover, the quantum wire is formed along the sidewall of the Si diffusion stop layer that forms the step; this arrangement eliminates limitations on the shape of the quantum wire.

EMBODIMENT 17

Embodiment 17 shows examples of processes for forming a quantum wire by using the doping method of the invention, as in Embodiment 16.

EXAMPLE 1

FIG. 47 shows schematic cross-sectional views of a substrate, illustrating various stages of forming a quantum wire according to Example 1 of Embodiment 17. As shown in FIG. 47(a), a GaAs layer 121 and an AlGaAs layer 122, both Group III-V compound semiconductors, form a heterojunction substrate. As shown in FIG. 47(b), a 100-Å SiOx layer 123 (x<2) is deposited over the GaAs layer 121 and the AlGaAs layer 122 by plasma CVD at a deposition temperature of 300° C. with SiH4 at 5 sccm and N2O at 25 sccm, and on top of that, a 400-Å SiN layer 124, which acts as the Group V atom diffusion stop layer, is deposited by plasma CVD at a deposition temperature of 300° C. with SiH4 at 15 sccm and NH3 at 200 sccm.

Figure 47A:
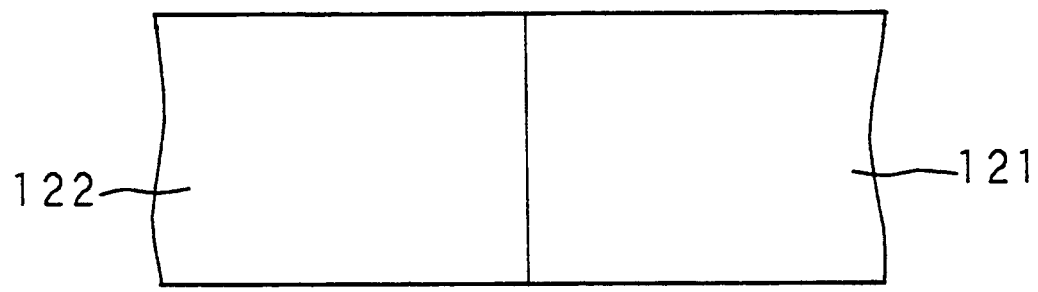
FIG. 47(a) is a cross-sectional view of a substrate at a stage of forming a quantum wire according to Example 1 of Embodiment 17.
Figure 47B:
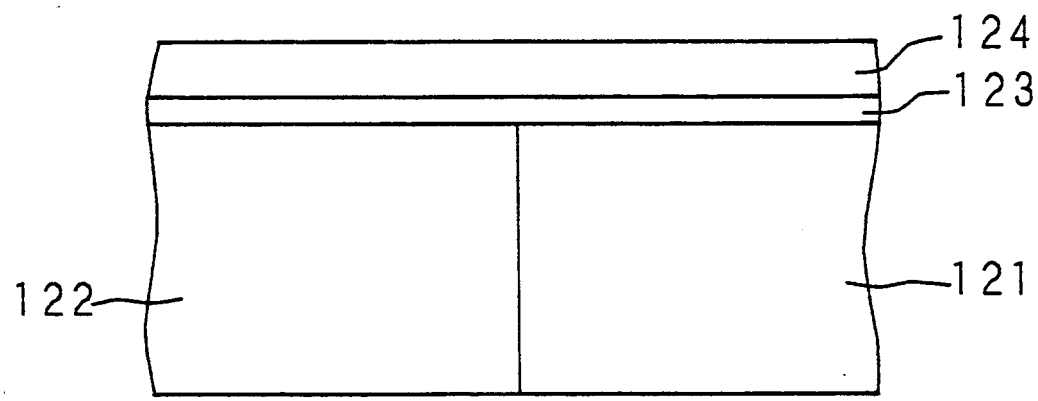
FIG. 47(b) is a cross-sectional view of the substrate at a stage of forming the quantum wire according to Example 1 of Embodiment 17.
Figure 47C:
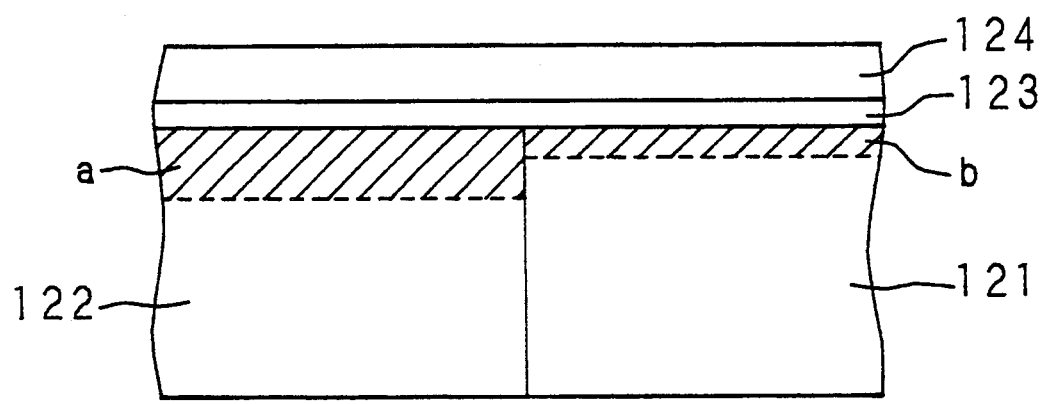
FIG. 47(c) is a cross-sectional view of the substrate at a stage of forming the quantum wire according to Example 1 of Embodiment 17.
Figure 47D:
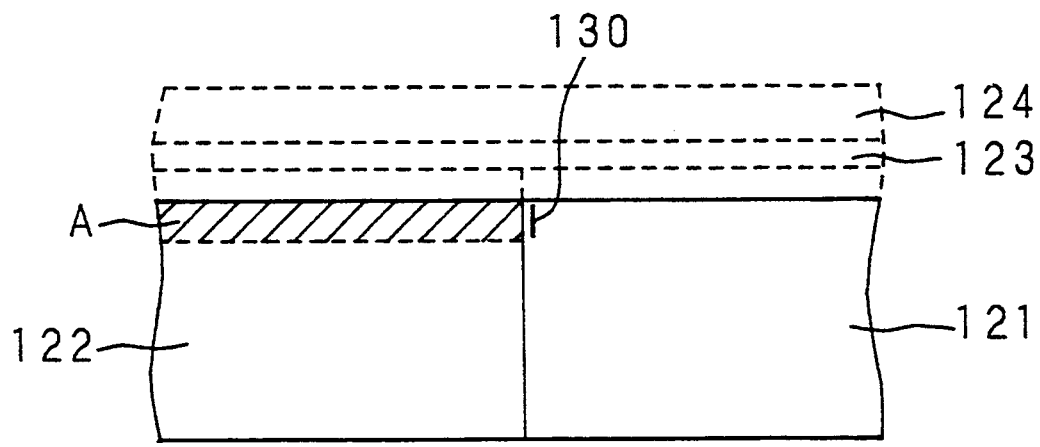
FIG. 47(d) is a cross-sectional view of the substrate at a stage of forming the quantum wire according to Example 1 of Embodiment 17.

Next, heat treatment is performed at 880° C. for 5 seconds, as a result of which a diffused area a of 800 Å depth and a diffused area b of 600 Å depth are formed in the AlGaAs layer 122 and the GaAs layer 121, respectively, as shown in FIG. 47(c). As described, there is a difference in Si diffusion depth between the GaAs layer 121 and the AlGaAs layer 122. Dry etching is then performed to remove the SiN layer 124 and the SiOx layer 123 and etch the GaAs layer 121 and the AlGaAs layer 122 to the same depth as the diffused area b, as shown in FIG. 47(d). As a result, the AlGaAs layer 122 is left with a diffused area A with Si diffused to a depth of 200 Å, so that a one-dimensional electron gas is created at the junction between the GaAs layer 121 and the AlGaAs layer 122 near the diffused area A, forming a quantum wire 130 with a channel width of 200 Å. In this manner, a quantum wire with a very fine and accurate channel width can be formed without introducing crystal defects.

EXAMPLE 2

FIG. 48 shows schematic cross-sectional views of a substrate, illustrating various stages of forming a quantum wire according to Example 2 of Embodiment 17. As shown in FIG. 48(a), an AlGaAs layer 122 is deposited on a stepped GaAs layer 121, a Group III-V compound semiconductor, thus forming a heterojunction structure, the heterojunction being perpendicular to the sidewall of the stepped portion. As shown in FIG. 48(b), a 100-Å SiOx film 123 (x<2) is deposited over the surfaces of the GaAs layer 121 and AlGaAs layer 122 by plasma CVD at a deposition temperature of 300° C. with SiH$_4$ at 5 sccm and N$_2$O at 25 sccm, and on top of that, a 400-Å SiN layer 124, which acts as the Group V atom diffusion stop layer, is deposited by plasma CVD at a deposition temperature of 300° C. with SiH$_4$ at 15 sccm and NH$_3$ at 200 sccm.

Figure 48A:
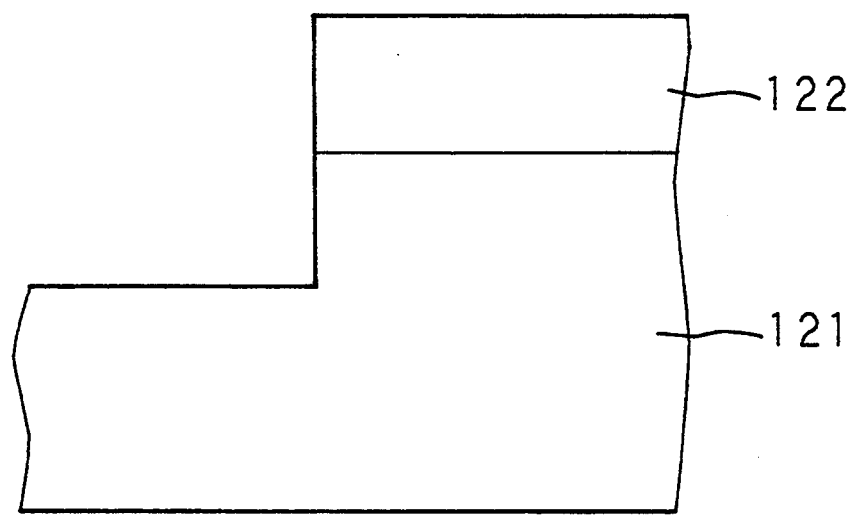
FIG. 48(a) is a cross-sectional view of a substrate at a stage of forming a quantum wire according to Example 2 of Embodiment 17.
Figure 48B:
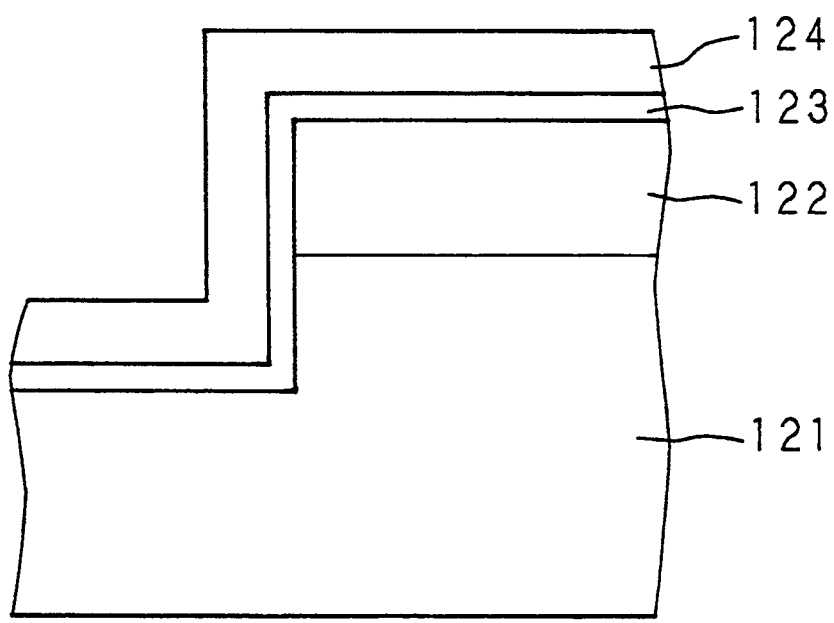
FIG. 48(b) is a cross-sectional view of the substrate at a stage of forming the quantum wire according to Example 2 of Embodiment 17.
Figure 48C:
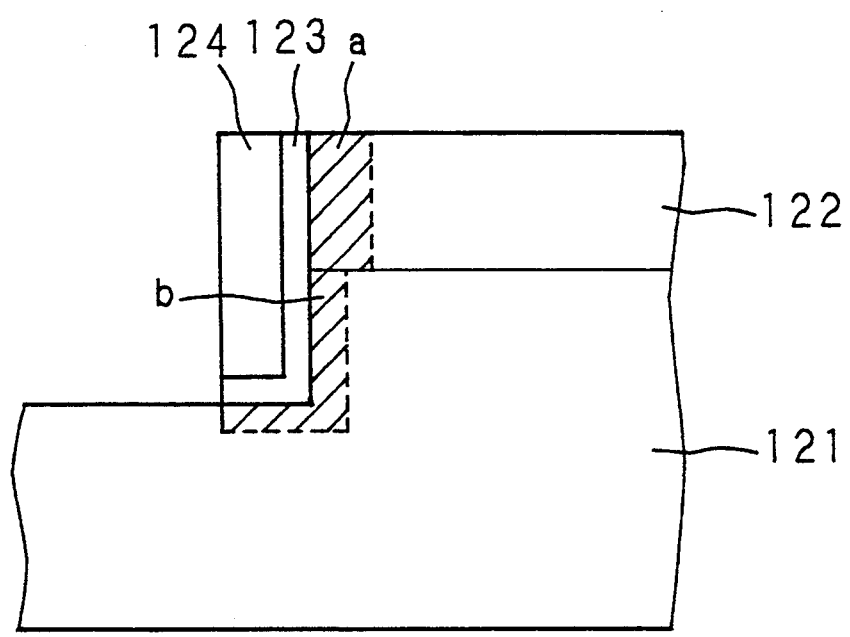
FIG. 48(c) is a cross-sectional view of the substrate at a stage of forming the quantum wire according to Example 2 of Embodiment 17.

Then, the SiOx layer 123 and the SiN layer 124 are removed by dry etching everywhere except the portions thereof formed on the sidewall of the step, as shown in FIG. 48(c). Heat treatment is then performed at 880° C. for 5 seconds, to form a diffused area a of 800 Å depth and a diffused area b of 600 Å depth in the AlGaAs layer 122 and the GaAs layer 121, respectively.

Figure 48D:
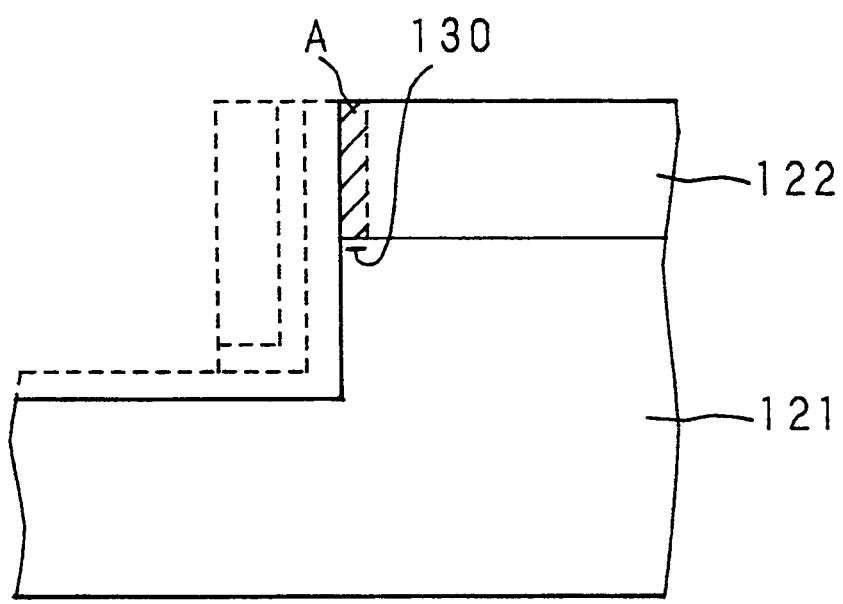
FIG. 48(d) is a cross-sectional view of the substrate at a stage of forming the quantum wire according to Example 2 of Embodiment 17.

Dry etching is then performed to remove the SiN layer 124 and the SiOx layer 123 and etch the GaAs layer 121 and the AlGaAs layer 122 to the same depth as the diffused area b, as shown in FIG. 48(d). As a result, the AlGaAs layer 122 is left with a diffused area A with Si diffused 200 Å in the direction of diffusion, so that a one-dimensional electron gas is created at the junction between the GaAs layer 121 and the AlGaAs layer 122 near the diffused area A, forming a quantum wire 130 with a channel width of 200 Å. In this manner, a quantum wire with a very fine and accurate channel width can be formed without introducing crystal defects.

EXAMPLE 3

Figure 49A:
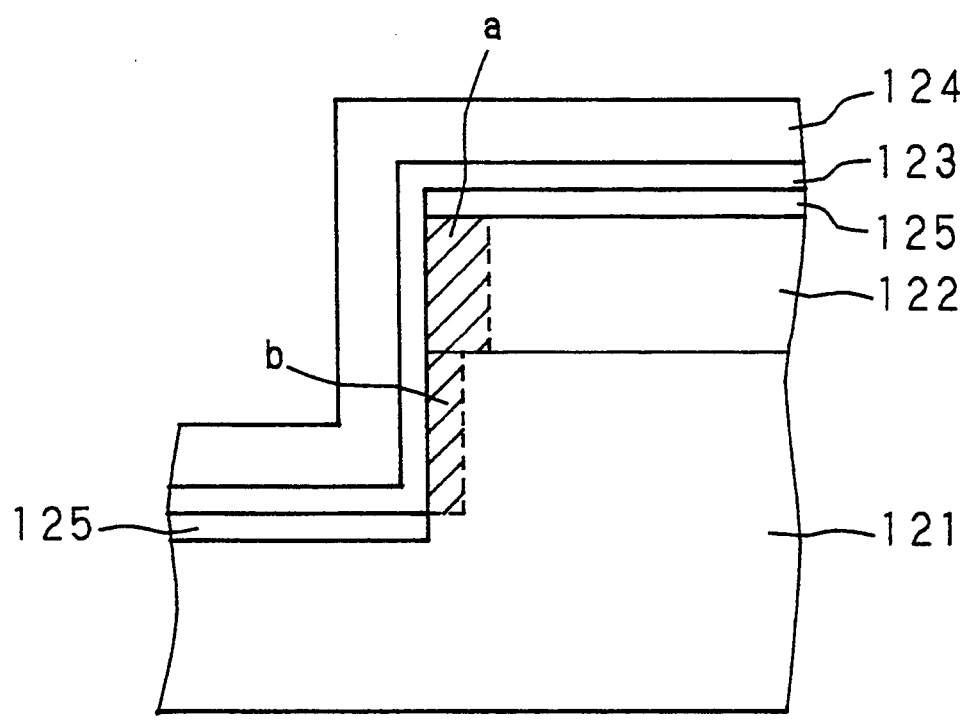
FIG. 49(a) is a cross-sectional view of a substrate at a stage of forming a quantum wire according to Example 3 of Embodiment 17.

FIG. 49 shows schematic cross-sectional views of a substrate, illustrating various stages of forming a quantum wire according to Example 3 of Embodiment 17. As shown in FIG. 49(a), all AlGaAs layer 122 is deposited on a stepped GaAs layer 121, a (group III-V compound semiconductor, thus forming a heterojunction structure, the heterojunction being perpendicular to the sidewall of the stepped portion. Using a technique of ECR-CVD, SiN layers 125 and 125 are deposited on the horizontal surfaces of the GaAs layer 121 and AlGaAs layer 122 parallel to the heterojunction. Then, a 100-Å SiOx layer 123 (x<2) is deposited over the entire surface by plasma CVD at a deposition temperature of 300° C. with SiH$_4$ at 5 sccm and N$_2$O at 25 sccm, and on top of that, a 400-Å SiN layer 124, which acts as the Group V atom diffusion stop layer, is deposited by plasma CVD at a deposition temperature of 300° C. with SiH$_4$ at 15 sccm and NH$_3$ at 200 sccm. Heat treatment is then performed at 880° C. for 5 seconds, to form a diffused area a of 800 Å depth and a diffused area b of 600 Å depth in the AlGaAs layer 122 and the GaAs layer 121, respectively.

Figure 49B:
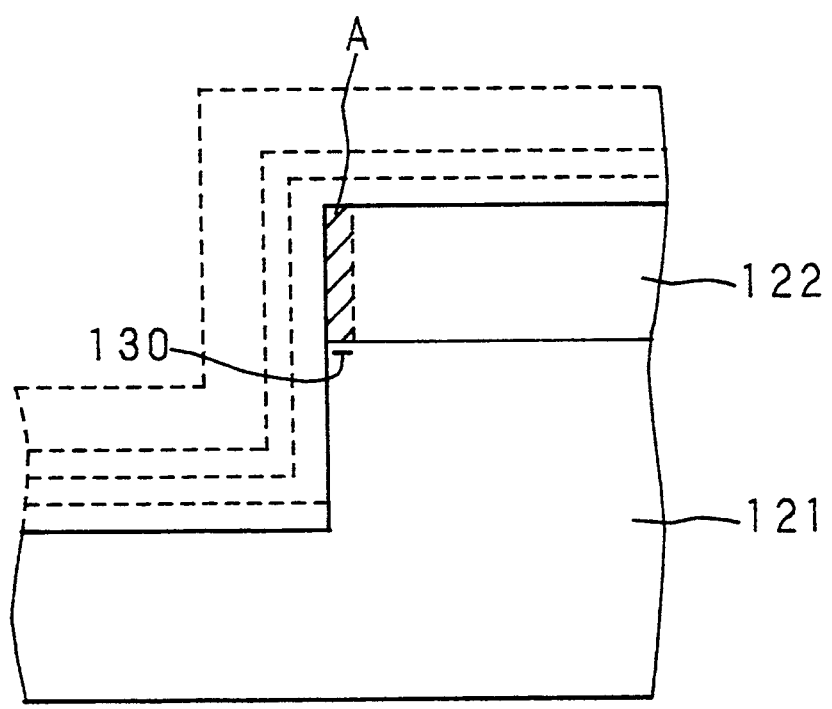
FIG. 49(b) is a cross-sectional view of the substrate at a stage of forming the quantum wire according to Example 3 of Embodiment 17.

Dry etching is then performed to remove the SiN layers 125, 125, the SiN layer 124, and the SiOx layer 123 and etch the GaAs layer 121 and the AlGaAs layer 122 to the same depth as the diffused area b, as shown in FIG. 49(b). As a result, the AlGaAs layer 122 is left with a diffused area A with Si diffused to a depth of 200 Å, so that a one-dimensional electron gas is created at the junction between the GaAs layer 121 and the AlGaAs layer 122 near the diffused area A, forming a quantum wire 130 with a channel width of 200 Å. In this manner, a quantum wire with a very fine and accurate channel width can be formed without introducing crystal defects.

The difference in depth between the two diffused areas varies with the heat treatment temperature as well as with the properties and thicknesses of the SiOx film and Group V atom diffusion stop layer formed on two dissimilar III-V compound semiconductors. Accordingly, the channel width of the quantum wire can be controlled by varying these parameters.

As describe above, in the quantum wire forming method of Embodiment 17, the difference in depth between the diffused areas formed in two dissimilar III-V compound semi-conductors defines the channel width of the quantum wire; therefore, the quantum wire can be formed with a very fine and accurate channel width without introducing crystal defects.

EMBODIMENT 18

Embodiment 18 is concerned with a method of building a quantum wire and a quantum box using the doping technique of the invention. According to the method of this embodiment, electrons call be confined within a 200 Å or less size even if the pattern size is greater than that size.

Figure 50:
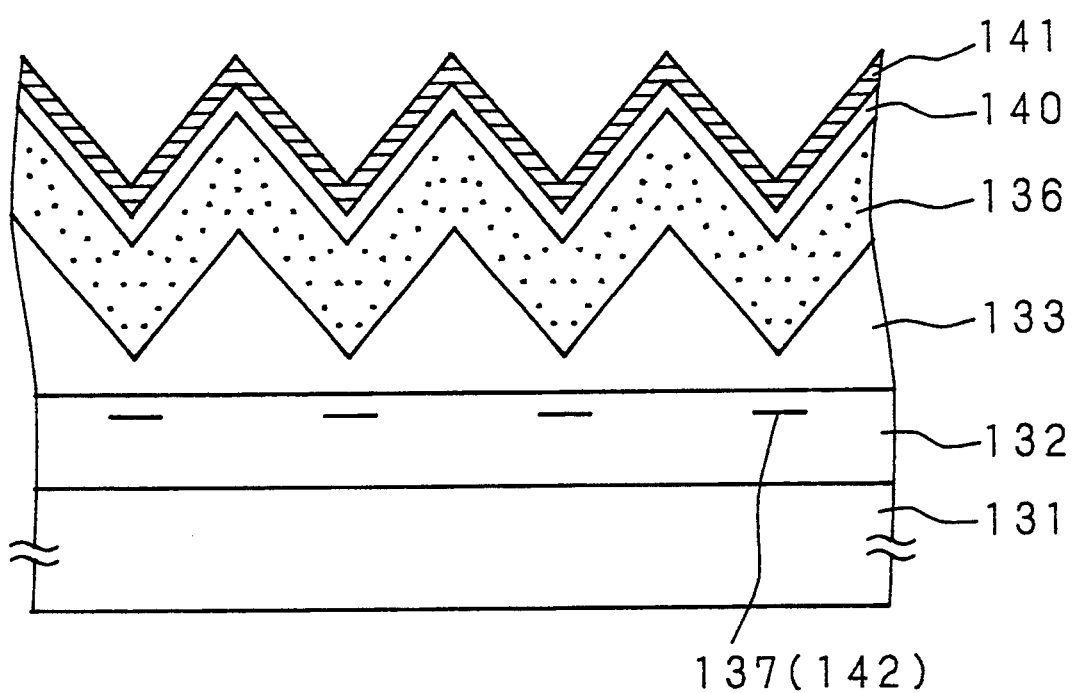
FIG. 50 is a cross-sectional view showing a quantum wire (or quantum box) formed according to Embodiment 18.

FIG. 50 is a cross-sectional view showing a quantum wire (or quantum box) formed by the method of Embodiment 18. A GaAs layer 132, a narrow-gap semiconductor layer, and an AlGaAs layer 133, a wide-gap semiconductor layer, are formed one on top of the other on a GaAs substrate 131, the surface of the AlGaAs layer 133 being formed in a sawtooth shape. An SiOx film 140 and an SiN film 141, which acts as the Group V atom diffusion stop film, are formed in this order over the entire surface, followed by heat treatment to form a doped layer 136 at the surface of the AlGaAs layer 133. The portions of the doped layer 136 that are formed under the troughs of the sawtooth are the nearest to the interface between the narrow-gap and wide-gap semiconductors, so that electrons tend to gather toward these portions. On the other hand, it is difficult for electrons to gather toward the other portions of the doped layer 136 because of the increased distance from the interface. As a result, the regions where electrons gather are restricted to extremely narrow space, resulting in the formation of very narrow channel layers that act as quantum wires 137 (or quantum boxes 142).

FIG. 51 shows diagrams for explaining a method of forming a quantum wire according to Embodiment 18. First, a GaAs layer 132 (thickness 8000 Å), a narrow-gap semiconductor layer, and an AlGaAs layer 133 (thickness 2000 Å), a wide-gap semiconductor layer, are deposited successively on a GaAs semi-insulative substrate (100) 131, to form an AlGaAs/GaAs substrate. A photoresist 134 is patterned to form a stripe pattern on the substrate, and then, using bromethanol (Br$_2$=1 weight %), the AlGaAs 133 is etched into a sawtooth shape. Since bromethanol is used as the etchant, it is possible to utilize the orientation dependence of the etching rate to show the (111) plane, so that the portions not covered by the photoresist 134 are etched into a V shape, thus forming the surface of the AlGaAs layer 133 into a sawtooth shape (FIG. 51(a).

Figure 51A:
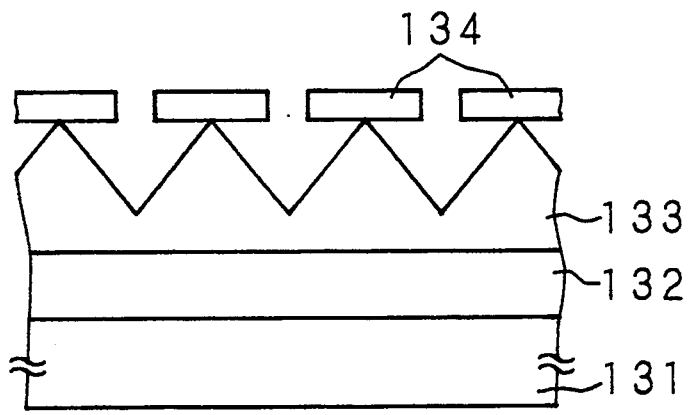
FIG. 51(a) is a cross-sectional view showing a processing step of forming a quantum wire according to Embodiment 18.
Figure 51B:
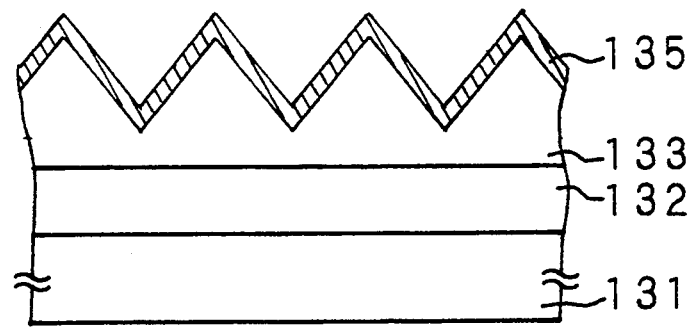
FIG. 51(b) is a cross-sectional view showing a processing step of forming the quantum wire according to Embodiment 18.
Figure 51C:
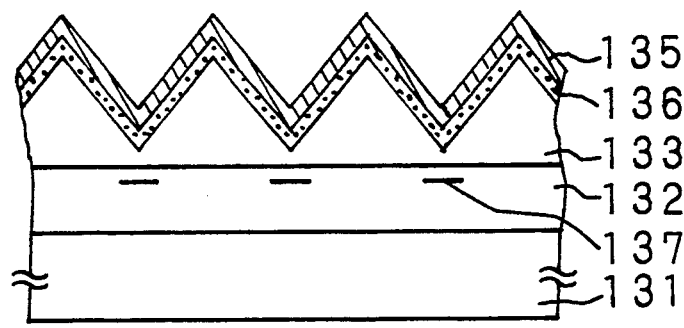
FIG. 51(c) is a cross-sectional view showing a processing step of forming a quantum wire according to Embodiment 18.
Figure 51D:
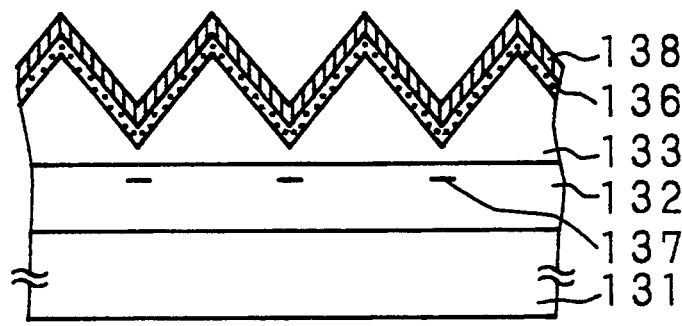
FIG. 51(d) is a cross-sectional view showing a processing step of forming a quantum wire according to Embodiment 18.

After removing the photoresist. 134, an SiOx film and an SiN film, which acts as the Group V atom diffusion stop film, are deposited by plasma CVD over the sawtooth-shaped surface or the AlGaAs layer 133 to form a composite structure film 135 (FIG. 51(b)). The film deposition conditions are as follows:

SiOx film: SiH4 10 sccm; N2O 20 sccm; RF power 150 W; Film deposition temperature 300° C.; Film thickness 150 Å

SiN film: SiH4 15 sccm; NH3 200 sccm; RF power 250 W; Film deposition temperature 300° C.; Film thickness 450 Å

Rapid thermal annealing is then performed at 880° C. for 5 seconds, thereby causing Si atoms in the SiOx film to diffuse into the AlGaAs layer 133 and thus forming a doped layer 136 with an electron density of $3 \times 10^{18} cm^{-3}$ and a diffusion depth of 400 Å. As a result, electrons gather in the regions of the GaAs layer 132 directly below the troughs of the sawtooth-shaped surface of the AlGaAs layer 133, thus forming quantum wires 137 (FIG. 51(c)).

After removing the composite structure film 35, if a Schottky electrode 138 is formed on the doped layer 136 and a bias is applied to this electrode, the regions where electrons gather in the doped layer 136 can be further restricted, making it possible to further reduce the size of the quantum wires 137. In this case, quantum wires of 200 Å or less can be easily formed with good accuracy even when the pattern size is larger than that.

Figure 52:
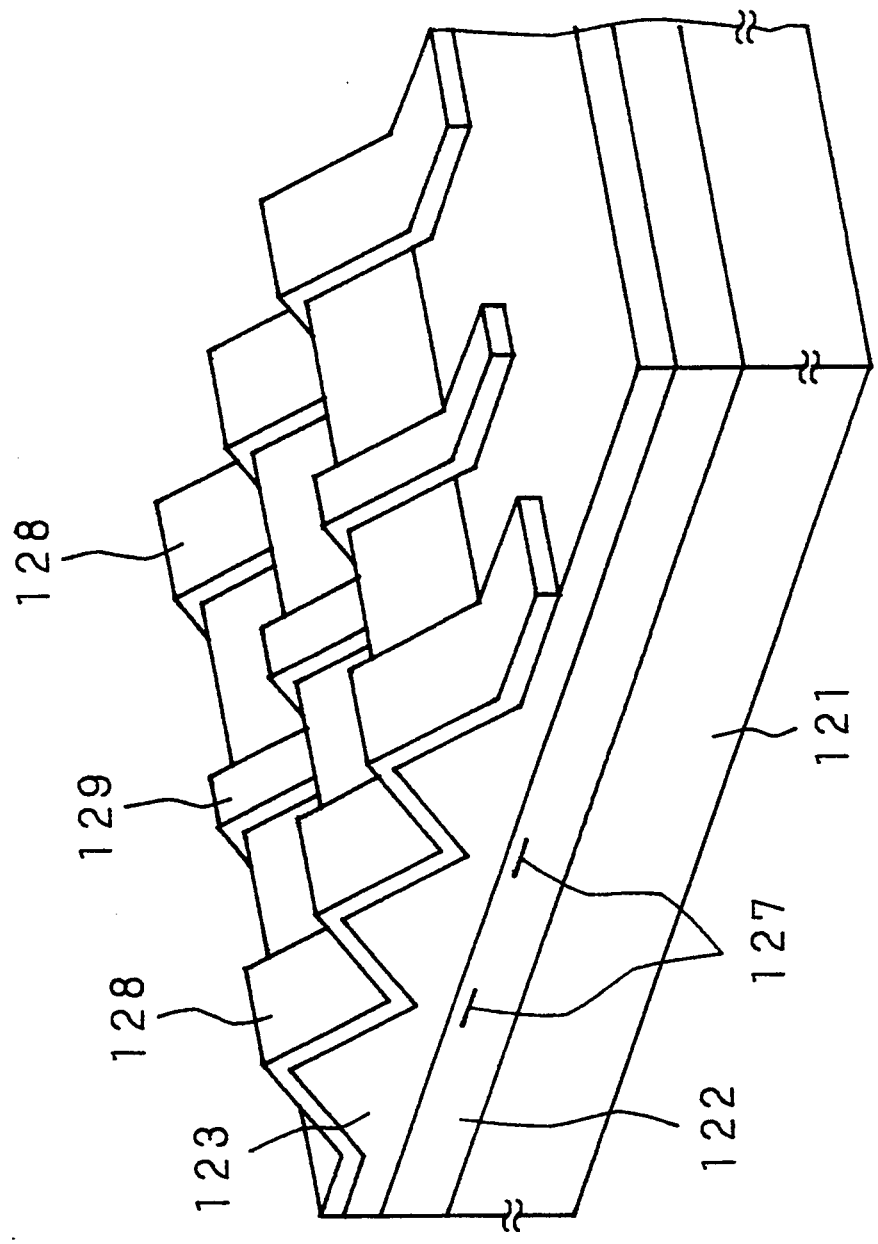
FIG. 52 is a perspective view showing a quantum wire according to Embodiment 18.

FIG. 52 is a perspective view showing quantum wire transistors according to Embodiment 18. On the doped layer 136 that has undergone the step of FIG. 51(c) or (d), ohmic electrodes 138 and 138 as the source and drain regions and a Schottky electrode 139 as the gate electrode are formed separated from each other by a prescribed distance and extending in directions perpendicular to the quantum wires 137, thus forming quantum wire transistors. This method can also be applied to the fabrication of other types of semiconductor device.

Figure 53:
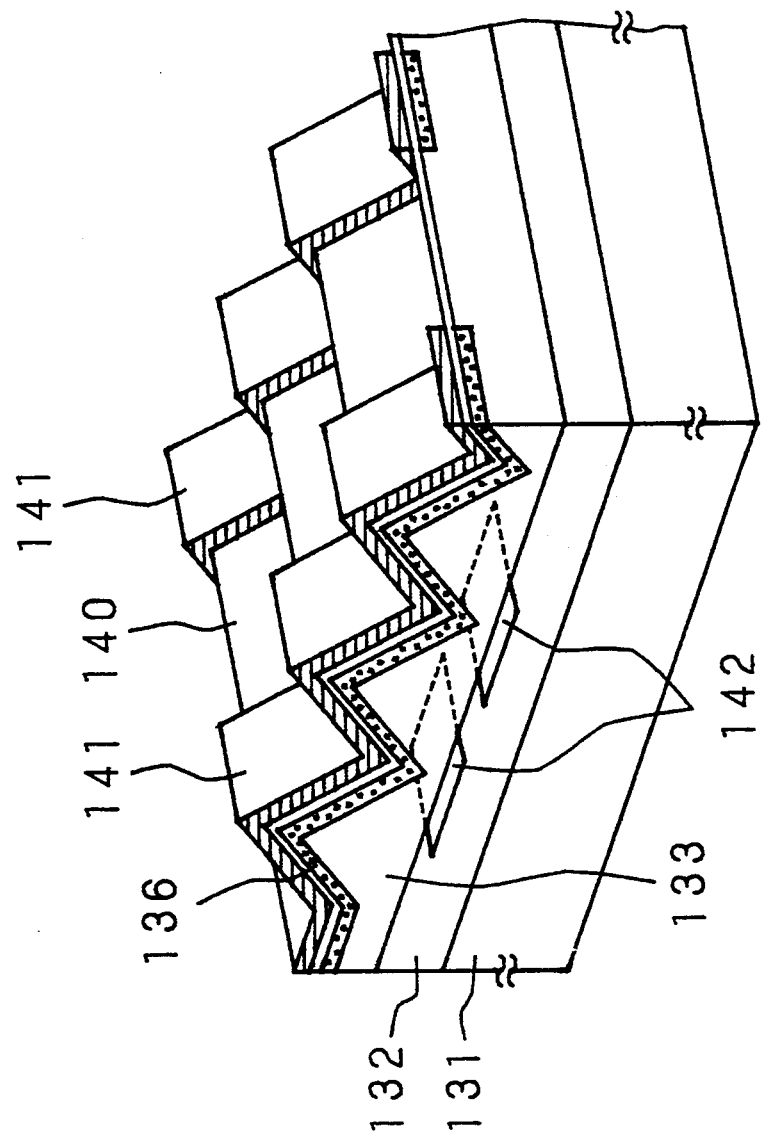
FIG. 53 is a perspective view of a portion for explaining a method of forming a quantum box according to Embodiment 18.

FIG. 53 is a perspective view showing a portion for explaining a method of forming a quantum box according to Embodiment 18. After the AlGaAs layer 133 is formed in a sawtooth shape by the method shown in FIG. 51(a), an SiOx film 140 is formed over the surface of the AlGaAs layer 133. SiN films 14 1 are then formed in a stripe or straight line pattern, separated from each other by a prescribed distance, selectively over the regions where the quantum boxes are to be formed. The structure is then subjected to heat treatment; as a result, Si is diffused in the regions covered by the SiN film 141, forming doped layers 136, but in the regions not covered by the SiN film 141, no Si diffusion occurs. Since the Si-diffused regions (the doped layers 136) are restricted in this manner, the quantum boxes 142 are formed only in the regions of the GaAs layer 132 directly below the portions of the diffused layers 136 formed under the troughs of the sawtooth-shaped surface of the AlGaAs layer 133, In this case also, since the channel layers are formed in a nondestructive manner, the quantum boxes 142 are almost free from defects such as crystal defects.

As described above, in the quantum wire forming method or Embodiment 18, the wide-gap semiconductor layer is formed into a sawtooth-like cross section, and a doped layer is formed at its surface; since the portions of the doped layer formed below the troughs of the sawtooth are close to the interface between the narrow-gap and wide-gap semiconductor layers, electrons gather in the regions of the narrow-gap semiconductor layer below these portions, resulting in the formation of a quantum wire, i.e. a channel layer, with a very small width. Transistors using the thus formed quantum wires exhibit excellent characteristics.

Furthermore, by forming a Group V atom diffusion stop film extending across the peaks and troughs of the sawtooth, the region where the doped layer is formed can be restricted, so that a quantum wire, i.e. a channel layer with an extremely small width and a limited length, can be obtained. The quantum wires and quantum boxes formed by the method of Embodiment 18 are almost free from defects such as impurity or crystal defects. Semiconductor devices, such as transistors, using this quantum box exhibit very excellent characteristics.

EMBODIMENT 19

Embodiment 19 is concerned with an example of fabricating an integrated circuit of HEMTs, using the doping method of the invention, on a substrate of heterostructure such as AlGaAs/GaAs. Using the method of Embodiment 19, depletion-mode and enhancement-mode HEMTs and integrated circuits using the same can be fabricated with comparative ease and without requiring recess etching.

FIG. 54 shows schematic cross-sectional views illustrating a fabrication process sequence for semiconductor circuit devices according to Embodiment 19. The example shown concerns the fabrication of DCFL circuit devices. First, as shown in FIG. 54(a), an i-GaAs layer 52 (6000 Å), an i-AlGaAs specer layer 153 (20 Å), an n-AlGaAs layer 154 (200 Å, $3 \times 10^{18} cm^{-3}$), an i-AlGaAs layer 155 (200 Å), and an i-GaAs layer 156 (500 Å) are successively formed on a GaAs semi-insulative substrate 51 by using molecular beam epitaxy. Mesa etching is performed to provide isolation from other devices (not shown).

Next, using sputtering deposition and etching techniques, a high-melting metal gate 157, made, for example, of WSiN and having a gate length of 0.35 μm, is formed in each of the regions where an E-mode FET device and a D-mode FET device are to be formed. Then, using CVD, sidewalls 158 and 158 of SiO2 are formed on both sides of the high-melting metal gate 157 in the E-mode FET device region (FIG. 54(b)). An SiOx film (x<2) and an SiN film are then deposited by plasma CVD over the entire surface to form a diffusion film 159 of two-layer structure, which is then removed everywhere except the mesa etched portions. The deposition conditions for the SiOx and SiN films are as follows:

SiOx: SiH4 5 sccm; N2O 25 sccm; RF power 150 W; Film deposition temperature 300° C.; Film thickness 50 Å

SiOx: SiH4 15 sccm; NH3 200 sccm; RF power 250 W; Film deposition temperature 300° C.; Film thickness 450 Å

On top of the above-prepared surface is then formed an SiO2 film 160 (1000 Å) that will subsequently be used as a heat treatment protective film, after which rapid thermal annealing is performed at 880° C. for 5 seconds. This causes Si in the SiOx film in the diffusion film 159 to diffuse into the i-GaAs layer 156 and the i-AlGaAs layer 155, thus forming a diffused layer 161 except the regions below the high-melting metal gates 157 (FIG. 54(c)). In the above annealing process, the SiN film acts as the As diffusion stop layer. Finally, an ohmic electrode 162 is formed so as to obtain the E-mode FET device and the D-mode FET device (FIG. 54(d)).

Figure 54A:
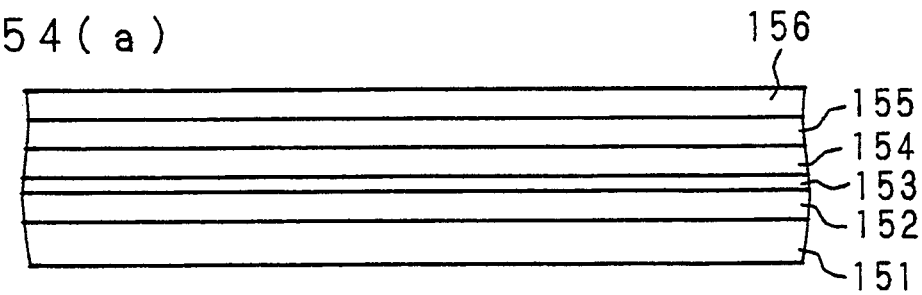
FIG. 54(a) is a cross-sectional view showing a fabrication processing step for a semiconductor circuit device according to Embodiment 19.
Figure 54B:
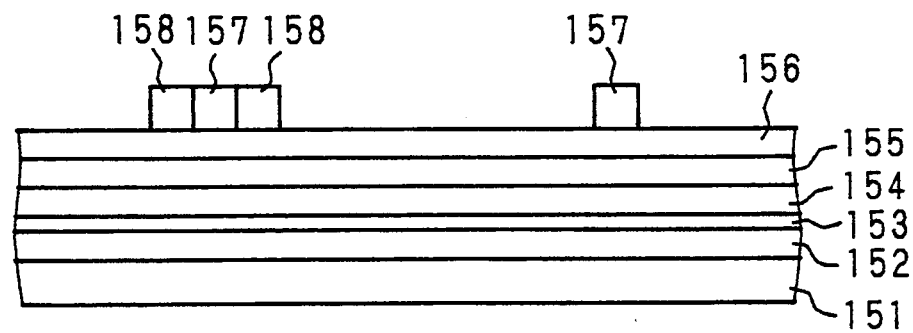
FIG. 54(b) is a cross-sectional view showing a fabrication processing step for the semiconductor circuit device according to Embodiment 19.
Figure 54C:
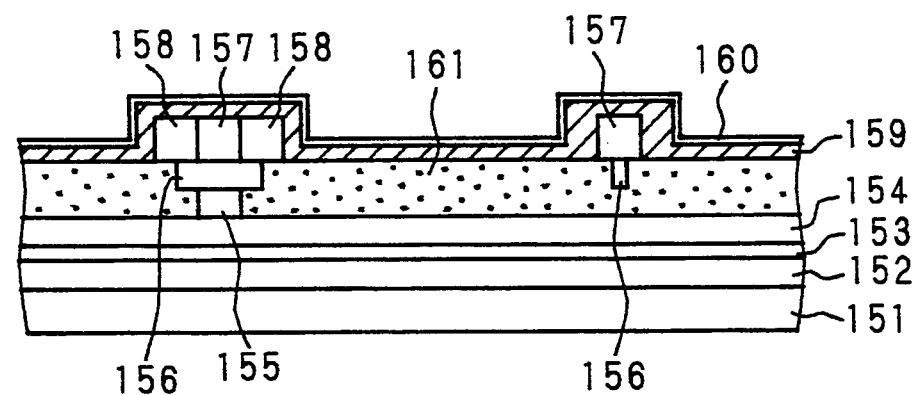
FIG. 54(c) is a cross-sectional view showing a fabrication processing step for the semiconductor circuit device according to Embodiment 19.
Figure 54D:
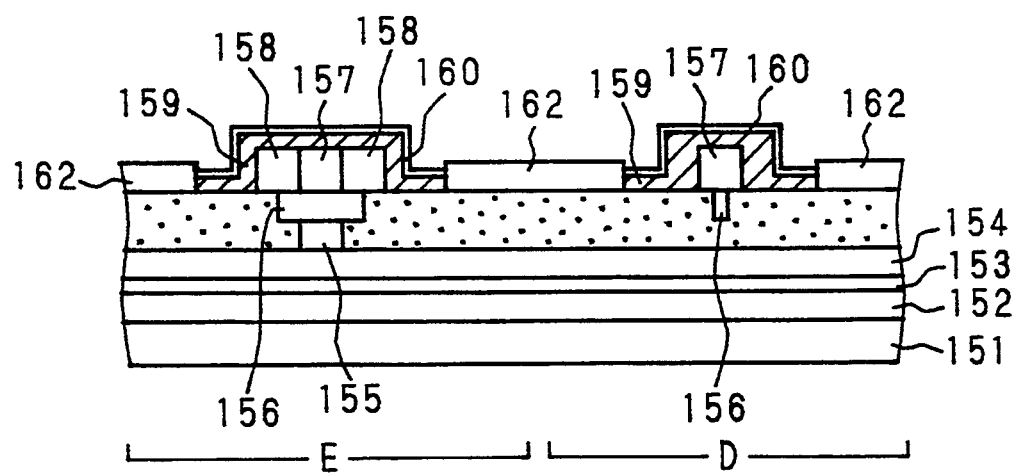
FIG. 54(d) is a cross-sectional view showing a fabrication processing step for the semiconductor circuit device according to Embodiment 19.
Figure 55:
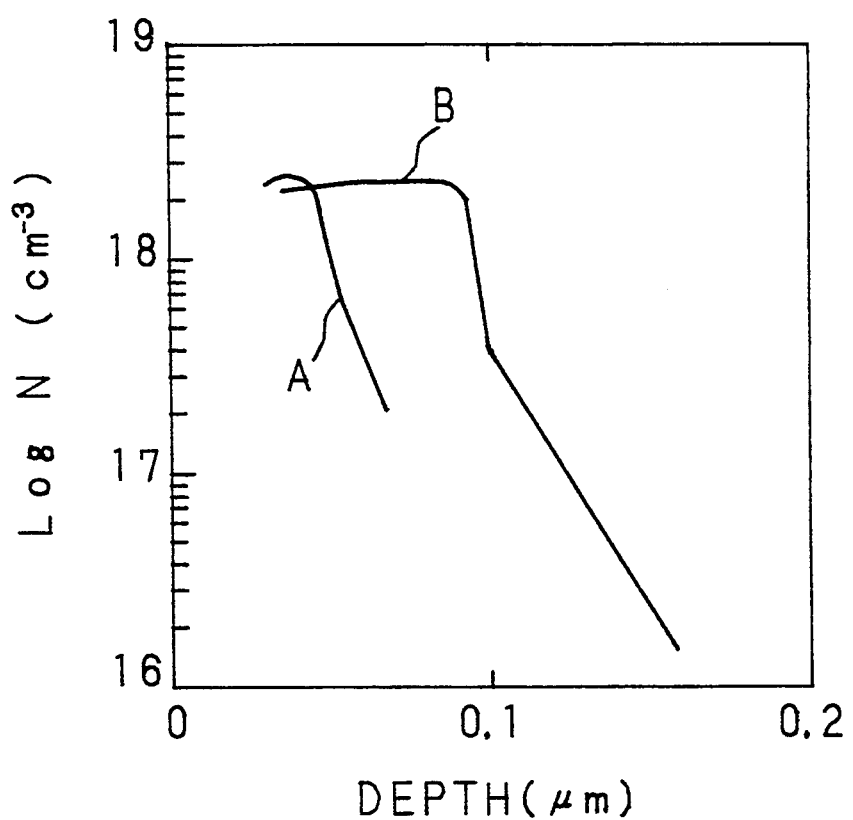
FIG. 55 is a graph showing electron density profiles in diffused layers according to Embodiment 19.

In the process of forming the diffused layer 161 shown in FIG. 54(c), Si diffuses more easily in the i-AlGaAs layer 155 than in the i-GaAs layer 156. FIG. 55 shows the electron density profiles taken along the depth in the i-GaAs layer (A) and the i-AlGaAs layer (B). The diffusion can be controlled by varying the heat treatment conditions as well as the properties and thicknesses of the SiOx and SiN films. This feature is utilized in the present embodiment; where the high-melting metal gate 7 alone is formed on the i-GaAs layer 156, Si diffuses in the entire region of the i-AlGaAs layer 155 while the i-GaAs layer 156 is left with a region in which Si is not diffused.

On the other hand, where the high-melting metal gate 157 is formed along with the sidewalls 158 and 158 thus increasing the width of the coverage, both the i-GaAs layer 156 and the i-AlGaAs layer 155 are left with regions in which Si is not diffused, such region being narrower in the i-AlGaAs layer 155. The former structure functions as a D-mode FET device in which conductor takes place with zero gate voltage, and the latter as an E-mode FET device.

Table 6 below shows the threshold voltages before and after the Si diffusion along with the standard deviations after the Si diffusion for the E-mode FET device and D-mode FET device actually fabricated on a 2-inch substrate using the method of Embodiment 19.

TABLE 6

|  | Before Si diffusion | After Si diffusion | Standard deviation |
|---|---|---|---|
| E-mode FET device | 0.10 V | 0.09 V | 10 mV |
| D-mode FET device | 0.10 V | −1.21 V | 15 mV |

As is apparent from Table 6, the threshold voltages after the Si diffusion sufficiently satisfy the requirement for use as a DCFL circuit, and also, exhibit good uniformity. This is because recess etching techniques for the gate portion are not used so that the devices are free from variations and damaged layers due to etching. In a ring oscillator having the DCFL circuit devices fabricated in accordance with the method of the invention, the gate delay time and power consumption were measured, the result of which showed excellent characteristics of 9 ps/gate and 1.0 mW/gate at the source-drain voltage of 1.5 V.

It will be appreciated that the Group III-V compound semiconductor is not limited to the composition used in this embodiment. Furthermore, the layer from which the dopant is to be diffused is not limited to the two-layer structure of an i-AlGaAs layer and an i-GaAs layer.

In Embodiment 19, the SiN film is used to prevent diffusion of As from the i-GaAs layer 156 and the i-AlGaAs layer 155, but it will be appreciated that other types of Group V atom diffusion stop layer may be substituted. The description of Embodiment 19 has dealt with the fabrication of a DCFL circuit using modulation-doped FETs, but the application of this embodiment is not limited to the illustrated example.

According to the semiconductor circuit device fabrication method of Embodiment 19, a diffusion source consisting of an SiOx film and a Group V atom diffusion stop layer is formed on a Group III-V compound semiconductor layer, and heat treatment is performed to diffuse Si to a prescribed depth and at a prescribed concentration into the semiconductor. Thus, the method does not rely oil selective etching techniques to produce semiconductor circuit devices such as modulation-doped FETs, so that the semiconductor circuit devices fabricated according to the method are not only high performance and high quality but can be made with high fabrication yield.

EMBODIMENT 20

Embodiment 20 shows examples of integrating different types of HEMT or a HEMT and a MESFET by using the doping technique of the invention.

EXAMPLE 1

Figure 56:
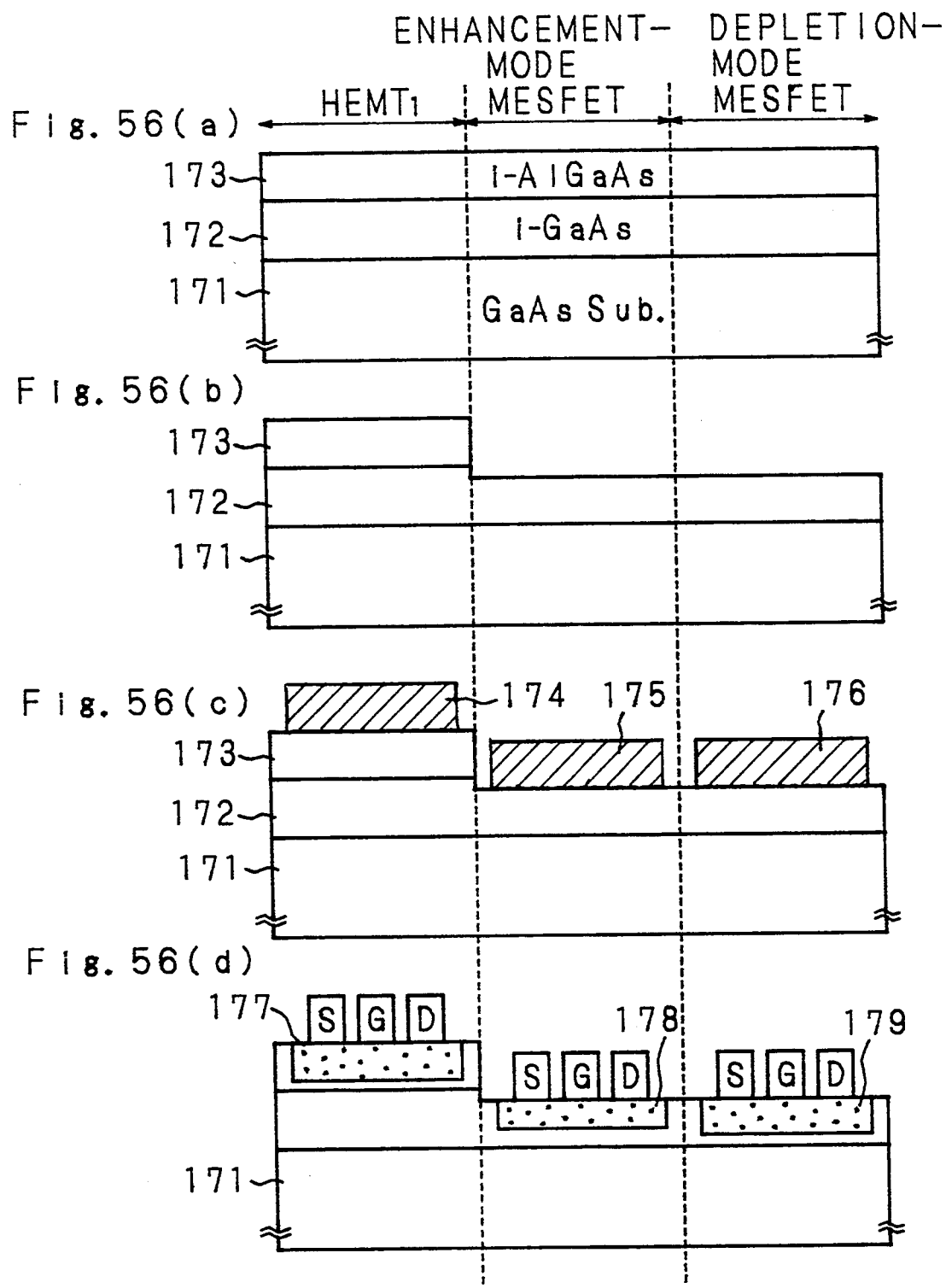
FIG. 56(a) is a cross-sectional view showing a fabrication processing step for a semiconductor integrated circuit according to Example 1 Embodiment 20.
FIG. 56(b) is a cross-sectional view showing a fabrication processing step for the semiconductor integrated circuit according to Example 1 of Embodiment 20.
FIG. 56(c) is a cross-sectional view showing a fabrication processing step for the semiconductor integrated circuit according to Example 1 of Embodiment 20.
FIG. 56(d) is a cross-sectional view showing a fabrication processing step for the semiconductor integrated circuit according to Example 1 of Embodiment 20.

FIG. 56 shows a process sequence for fabricating a direct-coupled FET logic circuit (DCFL) using a HEMT, an E-mode (enhancement-mode) MESFET, and a D-mode (depletion-mode) MESFET formed on the same substrate.

First, as shown in FIG. 56(a), a heterojunction layer consisting of an undoped i-GaAs layer 172 and i-AlGaAs layer 173 is formed on a semi-insulative GaAs substrate 171 by using a crystal growth technique. Next, the entire depth of the i-AlGaAs layer 173 and a partial depth of the i-GaAs layer 172 in the E-mode and D-mode MESFET regions are etched off using an etchant of sulphuric acid type (FIG. 56(b)). Then, diffusion sources, 174, 175, and 176, consisting of an SiOx film and an SiN film, are deposited by plasma CVD on respectively designated areas in the HEMT, E-mode MESFET, and D-mode MESFET regions, using the conditions shown in Table 7 below (FIG. 56(c)).

TABLE 7

|  | HEMT | E-mode MESFET | D-mode MESFET |
|---|---|---|---|
| SiOx film |  |  |  |
| SiH4/N2O flow rate (sccm) | 10/20 | 10/30 | 10/40 |
| Power (W) | 150 | 150 | 150 |
| $T_{SUB}$ (°C.) | 300 | 300 | 300 |
| SiN film |  |  |  |
| SiH4/NH3 flow rate (sccm) | 15/180 | 15/180 | 15/200 |
| Power (W) | 150 | 150 | 150 |
| $T_{SUB}$ (°C.) | 300 | 300 | 300 |

Figure 57:
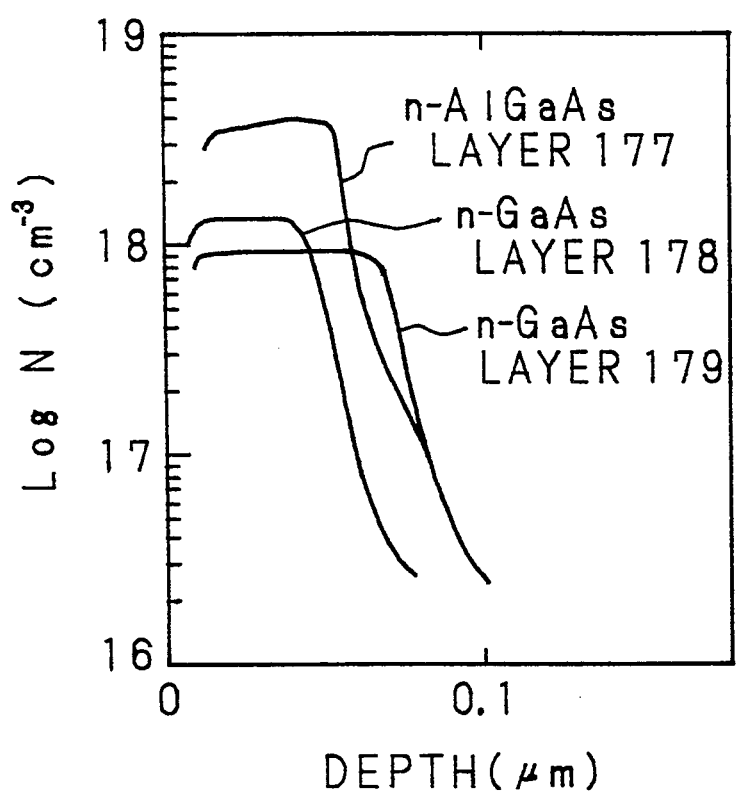
FIG. 57 is a graph showing electron density profiles in doped layers formed in accordance with the fabrication process shown in FIG. 56.

Rapid thermal annealing is then performed (850° C., 5 seconds); as a result, an n-AlGaAs layer 177 is formed in the i-AlGaAs layer 173 in the HEMT region, while n-GaAs layers 178 and 179 are formed in the i-GaAs layer 172 in the E-mode and D-mode MESFET regions, respectively. These doped layers (the n-AlGaAs layer 177, n-GaAs layers 178, 179) respectively have the desired electron density profiles as shown in FIG. 57. Finally, a source electrode S, a drain electrode D, and a gale electrode G are formed on each of the doped layers.

The characteristics of the devices fabricated according to Example 1 are as follows:
HEMT: NF=0.50 dB (12 GHz)
E-mode MESFET: Threshold voltage Vth=0.1 V Mutual conductance gm=500 mS/mm
D-mode MESFET: Threshold voltage Vth=−0.1 V Mutual conductance gm=500 mS/mm The above DCFL circuit achieves a high speed operation of a delay time of 10 ps/gate. Thus, according to the present embodiment, a low-noise MESFET and a digital logic circuit using E-mode and D-mode MESFETs can be fabricated in monolithic form with a reduced number of processing steps. Further, it is apparent that resistors can also be fabricated by a process similar to the one shown in FIG. 56.

EXAMPLE 2

Figure 58A:
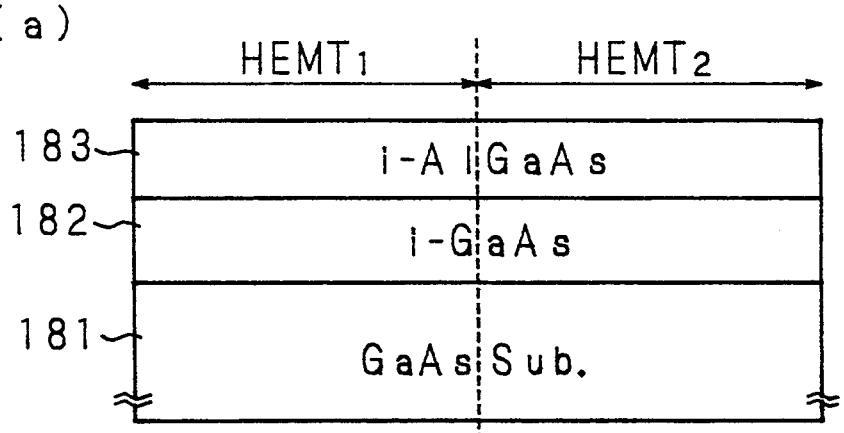
Figure 58B:
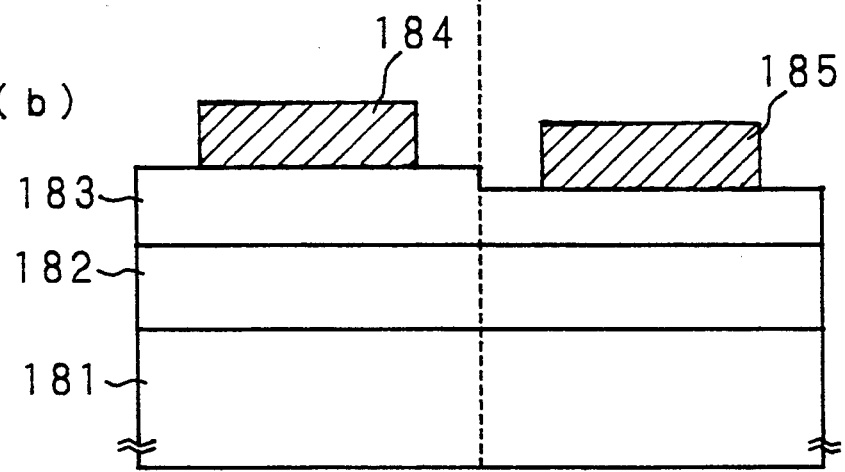

FIG. 58 shows a process sequence for fabricating an MMIC with HEMTs having different characteristics. The example shown concerns the fabrication of a HEMT having a low-noise characteristic in the X band and a HEMT having a high gain characteristic on the same heterojunction layer. First, as shown in FIG. 58(a), a heterojunction layer consisting of an undoped i-GaAs layer 182 and i-AlGaAs layer 183 is formed on a semi-insulative GaAs substrate 181 by using a crystal growth technique. Next, a partial depth of the i-AlGaAs layer 183 in the HEMT2 region is etched off using an etchant of sulphuric acid type. Then, diffusion sources, 184 and 185, consisting of an SiOx film and an SiN film, are deposited by plasma CVD on respectively designated areas in the HEMT1 and HEMT2 regions, using the conditions shown in Table 8 below (FIG. 58(b)).

TABLE 8

|  | HEMT 1 | HEMT 2 |
|---|---|---|
| SiOx film |  |  |
| SiH$_4$/N$_2$O flow rate (sccm) | 10/30 | 10/20 |
| Power (W) | 150 | 150 |
| T$_{SUB}$ (°C.) | 300 | 300 |
| SiN film |  |  |
| SiH$_4$/NH$_3$ flow rate (sccm) | 15/180 | 15/180 |
| Power (W) | 150 | 150 |
| T$_{SUB}$ (°C.) | 300 | 300 |

SiOx film SiH$_4$/N$_2$O flow rate (sccm)
SiN film SiH$_4$/NH$_3$ flow rate (sccm)

Figure 58C:
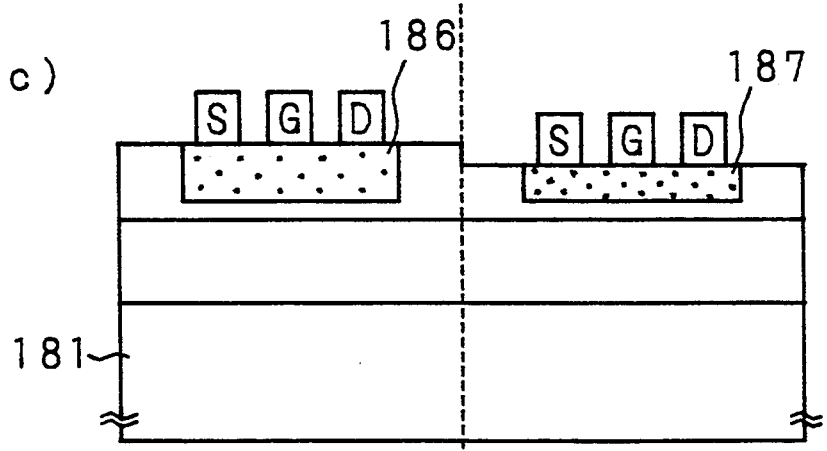
Figure 59:
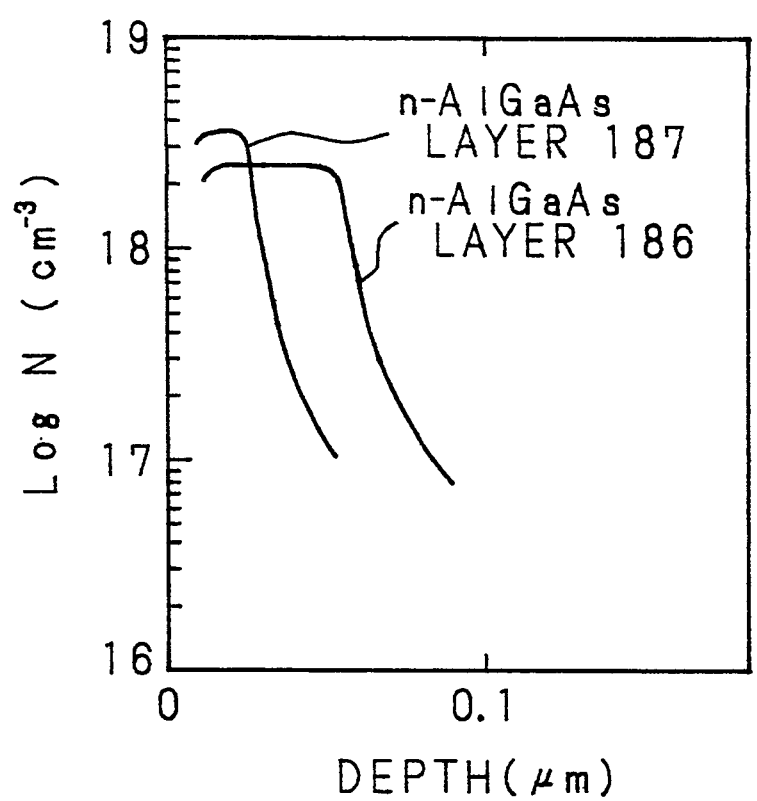

Rapid thermal annealing is then performed (850° C., 5 seconds); as a result, n-AlGaAs layers 186 and 187 are formed in the i-AlGaAs layer 183 in the HEMT1 and HEMT2 regions, respectively (FIG. 58(c)). These doped layers (the n-AlGaAs layers 186, 187) respectively have the desired electron density profiles as shown in FIG. 59. Finally, a source electrode S, a drain electrode D, and a gate electrode D are formed on each of the doped layers. The characteristics of the devices fabricated according to Example 2 are shown in Table 9.

TABLE 9

|  | HEMT 1 | HEMT 2 |
|---|---|---|
| NF (db) | 0.50 | 0.60 |
| Ga (db) | 11 | 15 |

As is apparent from Table 9, according to Example 2, he HEMT1 having a low-noise characteristic and the HEMT2 having a high gain characteristic can be fabricated on the same heterojunction layer. Therefore, if, for example, the HEMT1 is disposed at the first stage that requires the low-noise characteristic, and the HEMT2 at the second and third stages that require high gain, an X-band low-noise receiving converter amplifier can be fabricated on the same heterojunction layer in the form of an MMIC. Furthermore, an MMIC with HEMTs having different characteristics can also be fabricated in like manner on an undoped AlGaAs/InGaAs/GaAs pseudomorphic substrate.

It is also possible to combine the process shown in FIG. 56 (Example 1) with the process shown in FIG. 58 (Example 2) and fabricate two types of HEMT and two types of MESFET together on the same substrate. For example, in the etching step shown in FIG. 56(b), the i-AlGaAs layer 173 is etched in such a manner as to produce regions of different thicknesses, and diffusion sources are deposited separately on these regions using the conditions shown in Table 2. Then, by performing the steps shown in FIGS. 56(c) and 56(d), two types of HEMT and two types of MESFET can be produced on the same substrate.

Furthermore, in the step shown in FIG. 56(d), if a Schottky electrode and ohmic electrodes are formed appropriately on a doped layer diffused in the i-GaAs layer 172, a diode can be produced; it is also possible to produce a resistor by forming all ohmic contact on the doped layer.

According to Embodiment 20, a plurality of devices having different characteristics can be easily built in monolithic form, which has been difficult with the prior art. The method of this embodiment thus achieves miniaturization of communication devices without increasing the complexity of the fabrication process.

EMBODIMENT 21

Embodiment 21 is concerned with a method of fabricating an electron wave interference device by using the doping technique of the invention.

Figure 60A:
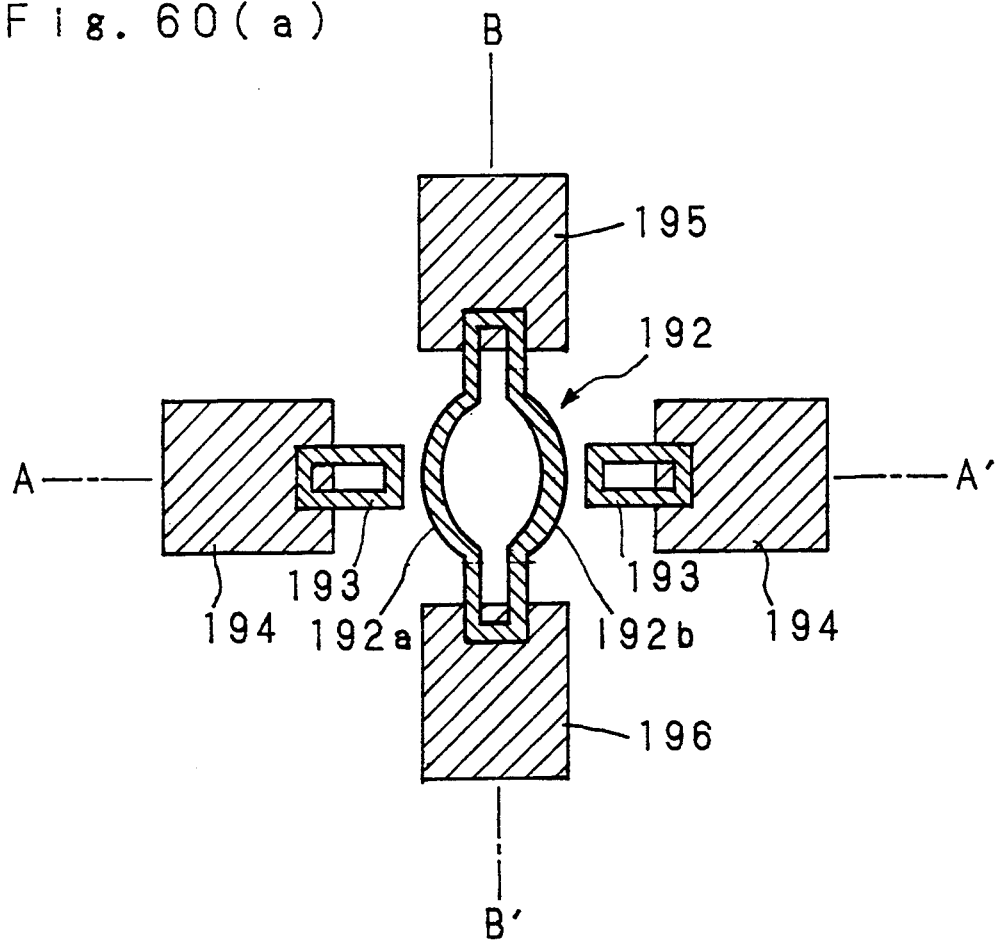
Figure 60B:
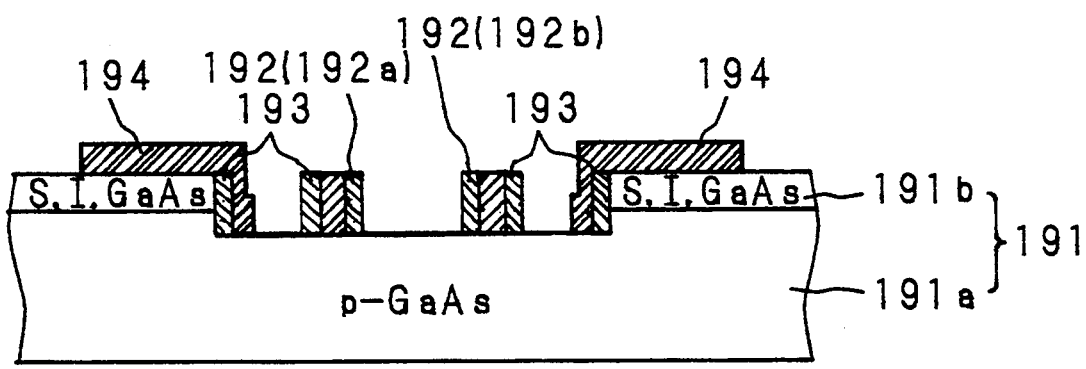

FIG. 60 shows the basic structure of an electron wave interference device according to Embodiment 21: FIG. 60(a) is a plan view, and FIG. 60(b) shows a cross section taken along A-A' in FIG. 60(a). In the figure, the reference numeral 191 designates a GaAs substrate consisting of a semi-insulative GaAs layer 191b formed to a depth of 0.2 μm below the surface and a p-mode GaAs layer 191a formed thereunder, In the center of the GaAs substrate 191, there is formed an opening about 0.3 μm deep with a portion of the substrate being left unremoved around it, and a highly doped channel layer 192 is formed by diffusion to a depth of 0.1 μm or less (about 0.01 to 0.1 μm) in the inner sidewall of the remaining portion. Since the thickness of the channel layer 192 is 0.1 μm or less, the electron density is about $3 \times 10^{18} \text{cm}^{-3}$.

The channel layer 192 is provided with an electron injecting electrode 195 and an electron ejecting electrode 196 at two separate positions that equally divide the length of the channel layer 192, so that an electron wave propagates through two different paths (channel layers) 192a and 192b, of 0.2 μm or less length, between the electrodes 195 and 196. Further, highly doped layers 193 for applying electrostatic potential are formed on the outer sidewall of the remaining portion, and a gate electrode 194 is formed connected to each highly doped layer 193.

Next, the operation will be described. When an electric field is applied between the electron injecting electrode 195 and the electron ejecting electrode 196, electrons flow through the channel layers 192a and 192b. Since the channel layer 192 is thin, the energy states of the electrons are quantized, and the phase is less affected by impurity scattering and, therefore, less susceptible to perturbations. By applying a suitable potential, through the highly doped layers 193, from the gate electrodes 194 provided adjacent to the channel layer 192, the electron waves propagating through the channel layers 192a and 192b cause interference, and the interference state can be controlled. Thus, the structure of Embodiment 21 functions as an electron wave interference device.

We will now describe the fabrication process for an electron wave interference device of the above construction. FIG. 61 shows cross-sectional views illustrating the fabrication sequence; the cross-sectional views taken through A-A' and B-B' in FIG. 60 are arranged side by side in the sequence of processing steps.

First, a photoresist film 201 is patterned in a desired pattern over the principal plane of a GaAs substrate 191 that consists of a semi-insulative GaAs layer 191b formed to a depth of 0.2 μm below the surface and a p-mode GaAs layer 191a formed thereunder (FIG. 61(a)). Using the photoresist film 201 as a mask, openings about 0.3 μm deep are formed into the GaAs substrate 191 by reactive ion etching (RIE) (FIG. 61(b)). Next, an SiO₂ film 203 is deposited over the entire surface to a thickness of about 1000 Å by ECR-CVD (FIG. 61(c)).

Using a mixed solution of NH₄F: HF=120:1, slight etching is performed to selectively remove the SiOx film 203 on the sidewalls of the GaAs substrate 191 and the photo-resist film 201 (FIG. 61(d)). Using a lift-off technique, the SiO₂ film 203 remaining on the photoresist 201 is removed (FIG. 61(e)). Next, an SiOx/SiN composite film 204 for Si diffusion is deposited over the entire surface by plasma CVD (FIG. 61(f)). The SiOx/SiN composite film 204 consists, for example, of an SiOx film (thickness: about 150 Å) in the lower layer and an SiN film (thickness: about 450 Å) in the upper layer. Anisotropic RIE is then performed to remove the SiOx/SiN composite film 204 everywhere except the sidewalls of the openings 202 (FIG. 61(g)).

Using P-CVD, an SiN film 205 as an anneal protection film is deposited over the entire surface to a thickness of about 1000 Å (FIG. 61(h)), Next, annealing is performed at 880° C. for 5 seconds, to form highly doped layers of a desired thickness, i.e. the channel layer 192 and the highly doped layer 193 (FIG. 61(i)). The thickness of the highly doped layers can be controlled by the deposition conditions of the SiOx/SiN composite film 204 and the annealing conditions. A photoresist film 206 is then patterned in a desired pattern, after which, using the photoresist film 206 as a mask, the SiN film 205 is selectively removed from the regions where electrodes are to be formed (FIG. 61(j)). Next, a metal film of AuGe/Ni for forming the electrodes is evaporated, and the portions of the metal film that lie on the photoresist film 206 are removed by lift-off, which is followed by 120-second heat treatment in a 400° C. H₂ atmosphere, to form the gate electrodes 194, electron injecting electrode 195, and electron ejecting electrode 196 (FIG. 61(k)).

The major techniques used in the above processing steps, such as the miniature pattern etching techniques, electrode forming techniques, are used extensively in the manufacture of conventional compound semiconductor devices, and it can therefore be said that the device structure of Embodiment 21 is suitable for high density integration.

As described above, according to Embodiment 21, since the highly doped layer formed by diffusion is used as the channel layer, an electron wave interference device of the desired shape and size and of the structure suitable for fabrication as an integrated circuit can be formed at a desired position on the surface of a compound semiconductor substrate.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A method of doping a Group III-V compound semiconductor with an impurity, comprising the steps of:

successively depositing on a crystal of a Group III-V compound semiconductor an undoped silicon oxide film (an SiOx film) and a film for preventing the external diffusion of Group V atoms that constitute part of the crystal of the Group III-V compound semiconductor; and performing at least one heat treatment on the thus prepared sample to cause silicon (Si) in the SiOx film to diffuse into the Group III-V compound semiconductor.

2. A method of doping according to claim 1, wherein the Group III-V compound semiconductor comprises at least one material selected from the group consisting of GaAs system, InP system, AlAs system, AlGaAs system, InGaAs system, and InAlAs system.

3. A method of doping according to claim 1, wherein the film for preventing the external diffusion of Group V atoms is at least one selected from the group consisting of an SiN film, an AlN film, a WSi film, and a WSiN film.

4. A method of doping according to claim 1, wherein x in the SiOx film is less than 2.

5. A method of doping according to claim 1, further comprising the step of:

after depositing the two films, leaving the two films in a designated region unremoved or leaving the film for preventing the external diffusion of Group V atoms in a designated region and the SiOx film unremoved.

6. A method of doping according to claim 1, wherein when depositing the two films, the thickness and/or properties of at least either one of the films are varied to modify the diffusion profile of Si after heat treatment.

7. A method of fabricating a field-effect transistor having a lightly doped layer formed directly below a gate electrode, a highly doped layer forming a source and a drain region, and a moderately doped layer formed between the lightly doped and highly doped layers, the three layers being formed at the surface of a substrate of a Group III-V compound, comprising the steps of:

forming the lightly doped layer at the surface of the substrate;

forming the gate electrode on the center portion of the upper surface of the lightly doped layer;

forming an undoped SiOx film and a Group V atom diffusion stop film over the upper surface of the lightly doped layer;

forming the highly doped layer at each end of the lightly doped layer;

forming by heat treatment the moderately doped layer in the lightly doped layer except the portion thereof directly below the gate electrode; and forming an ohmic electrode on the upper surface of the highly doped layer.

8. A method of fabricating a field-effect transistor on a Group III-V compound semiconductor substrate, comprising the steps of:

selectively etching the compound semiconductor substrate in a substantially vertical direction;

forming a composite film consisting of an undoped SiOx film and a Group V atom diffusion stop film over the horizontal and vertical surfaces of the selectively etched compound semiconductor substrate;

forming an active layer by heat-treating the compound semiconductor substrate with the composite film formed thereon and by diffusing Si into the compound semiconductor substrate;

forming a source electrode and a drain electrode on the active layer formed on the horizontal surface of the compound semiconductor substrate; and forming a gate electrode on the active layer formed on the vertical surface of the compound semiconductor substrate.

9. A method of fabricating a field-effect transistor having an active layer and an impurity-diffused layer formed in a Group III-V compound semiconductor substrate, with a gate electrode formed on the active layer and a source electrode and a drain electrode formed on the impurity-diffused layer, comprising the steps of:

forming a stepped portion by etching the Group III-V compound semiconductor substrate;

forming the active layer in the upper part of the stepped portion;

forming a composite film consisting of an undoped SiOx film and a Group V atom diffusion stop film on the side and lower parts of the stepped portion of the compound semiconductor substrate; and forming the impurity-diffused layer by heat-treating the compound semiconductor substrate with the composite film formed thereon and by diffusing Si into the compound semiconductor substrate.

10. A method of forming a field-effect transistor having a plurality of doped layers of different impurity concentrations formed in a Group III-V compound semiconductor substrate, comprising the steps of:

forming an undoped SiOx film and a Group V atom diffusion stop film in this order on the Group III-V compound semiconductor substrate;

forming a doped layer by diffusing Si into the Group III-V compound semiconductor substrate by heat treatment;

removing the SiOx film and the he Group V atom diffusion stop film in a designated region; and performing heat treatment again and forming, in a region covered by the SiOx film and the Group V atom diffusion stop film, a doped layer having a higher impurity concentration than the first formed doped layer.

11. A method of fabricating a semiconductor circuit device having conductive layers of different resistivities by doping a Group III-V compound semiconductor with an impurity, comprising the steps of:

forming an undoped SiOx film and a Group V atom diffusion stop film in this order on the Group III-V compound semiconductor;

reducing the thickness of the Group V atom diffusion stop film over a region where a conductive layer of higher resistivity is to be formed; and diffusing Si into the Group III-V compound semiconductor by heat-treating the Group III-V compound semiconductor.

12. A method of fabricating a semiconductor circuit device having conductive layers of different resistivities by doping a Group III-V compound semiconductor with an impurity, comprising the steps of:

constructing a heterojunction layer by forming a wide-gap semiconductor layer on an undoped narrow-gap semiconductor layer which is the Group III-V compound semiconductor;

forming an undoped SiOx film and a Group V atom diffusion stop film in this order on the heterojunction layer;

reducing the thickness of the Group V atom diffusion stop film over a region where a conductive layer of higher resistivity is to be formed; and diffusing Si into the Group III-V compound semiconductor by heat-treating the Group III-V compound semiconductor.

13. A method of fabricating a field-effect transistor having a doped layer formed in a Group III-V compound semiconductor layer as a channel layer or an electron supply layer, comprising the steps of:

forming an undoped SiOx film and a Group V atom diffusion stop film in this order on the Group III-V compound semiconductor layer;

forming the doped layer by diffusing Si into the Group III-V compound semiconductor layer by heat treatment; and subjecting the doped layer to heat treatment and causing Si in the doped layer to further diffuse into the Group III-V compound semiconductor layer to increase the thickness of the doped layer.

14. A method of forming a one-dimensional or two-dimensional electric conductive region by diffusing an impurity into a Group III-V compound semiconductor, comprising the steps of:

forming an undoped SiOx film and a Group V atom diffusion stop film in this order on the Group III-V compound semiconductor;

removing the Group V diffusion stop film everywhere except where the electric conductive region is to be formed; and diffusing Si into the Group III-V compound semiconductor by heat treatment.

15. A method of forming a quantum wire, comprising the steps of:

forming an Si diffusion stop layer on a Group III-V compound semiconductor substrate and thereby forming a step;

forming an undoped SiOx film and a Group V atom diffusion stop film in this order on the substrate and the Si diffusion stop layer;

removing the SiOx film and the Group V atom diffusion stop film everywhere except the portions thereof formed on the sidewall of the step; and heating the thus processed substrate and thereby causing Si to diffuse from the SiOx film into the Group III-V compound semiconductor substrate across their interface, to form a quantum wire.

16. A method of forming a quantum wire, comprising the steps of:

forming all undoped SiOx film and a Group V atom diffusion stop film in this order on the surface of a substrate consisting of a plurality of dissimilar Group III-V compound semiconductors that are joined side by side to form the surface of the substrate;

forming diffused areas of different depths in the Group III-V compound semiconductors by diffusing Si from the SiOx film by heat treatment; and removing the surface portion of the substrate so that the deeper diffused area remains in the substrate, and forming a quantum wire by a one-dimensional electron gas that occurs near the remaining diffused area.

17. A method of forming a quantum wire in which the moving direction of carriers in a channel layer is one dimensional, comprising the steps of:
   forming successively a narrow-gap semiconductor layer and a wide-gap semiconductor layer, both of Group III-V compound semiconductors, in this order on a substrate;
   forming the wide-gap semiconductor layer into a sawtooth-like cross section using an etching technique that utilizes the dependence of etching on the surface orientation of the wide-gap semiconductor layer;
   forming an undoped SiOx film and a Group V atom diffusion stop film in this order on the wide-gap semiconductor layer formed in a sawtooth shape;
   forming a doped layer by performing heat treatment and diffusing Si into the surface of the wide-gap semiconductor layer; and
   forming a channel layer, and hence a quantum wire, only in the region of the narrow-gap semiconductor layer that lies directly below each trough of the sawtooth-shaped doped layer.

18. A method of forming a quantum box that confines carriers in a channel layer into a three-dimensional space, comprising the steps of:
   forming successively a narrow-gap semiconductor layer and a wide-gap semiconductor layer, both of Group III-V compound semiconductors, in this order on a substrate;
   forming the wide-gap semiconductor layer into a sawtooth shape using an etching technique that utilizes the dependence of etching on the surface orientation of the wide-gap semiconductor layer;
   forming an undoped SiOx film on the wide-gap semiconductor layer formed in a sawtooth shape;
   forming a Group V atom diffusion stop layer over a region where a quantum box is to be formed;
   forming a doped layer by performing heat treatment and diffusing Si into a designated region of the surface of the wide-gap semiconductor layer; and
   forming a channel layer, and hence a quantum box, only in the region of the narrow-gap semiconductor layer that lies directly below each trough of the sawtooth structure and that is covered by the doped layer.

19. A method of fabricating a semiconductor circuit device having on a substrate a diffused layer containing areas of different impurity concentrations, with electrodes formed on the diffused layers, comprising the steps of:
   forming a Group III-V compound semiconductor layer on a substrate;
   forming on the semiconductor layer a plurality of shields, of different shielding widths, spaced apart by a prescribed distance;
   forming an undoped SiOx film and a Group V atom diffusion stop film in this order over the surfaces of the shields and the semiconductor surface except for the shields; and
   forming diffused layers by diffusing Si into the semiconductor layer by heat treatment.

20. A method of fabricating a semiconductor integrated circuit by doping a Group III-V compound semiconductor with an impurity and forming a plurality of devices, comprising the steps of:
   forming an undoped narrow-gap semiconductor layer and a wide-gap semiconductor layer, both of Group III-V compound semiconductors, in this order on a substrate, thus constructing a heterojunction layer;
   exposing the narrow-gap semiconductor layer by removing the wide-gap semiconductor layer in a designated region;
   forming an undoped SiOx film and a Group V atom diffusion stop film in this order over the narrow-gap semiconductor layer and the wide-gap semiconductor layer;
   forming doped layers by diffusing Si into the Group III-V semiconductor by heat treatment; and
   forming electrodes on the doped layers.

21. A method of fabricating a semiconductor integrated circuit by doping a Group III-V compound semiconductor with an impurity and forming a plurality of devices, comprising the steps of:
   forming an undoped narrow-gap semiconductor layer and a wide-gap semiconductor layer, both of Group III-V compound semiconductors, in this order on a substrate, thus constructing a heterojunction layer;
   partially removing the wide-gap semiconductor layer in the direction of its depth in a designated region;
   forming an SiOx film and a Group V atom diffusion stop film over the wide-gap semiconductor layer having a varying thickness;
   forming doped layers by diffusing Si into the Group III-V semiconductor by heat treatment; and
   forming electrodes on the doped layers.

* * * * *